US012620982B2

(12) United States Patent
Park et al.

(10) Patent No.: US 12,620,982 B2
(45) Date of Patent: May 5, 2026

(54) DATA TRANSMISSION CIRCUIT SYSTEM AND DATA RECEPTION CIRCUIT SYSTEM USING RISING EDGE AND FALLING EDGE OF PULSE SIGNAL

(71) Applicant: Konkuk University Industrial Cooperation Corp, Seoul (KR)

(72) Inventors: Ji Yong Park, Seoul (KR); Ju Sung Park, Seoul (KR); Jintae Kim, Seoul (KR)

(73) Assignee: Konkuk University Industrial Cooperation Corp, Seoul (KR)

( * ) Notice: Subject to any disclaimer, the term of this patent is extended or adjusted under 35 U.S.C. 154(b) by 0 days.

(21) Appl. No.: 18/830,754

(22) Filed: Sep. 11, 2024

(65) Prior Publication Data

US 2025/0233583 A1 Jul. 17, 2025

(30) Foreign Application Priority Data

Jan. 12, 2024 (KR) ........................ 10-2024-0005678
Jan. 17, 2024 (KR) ........................ 10-2024-0007533
Mar. 6, 2024 (KR) ........................ 10-2024-0032055
May 30, 2024 (KR) ........................ 10-2024-0071001

(51) Int. Cl.
*H03K 3/02* (2006.01)
*H03K 5/135* (2006.01)

(52) U.S. Cl.
CPC .............. *H03K 5/135* (2013.01); *H03K 3/02* (2013.01)

(58) Field of Classification Search
CPC ................................ H03K 5/135; H03K 3/02
See application file for complete search history.

(56) References Cited

U.S. PATENT DOCUMENTS

| | | | |
|---|---|---|---|
| 10,895,850 B1 | 1/2021 | Elkholy | |
| 2013/0197920 A1* | 8/2013 | Lesso | H04L 25/4902 704/500 |
| 2020/0212943 A1 | 7/2020 | Banin et al. | |

(Continued)

FOREIGN PATENT DOCUMENTS

| | | |
|---|---|---|
| CN | 114362770 B | 7/2023 |
| KR | 10-2621215 B1 | 1/2024 |

OTHER PUBLICATIONS

Rashdan et al., "Differential-Time and Pulse-Amplitude-Modulation Signaling for Serial Link Transceivers", 2014 IEEE 44th International Symposium on Multiple-Valued Logic, 2014, pp. 248-253, DOI 10.1109/ISMVL.2014.51.

(Continued)

*Primary Examiner* — Rahel Guarino
(74) *Attorney, Agent, or Firm* — NSIP Law

(57) ABSTRACT

Provided are a data transmission circuit system and a data reception circuit system, which use an edge of a pulse signal. The data transmission circuit system modulates a digital signal by using time levels determined based on time differences between rising edges and falling edges of a clock pulse signal, and rising edges and falling edges of a data pulse signal. The data reception circuit system demodulates a digital signal by using time levels determined based on time differences between rising edges and falling edges of a recovered clock pulse signal, and rising edges and falling edges of a data pulse signal.

19 Claims, 51 Drawing Sheets

(56) References Cited

U.S. PATENT DOCUMENTS

2024/0021522 A1    1/2024   Acikalin et al.

OTHER PUBLICATIONS

Extended European Search Report issued Jan. 30, 2025 in Application No. 24193182.3.
Rashdan, Mostafa, et al., "Differential-Time and Pulse-Amplitude Modulation Signaling for Serial Link Transceivers", 2014 IEEE 44th International Symposium on Multiple-Valued Logic, 2014, (6 Pages in English).
Korean Office Action Issued on Dec. 15, 2025, in Counterpart Korean Patent Application No. 10-2024-0070999 (11 Pages in English, 8 Pages in Korean).
Korean Office Action Issued on Dec. 15, 2025, in Counterpart Korean Patent Application No. 10-2024-0071001 (9 Pages in English, 7 Pages in Korean).

* cited by examiner

——— CLK4
——— DPS

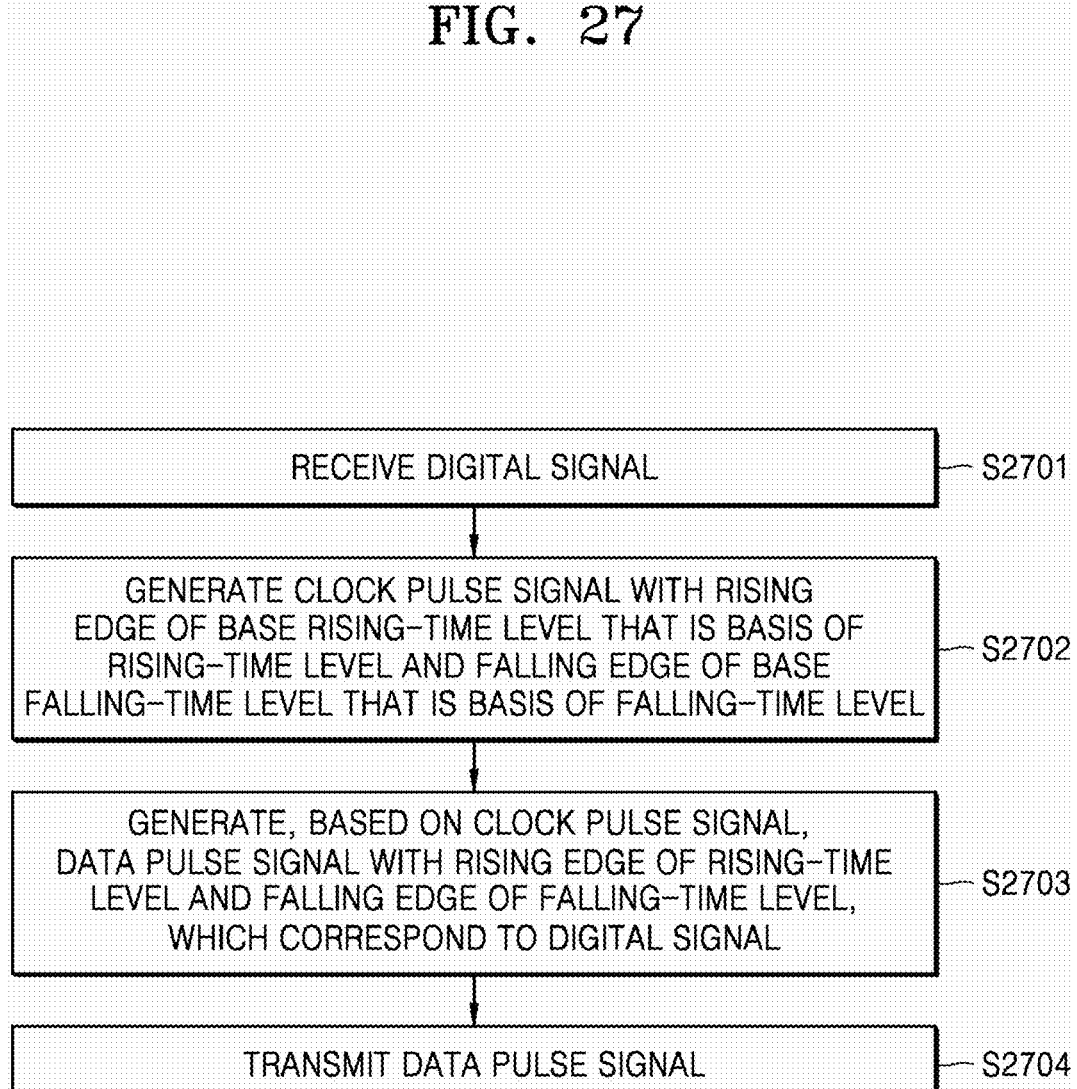

RECEIVE DIGITAL SIGNAL — S2701

GENERATE CLOCK PULSE SIGNAL WITH RISING
EDGE OF BASE RISING-TIME LEVEL THAT IS BASIS OF
RISING-TIME LEVEL AND FALLING EDGE OF BASE
FALLING-TIME LEVEL THAT IS BASIS OF FALLING-TIME LEVEL — S2702

GENERATE, BASED ON CLOCK PULSE SIGNAL,
DATA PULSE SIGNAL WITH RISING EDGE OF RISING-TIME
LEVEL AND FALLING EDGE OF FALLING-TIME LEVEL,
WHICH CORRESPOND TO DIGITAL SIGNAL — S2703

TRANSMIT DATA PULSE SIGNAL — S2704

DATA TRANSMISSION CIRCUIT SYSTEM AND DATA RECEPTION CIRCUIT SYSTEM USING RISING EDGE AND FALLING EDGE OF PULSE SIGNAL

CROSS-REFERENCE TO RELATED APPLICATIONS

This application is based on and claims priority under 35 U.S.C. § 119 to Korean Patent Application Nos. 10-2024-0005678, filed on Jan. 12, 2024, 10-2024-0007533, filed on Jan. 17, 2024, 10-2024-0032055, filed on Mar. 6, 2024, and 10-2024-0071001, filed on May 30, 2024, in the Korean Intellectual Property Office, the disclosures of which are incorporated by reference herein in their entirety.

BACKGROUND

1. Field

The disclosure relates to a data transmission circuit system and a data reception circuit system. More particularly, the disclosure relates to a circuit system for transmitting and receiving data by using a time level.

2. Description of the Related Art

Examples of digital data modulation methods in data transmission include non-return-to-zero (NRZ) and pulse amplitude modulation (PAM). NRZ and PAM are methods of encoding digital data at different amplitude levels (i.e., voltage levels) of pulses. NRZ encodes digital data by using amplitude levels represented by "0" and "1". PAM is classified into pulse amplitude modulation 2-levels (PAM2), pulse amplitude modulation 4-levels (PAM4), etc., depending on the number of amplitude levels. NRZ and PAM require an analog-to-digital converter (ADC) and a digital-to-analog converter (DAC) with high power consumption in order to modulate and demodulate amplitude of pulses.

SUMMARY

Provided are a data transmission circuit system and a data reception circuit system using a rising edge and a falling edge of a pulse signal.

Additional aspects will be set forth in part in the description which follows and, in part, will be apparent from the description, or may be learned by practice of the presented embodiments of the disclosure.

A data transmission circuit system according to an embodiment includes a data pulse generation circuit configured to receive a digital signal and generate, based on a clock pulse signal, a data pulse signal with a rising edge of a rising-time level and a falling edge of a falling-time level, which correspond to the digital signal, a clock pulse generation circuit configured to generate the clock pulse signal with a rising edge of a base rising-time level that is a basis of the rising-time level and a falling edge of a base falling-time level that is a basis of the falling-time level, and a transmission interface circuit configured to transmit the data pulse signal, wherein a time difference between a rising edge of the clock pulse signal and a rising edge of the data pulse signal indicates the rising-time level, and a time difference between a falling edge of the clock pulse signal and a falling edge of the data pulse signal indicates the falling-time level.

According to an embodiment, the data pulse generation circuit may be further configured to generate the data pulse signal by delaying the clock pulse signal according to the rising-time level and the falling-time level, which correspond to the digital signal.

According to an embodiment, the clock pulse generation circuit may be further configured to generate a plurality of clock pulse signals with different phases, and the data pulse generation circuit may be further configured to generate sub-data pulse signals by respectively delaying the plurality of clock pulse signals according to the rising-time level and the falling-time level, which correspond to the digital signal, and generate the data pulse signal by combining the sub-data pulse signals with each other.

According to an embodiment, the data pulse generation circuit may include a serialization circuit configured to generate a digital stream signal by serializing the digital signal, and a digital-time conversion circuit configured to generate the data pulse signal by delaying the clock pulse signal according to the rising-time level and the falling-time level, which correspond to the digital stream signal.

According to an embodiment, the data pulse generation circuit may include an equalization circuit configured to adjust a delay of a pulse of the clock pulse signal of a current symbol, based on a value of the digital stream signal of a previous symbol and a value of the digital stream signal of the current symbol.

According to an embodiment, the clock pulse generation circuit may be further configured to generate a first clock pulse signal with a first phase and a second clock pulse signal with a second phase, and the data pulse generation circuit may include a serialization circuit configured to generate a first digital stream signal and a second digital stream signal by serializing and distributing the digital signal, a first digital-time conversion circuit configured to generate a first sub-data pulse signal by delaying the first clock pulse signal according to a rising-time level corresponding to the first digital stream signal, a second digital-time conversion circuit configured to generate a second sub-data pulse signal by delaying the second clock pulse signal according to a falling-time level corresponding to the second digital stream signal, and a data pulse combining circuit configured to generate the data pulse signal by combining the first sub-data pulse signal with the second sub-data pulse signal such that the data pulse signal includes a rising edge of the first sub-data pulse signal and a falling edge of the second sub-data pulse signal.

According to an embodiment, the clock pulse generation circuit may be further configured to generate a first clock pulse signal with a first phase, a second clock pulse signal with a second phase, a third clock pulse signal with a third phase, and a fourth clock pulse signal with a fourth phase, and the data pulse generation circuit may include a serialization circuit configured to generate a first digital stream signal, a second digital stream signal, a third digital stream signal, and a fourth digital stream signal by serializing and distributing the digital signal, a first digital-time conversion circuit configured to generate a first sub-data pulse signal by delaying the first clock pulse signal according to a rising-time level corresponding to the first digital stream signal, a second digital-time conversion circuit configured to generate a second sub-data pulse signal by delaying the second clock pulse signal according to a falling-time level corresponding to the second digital stream signal, a third digital-time conversion circuit configured to generate a third sub-data pulse signal by delaying the third clock pulse signal according to a rising-time level corresponding to the third digital stream signal, a fourth digital-time conversion circuit configured to generate a fourth sub-data pulse signal by delaying the fourth clock pulse signal according to a falling-time level corresponding to the fourth digital stream signal, and a data pulse combining circuit configured to generate the data pulse signal by combining the first sub-data pulse signal, the second sub-data pulse signal, the third sub-data pulse signal, and the fourth sub-data pulse signal with each other such that the data pulse signal includes a rising edge of the first sub-data pulse signal, a falling edge of the second sub-data pulse signal, a rising edge of the third sub-data pulse signal, and a falling edge of the fourth sub-data pulse signal.

According to an embodiment, with respect to a plurality of rising-time levels and a plurality of falling-time levels, which are indicated by pulses of the data pulse signal, an interval between the plurality of rising-time levels may be less than 1 ns and an interval between the plurality of falling-time levels may be less than 1 ns.

According to an embodiment, a unit of a transmission speed of the data pulse signal may be Gbps or greater.

According to an aspect of the disclosure, provided is a data transmission method.

A data transmission method according to an embodiment includes receiving a digital signal, generating a clock pulse signal with a rising edge of a base rising-time level that is a basis of a rising-time level and a falling edge of a base falling-time level that is a basis of a falling-time level, generating, based on the clock pulse signal, a data pulse signal with a rising edge of the rising-time level and a falling edge of the falling-time level, which correspond to the digital signal, and transmitting the data pulse signal, wherein a time difference between a rising edge of the clock pulse signal and a rising edge of the data pulse signal indicates the rising-time level, and a time difference between a falling edge of the clock pulse signal and a falling edge of the data pulse signal indicates the falling-time level.

According to another aspect of the disclosure, provided is a data reception circuit system.

A data reception circuit system according to an embodiment includes a reception interface circuit configured to receive a data pulse signal, a digital signal generation circuit configured to generate a digital signal corresponding to a rising-time level of a rising edge of the data pulse signal and a falling-time level of a falling edge of the data pulse signal, based on a recovered clock pulse signal, and a clock recovery circuit configured to generate the recovered clock pulse signal with a rising edge of a base rising-time level that is a basis of the rising-time level and a falling edge of a base falling-time level that is a basis of the falling-time level, wherein a time difference between a rising edge of the recovered clock pulse signal and a rising edge of the data pulse signal determines the rising-time level, and a time difference between a falling edge of the recovered clock pulse signal and a falling edge of the data pulse signal determines the falling-time level.

According to an embodiment, the digital signal generation circuit may include a time-digital conversion circuit configured to generate a digital stream signal corresponding to the rising-time level and the falling-time level of the data pulse signal, and a parallelization circuit configured to generate the digital signal by parallelizing the digital stream signal.

According to an embodiment, the time-digital conversion circuit may include an equalization circuit configured to adjust a delay of a pulse of the recovered clock pulse signal of a current symbol or a delay of a pulse of the data pulse signal of the current symbol, based on a value of the digital stream signal of a previous symbol.

According to an embodiment, the clock recovery circuit may include a clock pulse separation circuit configured to separate the recovered clock pulse signal into a first sub-clock pulse signal and a second sub-clock pulse signal such that the first sub-clock pulse signal and the second sub-clock pulse signal alternately include pulses of the recovered clock pulse signal, and the digital signal generation circuit may include a data pulse separation circuit configured to separate the data pulse signal into a first sub-data pulse signal and a second sub-data pulse signal such that the first sub-data pulse signal and the second sub-data pulse signal alternately include pulses of the data pulse signal, a first time-digital conversion circuit configured to generate a first digital stream signal corresponding to a rising-time level determined by a time difference between a rising edge of the first sub-clock pulse signal and a rising edge of the first sub-data pulse signal, and a falling-time level determined by a time difference between a falling edge of the first sub-clock pulse signal and a falling edge of the first sub-data pulse signal, a second time-digital conversion circuit configured to generate a second digital stream signal corresponding to a rising-time level determined by a time difference between a rising edge of the second sub-clock pulse signal and a rising edge of the second sub-data pulse signal, and a falling-time level determined by a time difference between a falling edge of the second sub-clock pulse signal and a falling edge of the second sub-data pulse signal, and a parallelization circuit configured to generate the digital signal by merging and parallelizing the first digital stream signal and the second digital stream signal.

According to an embodiment, the clock recovery circuit may include a clock pulse separation circuit configured to separate the recovered clock pulse signal into a first sub-clock pulse signal and a second sub-clock pulse signal such that the first sub-clock pulse signal and the second sub-clock pulse signal alternately include pulses of the recovered clock pulse signal, and the digital signal generation circuit may include a data pulse separation circuit configured to separate the data pulse signal into a first sub-data pulse signal and a second sub-data pulse signal such that the first sub-data pulse signal and the second sub-data pulse signal alternately include pulses of the data pulse signal, a first time-digital conversion circuit configured to generate a first digital stream signal corresponding to a rising-time level determined by a time difference between a rising edge of the first sub-clock pulse signal and a rising edge of the first sub-data pulse signal, a second time-digital conversion circuit configured to generate a second digital stream signal corresponding to a falling-time level determined by a time difference between a falling edge of the first sub-clock pulse signal and a falling edge of the first sub-data pulse signal, a third time-digital conversion circuit configured to generate a third digital stream signal corresponding to a rising-time level determined by a time difference between a rising edge of the second sub-clock pulse signal and a rising edge of the second sub-data pulse signal, a fourth time-digital conversion circuit configured to generate a fourth digital stream signal corresponding to a falling-time level determined by a time difference between a falling edge of the second sub-clock pulse signal and a falling edge of the second sub-data pulse signal, and a parallelization circuit configured to generate the digital signal by merging and parallelizing the first digital stream signal, the second digital stream signal, the third digital stream signal, and the fourth digital stream signal.

According to an embodiment, the clock recovery circuit may be further configured to generate the recovered clock pulse signal by receiving a forward clock signal and delaying the forward clock signal such that a rising edge of the forward clock signal is located at the base rising-time level.

According to an embodiment, the clock recovery circuit may include a delay locked loop circuit configured to receive a forward clock signal and output the recovered clock pulse signal by delaying the forward clock signal, wherein the delay locked loop circuit may include a feedback loop, and the delay locked loop circuit may be configured to delay the forward clock signal, based on a phase difference between a feedback signal of the feedback loop and the data pulse signal.

According to an embodiment, the base rising-time level may be located between two middle rising-time levels of a plurality of rising-time levels determined by pulses of the recovered clock pulse signal and pulses of the data pulse signal.

According to an embodiment, the clock recovery circuit may include a clock pulse separation circuit configured to separate the recovered clock pulse signal into a first sub-clock pulse signal and a second sub-clock pulse signal such that the first sub-clock pulse signal and the second sub-clock pulse signal alternately include pulses of the recovered clock pulse signal, and generate a third sub-clock pulse signal and a fourth sub-clock pulse signal by inverting the first sub-clock pulse signal and the second sub-clock pulse signal, respectively, and the digital signal generation circuit may include a data pulse separation circuit configured to separate the data pulse signal into a first sub-data pulse signal and a second sub-data pulse signal such that the first sub-data pulse signal and the second sub-data pulse signal alternately include pulses of the data pulse signal, and generate a third sub-data pulse signal and a fourth sub-data pulse signal by inverting the first sub-data pulse signal and the second sub-data pulse signal, respectively, a first time-digital conversion circuit configured to generate a first digital stream signal corresponding to a rising-time level determined by a time difference between a rising edge of the first sub-clock pulse signal and a rising edge of the first sub-data pulse signal, a second time-digital conversion circuit configured to generate a second digital stream signal corresponding to a rising-time level determined by a time difference between a rising edge of the second sub-clock pulse signal and a rising edge of the second sub-data pulse signal, a third time-digital conversion circuit configured to generate a third digital stream signal corresponding to a rising-time level determined by a time difference between a rising edge of the third sub-clock pulse signal and a rising edge of the third sub-data pulse signal, a fourth time-digital conversion circuit configured to generate a fourth digital stream signal corresponding to a rising-time level determined by a time difference between a rising edge of the fourth sub-clock pulse signal and a rising edge of the fourth sub-data pulse signal, and a parallelization circuit configured to generate the digital signal by merging and parallelizing the first digital stream signal, the second digital stream signal, the third digital stream signal, and the fourth digital stream signal.

According to another aspect of the disclosure, provided is a data reception method.

A data reception method according to an embodiment includes receiving a data pulse signal, generating a recovered clock pulse signal with a rising edge of a base rising-time level that is a basis of a rising-time level and a falling edge of a base falling-time level that is a basis of a falling-time level, and generating, based on the recovered clock pulse signal, a digital signal corresponding to the rising-time level and the falling-time level of the data pulse signal, wherein a time difference between a rising edge of the recovered clock pulse signal and a rising edge of the data pulse signal determines the rising-time level, and a time difference between a falling edge of the recovered clock pulse signal and a falling edge of the data pulse signal determines the falling-time level.

BRIEF DESCRIPTION OF THE DRAWINGS

The above and other aspects, features, and advantages of certain embodiments of the disclosure will be more apparent from the following description taken in conjunction with the accompanying drawings, in which:

FIGS. 8A to 8D are diagrams for describing a digital stream signal supplied by a serialization circuit to a digital-time conversion circuit, according to embodiments;

FIG. 21B is a block diagram of a voltage controlled delay line (VCDL) according to an embodiment;

FIG. 27 is a flowchart of a data transmission method according to an embodiment.

DETAILED DESCRIPTION

Figure 1A:
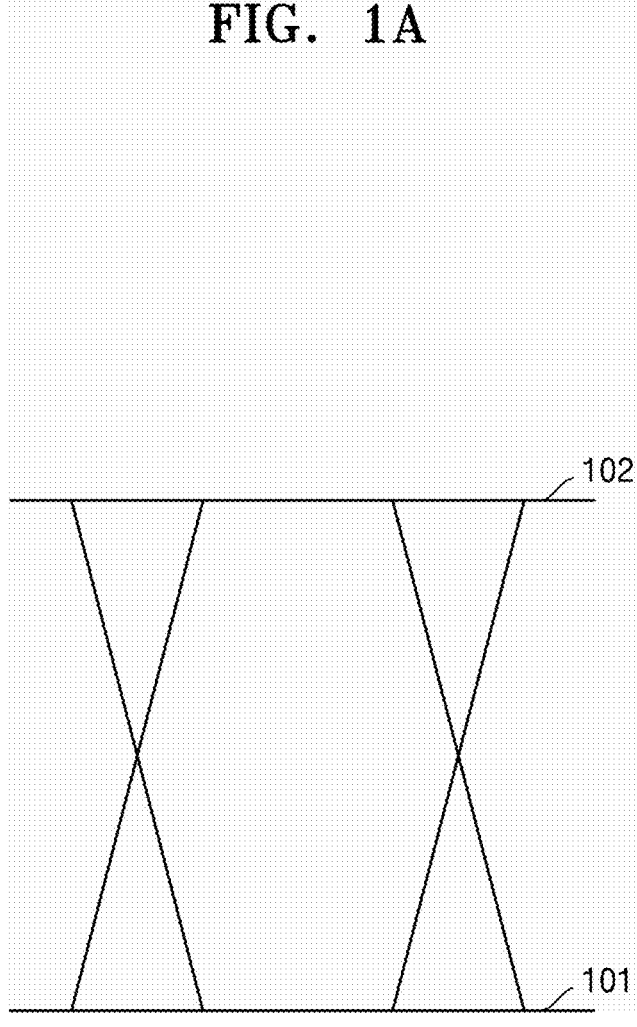
FIG. 1A is a schematic eye diagram of a non-return-to-zero (NRZ) signal.

The terms used in the specification will be briefly defined, and the disclosure will be described in detail. Throughout the disclosure, the expression "at least one of a, b, or c" indicates only a, only b, only c, both a and b, both a and c, both b and c, all of a, b, and c, or variations thereof. As used herein, the term "and/or" includes any and all combinations of one or more of the associated listed items.

All terms including descriptive or technical terms which are used herein should be construed as having meanings that are obvious to one of ordinary skill in the art. However, the terms may have different meanings according to the intention of one of ordinary skill in the art, precedent cases, or the appearance of new technologies. Also, some terms may be arbitrarily selected by the applicant, and in this case, the meaning of the selected terms will be described in detail in the detailed description. Thus, the terms used herein have to be defined based on the meaning of the terms together with the description throughout the specification.

An expression used in the singular may encompass the expression in the plural, unless it has a clearly different meaning in the context. Terms used herein, including technical or scientific terms, may have the same meaning as commonly understood by one of ordinary skill in the art described in the disclosure. Further, the terms including ordinal numbers such as "first", "second", and the like used in the present specification may be used to describe various components, but the components should not be limited by the terms. The above terms are used only to distinguish one component from another.

When a part "includes" or "comprises" an element, unless there is a particular description contrary thereto, the part may further include other elements, not excluding the other elements.

In the disclosure, a voltage level may denote a level of a voltage used to transmit or receive data. For example, non-return-to-zero (NRZ) may use two types of voltage levels, i.e., a low level and a high level, wherein the low level may indicate "0" and the high level may indicate "1". For example, pulse amplitude modulation 4-levels (PAM4) may use four voltage levels and the voltage levels may indicate "00", "01", "10", and "11".

In the disclosure, a "time level" may denote a level of time used to transmit or receive data. For example, $2^n$ time levels may be used to transmit or receive data of n bits. For example, two time levels may be used to transmit or receive data of 1 bit, four time levels may be used to transmit or receive data of 2 bits, and eight time levels may be used to transmit or receive data of 3 bits.

In the disclosure, a "rising-time level" may denote a time level of a rising edge of a data pulse signal. In embodiments, the "rising-time level" may be used in a same meaning as a "time level". Also, in the disclosure, a "falling-time level" may denote a time level of a falling edge of a data pulse signal. In embodiments, the "falling-time level" may be used in a same meaning as a "time level".

In the disclosure, a "base time level" may denote a level that is a basis of time levels.

In the disclosure, a "base rising-time level" is a level that is a basis of a rising-time level and may denote a time level of a rising edge of a clock pulse signal or a recovered clock pulse signal. Also, a "base falling-time level" is a level that is a basis of a falling-time level and may denote a time level of a falling edge of a clock pulse signal or a recovered clock pulse signal.

Hereinafter, embodiments will be described in detail with reference to the accompanying drawings such that one of ordinary skill in the art may easily implement the embodiments. However, the disclosure may be implemented in various different forms and is not limited to the embodiments described herein.

Hereinafter, the disclosure will be described in detail with reference to accompanying drawings.

Figure 1B:
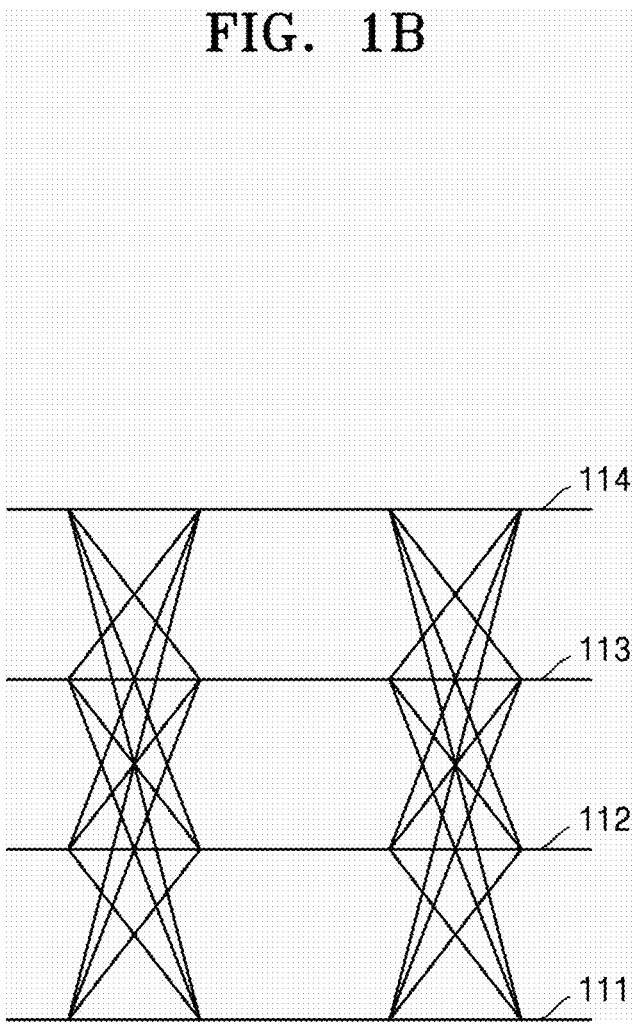
FIG. 1B is a schematic eye diagram of a pulse amplitude modulation 4-levels (PAM4) signal.

FIG. 1A is a schematic eye diagram of an NRZ signal, and FIG. 1B is a schematic eye diagram of a PAM4 signal.

Referring to FIG. 1A, the NRZ transmits data by using two types of voltage levels of a low level 101 and a high level 102. For example, a bit "0" is encoded at the low level 101 and a bit "1" is encoded at the high level 102.

Referring to FIG. 1B, PAM4 transmits data by using four types of voltage levels of first to fourth voltage levels 111 to 114. For example, a bit "00" is encoded at a first voltage level 111, a bit "01" is encoded at a second voltage level 112, a bit "10" is encoded at a third voltage level 113, and a bit "11" is encoded at a fourth voltage level.

In NRZ and PAM4, a digital-to-analog converter (DAC) is used to convert digital data into an NRZ signal or a PAM4 signal. Also, in NRZ and PAM4, an analog-to-digital converter (ADC) is used to convert an NRZ signal or a PAM4 signal into digital data. Accordingly, NRZ and PAM4 require resources for the ADC and the DAC.

Compared to NRZ, PAM4 has two times greater data rate in a same symbol rate and symbol period. However, in PAM4, data is encoded at four voltage levels, and thus, an encoding resolution decreases when an operating voltage decreases.

Figure 2:
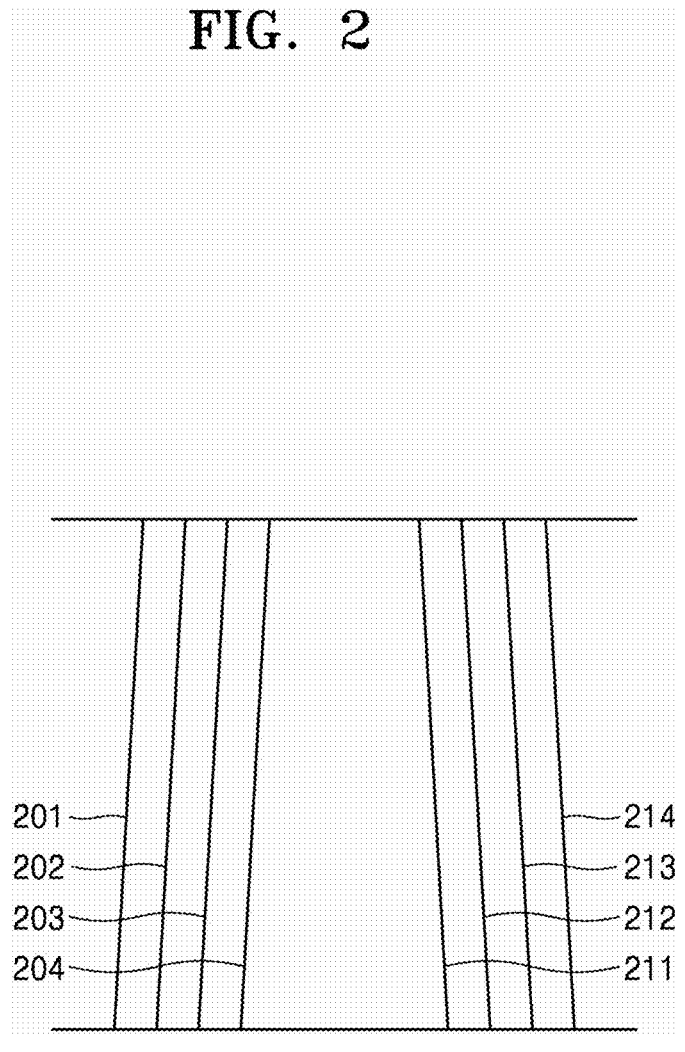
FIG. 2 is a schematic eye diagram of a data pulse signal according to an embodiment.

FIG. 2 is a schematic eye diagram of a data pulse signal according to an embodiment.

In the disclosure, time levels may be used to transmit and receive data. The time levels may be represented by rising edges and falling edges of a data pulse signal. In order to transmit data, a pulse with a rising edge and a falling edge located at time levels corresponding to the data may be generated. In order to receive data, the data may be decoded from time levels where a rising edge and a falling edge of a pulse is located.

A rising-time level may be defined by a time difference between a rising edge of a clock pulse signal and a rising edge of a data pulse signal. When a timepoint of the rising edge of the clock pulse signal is referred to as a base rising-time level, each rising-time level may have a pre-determined time difference with the base rising-time level. The same description may be applied to a falling edge of a falling-time level.

According to an embodiment, a time interval between the base rising-time level and the rising-time level may be less than a period of the clock pulse signal. Also, a time interval between the rising-time levels may be less than a period of the clock pulse signal. For example, for the clock pulse signal of 1 GHZ, an interval between the rising-time levels may be less than 1 ns. The same description may be applied to a falling-time level.

According to an embodiment, when the data pulse signal is generated as m clock pulse signals are time-interleaved, a time interval between the base rising-time level and the rising-time level may be less than (period)/m of the clock pulse signal. Also, the time interval between the rising-time levels may be less than (period)/m of the clock pulse signal. For example, when the data pulse signal is generated by interleaving four clock pulse signals of 4 GHZ, the interval between the rising-time levels may be less than 62.5 ps. The same description may be applied to the falling-time level.

Referring to FIG. 2, according to an embodiment, in order to transmit and receive 4-bit data, first to fourth rising-time levels 201 to 204, and first to fourth falling-time levels 211 to 214 may be used. Among the 4-bit data, 2-bit data may be encoded at the rising-time level of the rising edge and 2-bit data may be encoded at the falling-time level of the falling edge. According to an embodiment, a bit "00" may correspond to the first rising-time level 201 and the first falling-time level 211, a bit "01" may correspond to the second rising-time level 202 and the second falling-time level 212, a bit "10" may correspond to the third rising-time level 203 and the third falling-time level 213, and a bit "11" may correspond to the fourth rising-time level 204 and the fourth falling-time level 214.

Data is encoded at the time levels of the rising edge and the falling edge of the data pulse signal, and thus, a time difference between the rising edge and the falling edge of the data pulse signal, i.e., a pulse width, may not be directly related to the encoded data.

In the disclosure, an edge of a pulse is used to transmit or receive data, and thus, an analog-to-digital converter (ADC) or a digital-to-analog converter (DAC) for modulating or demodulating amplitude of the pulse are not required and data may be encoded and decoded with high resolution even in a low operating voltage.

Figure 3A:
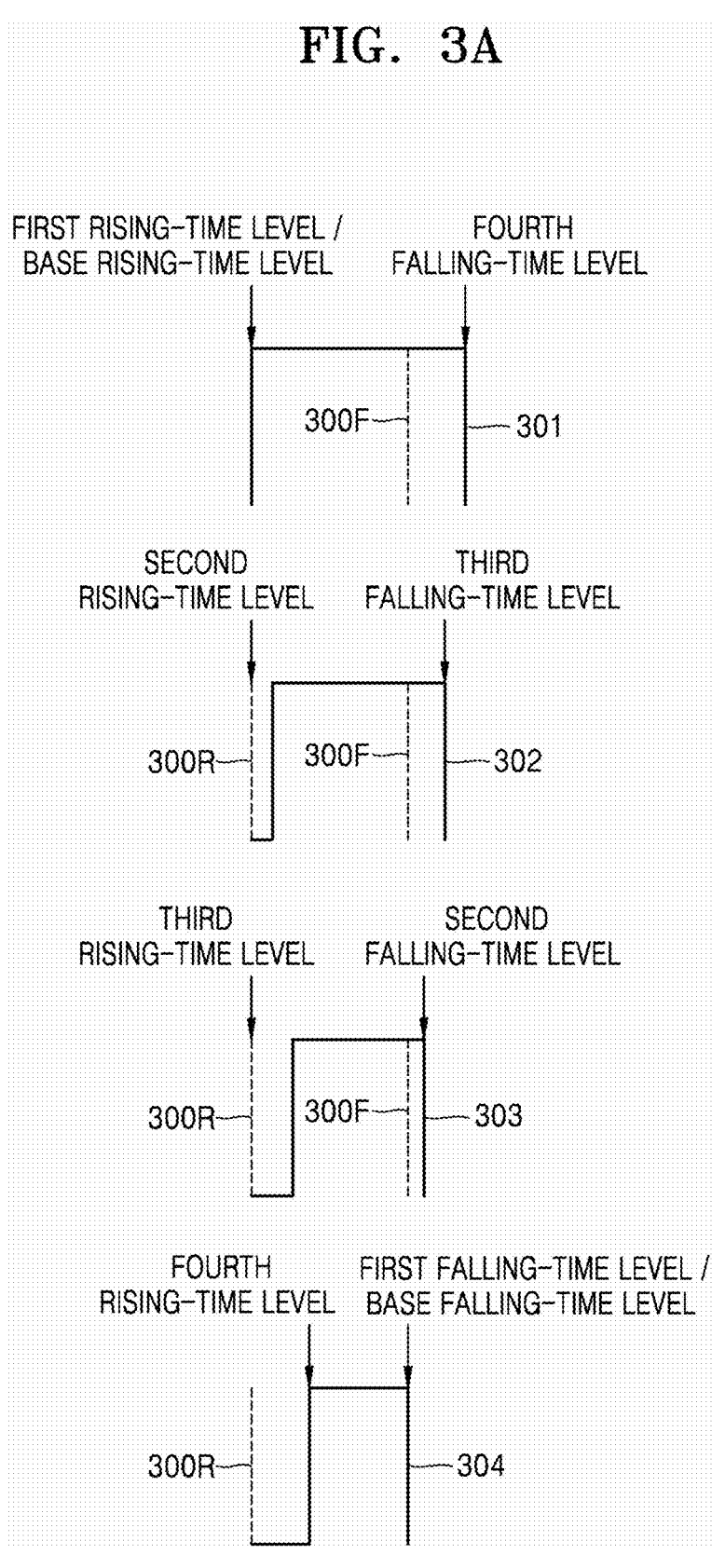
FIGS. 3A and 3B are schematic diagrams of a base time level and time levels according to embodiments.
Figure 3B:
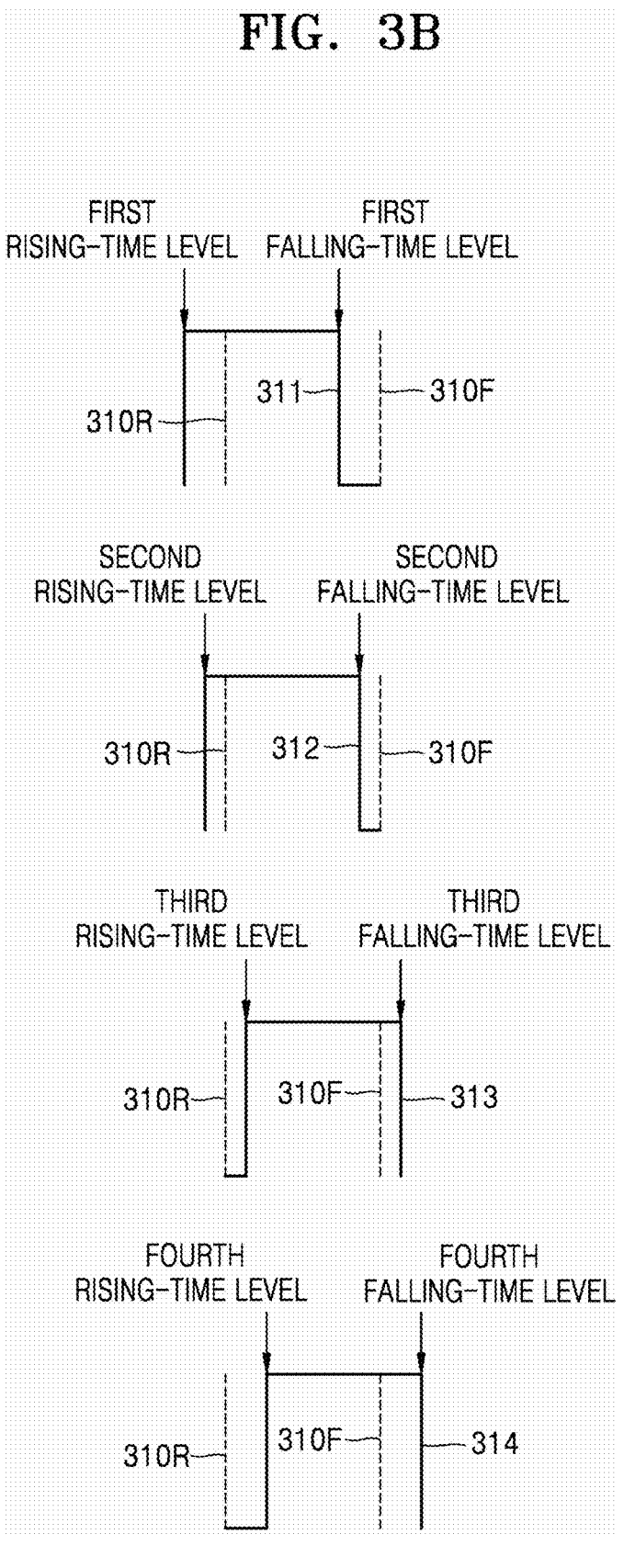

FIGS. 3A and 3B are schematic diagrams of a base time level and time levels according to embodiments.

According to an embodiment, a base time level may be the first time level from among time levels. For example, when data of n bits is encoded at first to $(2^n)$th time levels, the first time level may be a base time level.

Referring to FIG. 3A, according to an embodiment, a data pulse signal may include first to fourth data pulses 301 to 304 in which data is encoded to a rising edge and a falling edge respectively. According to an embodiment, the rising edges of the first to fourth data pulses 301 to 304 may respectively have first to fourth rising-time levels. In detail, the rising edge of the first data pulse 301 may be located at the first rising-time level, i.e., a base rising-time level 300R, the rising edge of the second data pulse 302 may be located at the second rising-time level, the rising edge of the third data pulse 303 may be located at the third rising-time level, and the rising edge of the fourth data pulse 304 may be located at the fourth rising-time level. According to an embodiment, the falling edges of the first to fourth data pulses 301 to 304 may respectively have fourth to first falling-time levels. In detail, the falling edge of the first data pulse 301 may be located at the fourth falling-time level, the falling edge of the second data pulse 302 may be located at the third falling-time level, the falling edge of the third data pulse 303 may be located at the second falling-time level, and the falling edge of the fourth data pulse 304 may be located at the first falling-time level, i.e., a base falling-time level 300F.

According to an embodiment, a base time level may be located between two middle time levels among time levels. For example, when data of n bits is encoded at first to $(2^n)$th time levels, the base time level may be located between the $(2^{n-1})$th time level and the $(2^{n-1}1)$th time level.

Referring to FIG. 3B, according to an embodiment, a data pulse signal may include first to fourth data pulses 311 to 314 in which data is encoded to a rising edge and a falling edge respectively. According to an embodiment, rising edges of the first to fourth data pulses 311 to 314 may be respectively located at first to fourth rising-time levels, and a base rising-time level 310R may be located between the second and third rising-time levels. According to an embodiment, falling edges of the first to fourth data pulses 311 to 314 may be respectively located at first to fourth falling-time levels, and a base falling-time level 310F may be located between the second and third falling-time levels.

Base time levels (i.e., the base rising-time level and the base falling-time level) are bases of time levels and may have various locations on a time axis, and are not limited by the embodiments described with reference to FIGS. 3A and 3B.

Figure 4:
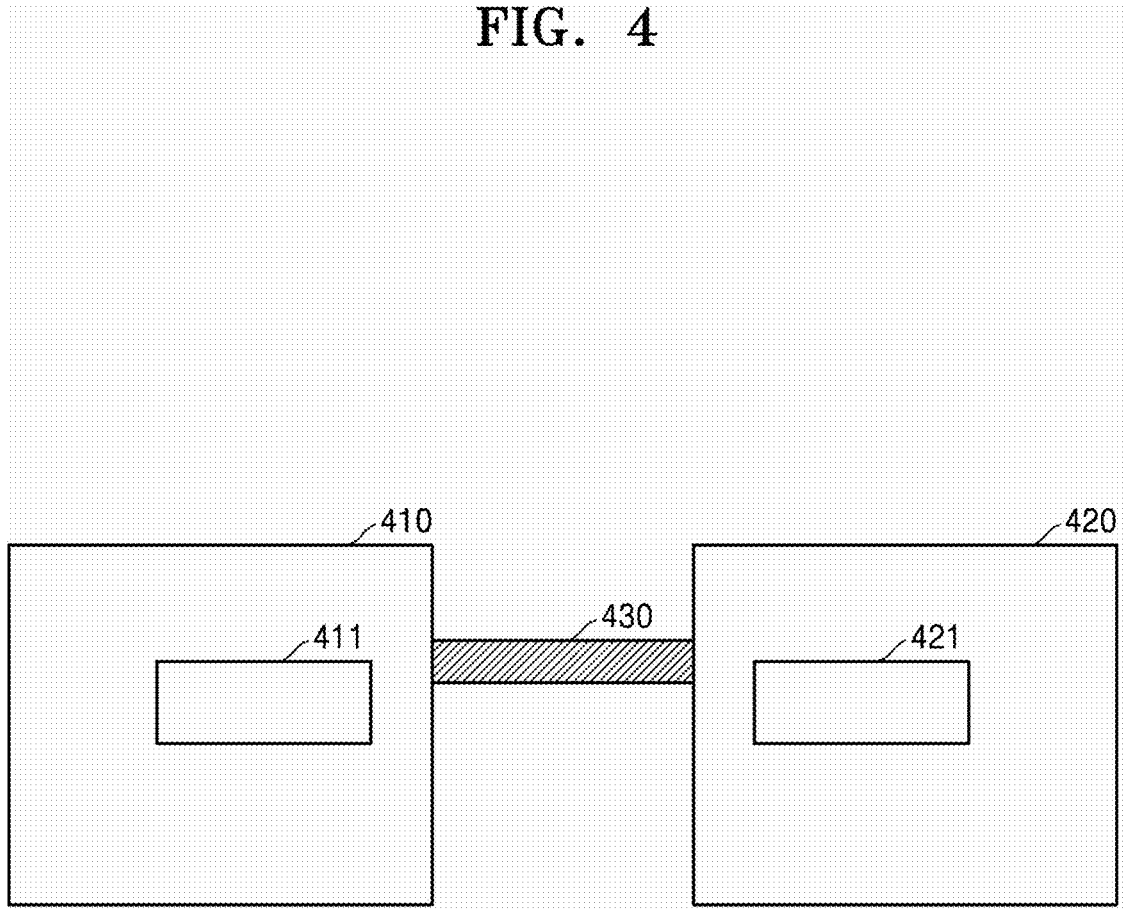
FIG. 4 is a block diagram of a first circuit system and a second circuit system, according to an embodiment.

FIG. 4 is a block diagram of a first circuit system 410 and a second circuit system 420, according to an embodiment.

According to an embodiment, the first circuit system 410 and the second circuit system 420 may transmit and receive data, based on a time level. The first circuit system 410 may include a data transmission circuit system 411 and the second circuit system 420 may include a data reception circuit system 421. The data transmission circuit system 411 may generate a data pulse signal by modulating a digital signal and transmit the data pulse signal. The data reception circuit system 421 may receive the data pulse signal that has passed through a channel 430 and generate the digital signal by demodulating the data pulse signal.

According to an embodiment, the first circuit system 410 and the second circuit system 420 may each include a semiconductor die, and the data transmission circuit system 411 and the data reception circuit system 421 may provide a die-to-die interface.

According to an embodiment, the first circuit system 410 and the second circuit system 420 may each include an integrated chip (IC), and the data transmission circuit system 411 and the data reception circuit system 421 may provide an IC interface.

According to an embodiment, the first circuit system 410 and the second circuit system 420 may each include a chiplet, and the data transmission circuit system 411 and the data reception circuit system 421 may provide a chiplet interface.

According to an embodiment, the first circuit system 410 and the second circuit system 420 may each include a semiconductor package, and the data transmission circuit system 411 and the data reception circuit system 421 may provide a semiconductor package interface.

According to an embodiment, the first circuit system 410 and the second circuit system 420 may each include a multi-chip module (MCM), and the data transmission circuit system 411 and the data reception circuit system 421 may provide an MCM interface.

According to an embodiment, the first circuit system 410 and the second circuit system 420 may each include a system-in-package (SiP), and the data transmission circuit system 411 and the data reception circuit system 421 may provide a SIP interface.

According to an embodiment, the first circuit system 410 and the second circuit system 420 may each include a system-on-chip (SoC), and the data transmission circuit system 411 and the data reception circuit system 421 may provide an SoC interface.

According to an embodiment, the first circuit system 410 and the second circuit system 420 may each include a 2.5 D-IC, and the data transmission circuit system 411 and the data reception circuit system 421 may provide a 2.5 D-IC interface.

According to an embodiment, the first circuit system 410 and the second circuit system 420 may each include an 3D-IC, and the data transmission circuit system 411 and the data reception circuit system 421 may provide a 3D-IC interface.

According to an embodiment, the first circuit system 410 and the second circuit system 420 may each include at least one of a semiconductor die, an IC, a chiplet, a semiconductor package, an MCM, a SiP, an SoC, a 2.5D-IC, or a 3D-IC, and the data transmission circuit system 411 and the data reception circuit system 421 may provide an interface therebetween.

Although not illustrated in FIG. 4, the first circuit system 410 may further include a data reception circuit system and the second circuit system 420 may further include a data transmission circuit system.

According to an embodiment, the first circuit system 410 and the second circuit system 420 may be included in an electronic device. The electronic device may include at least one processor and a memory, and may be any device in which the at least one processor is configured to execute one or more instructions stored in the memory. For example, the electronic device may be a computer, a personal computer (PC), a laptop PC, a tablet PC, a smartphone, a wearable device, a home appliance, an office electronic device, or an experimental electronic device, but is not limited thereto. For example, the electronic device may be a device mounted on at least one of a vehicle, an electric vehicle, an autonomous vehicle, an aircraft, a spacecraft, or a robot.

Figure 5:
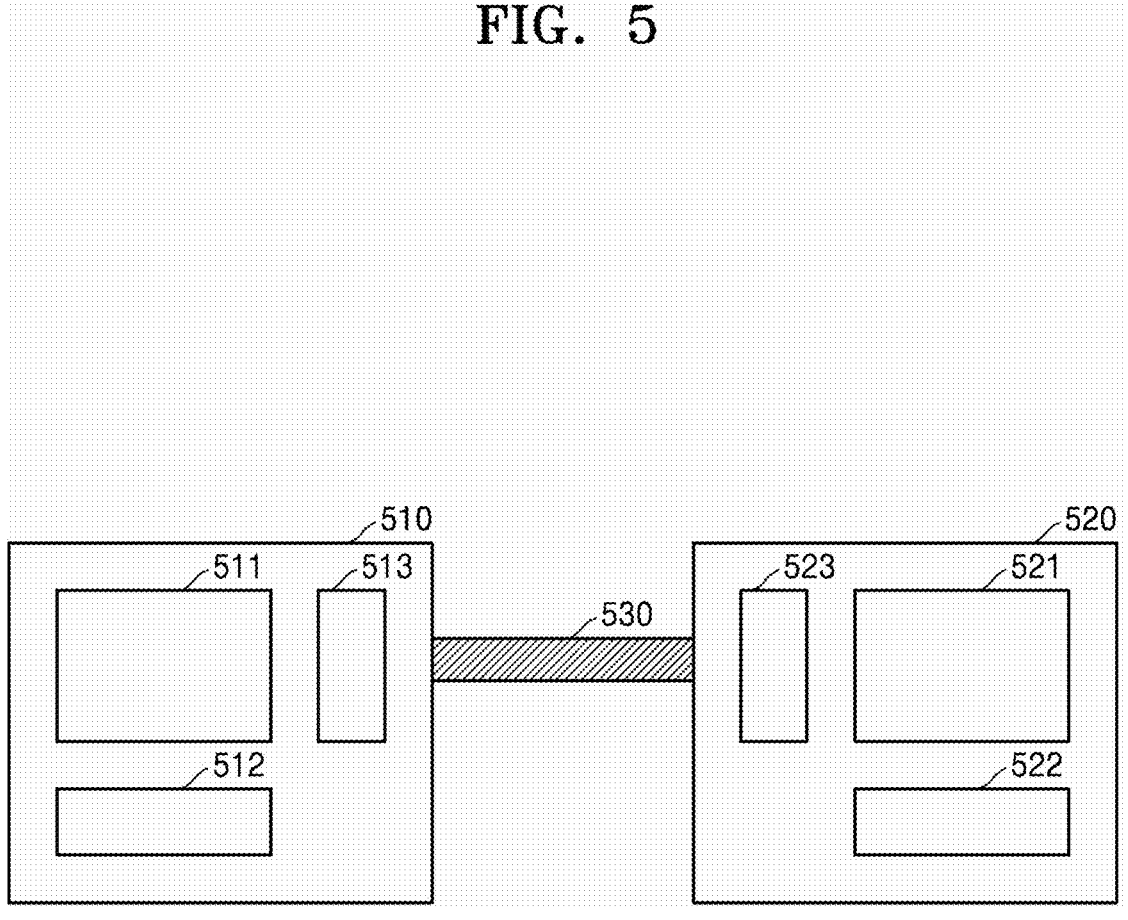
FIG. 5 is a block diagram of a data transmission circuit system and a data reception circuit system, according to an embodiment.

FIG. 5 is a block diagram of a data transmission circuit system 510 and a data reception circuit system 520, according to an embodiment.

The data transmission circuit system 510 according to an embodiment includes a data pulse generation circuit 511, a clock pulse generation circuit 512, and a transmission interface circuit 513.

The data pulse generation circuit 511 may be configured to receive a digital signal and generate a data pulse signal with time levels corresponding to the digital signal, based on a clock pulse signal. The clock pulse generation circuit 512 may be configured to generate the clock pulse signal with a base time level that is a basis of time levels. The transmission interface circuit 513 may be configured to transmit the data pulse signal.

Figure 6:
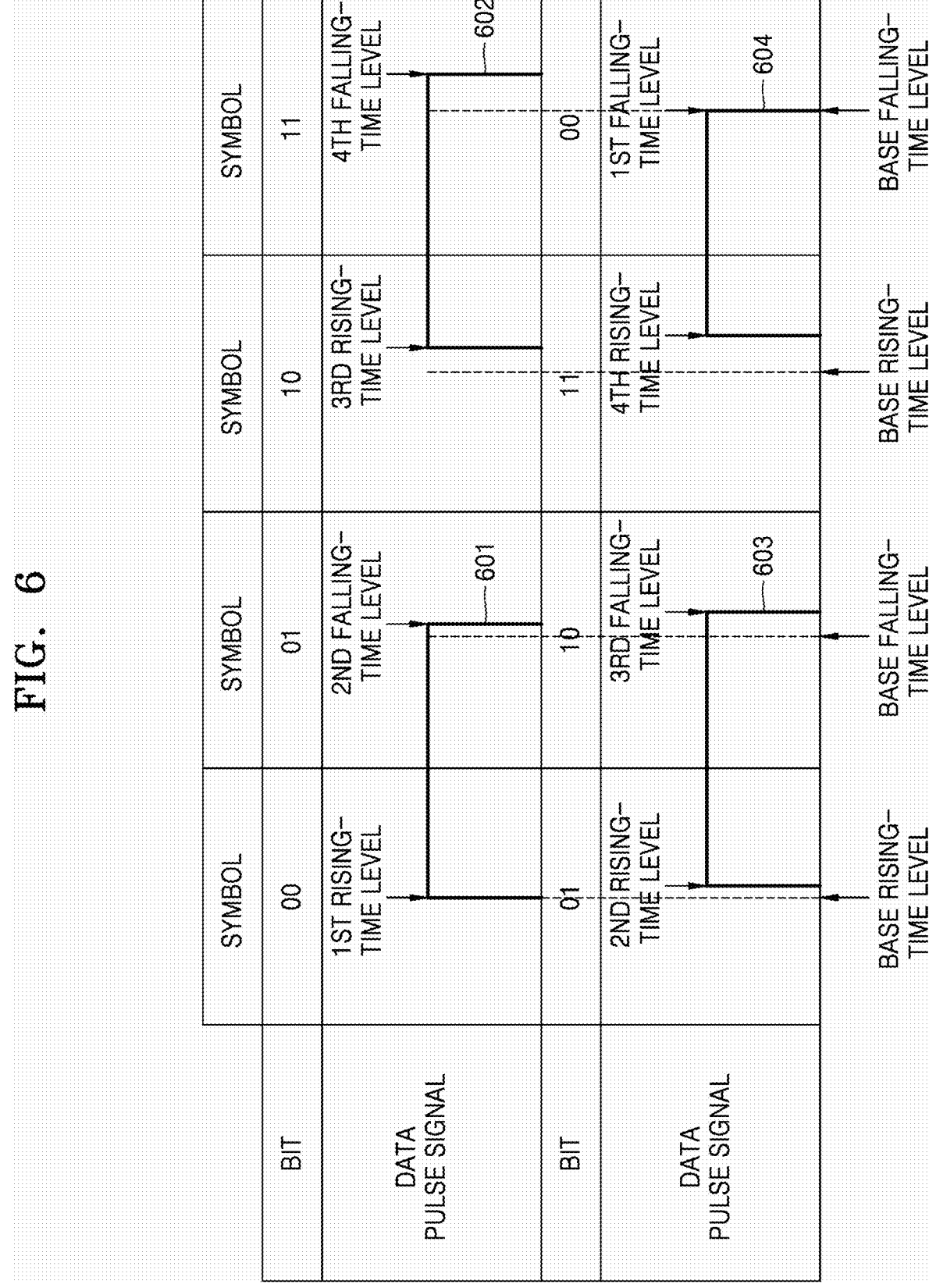
FIG. 6 is a diagram for describing a data pulse signal in which a digital signal is encoded, according to an embodiment.

Referring to FIG. 6, an embodiment in which a digital signal is encoded to a rising edge and a falling edge of a data pulse signal will be described. According to an embodiment, "00" corresponds to a first time level, "01" corresponds to a second time level, "10" corresponds to a third time level, and "11" corresponds to a fourth time level. The digital signal is "0001101101101100" and 2 bits of the digital signal are encoded to one edge of the data pulse signal per symbol. The data pulse signal obtained by encoding the digital signal includes a pulse 601 with a rising edge of a first rising-time level in which "00" is encoded and a falling edge of a second falling-time level in which "01" is encoded, a pulse 602 with a rising edge of a third rising-time level in which "10" is encoded and a falling edge of a fourth falling-time level in which "11" is encoded, a pulse 603 with a rising edge of a second rising-time level in which "01" is encoded and a falling edge of a third falling-time level in which "10" is encoded, and a pulse 604 with a rising edge of a fourth rising-time level in which "11" is encoded and a falling edge of a first falling-time level in which "00" is encoded. Here, a clock pulse signal includes pulses of a rising edge of a base rising-time level and a falling edge of a base falling-time level, a time difference between the rising edge of the clock pulse signal and the rising edge of the data pulse signal in a symbol indicates a rising-time level, and a time difference between the falling edge of the clock pulse signal and the falling edge of the data pulse signal in a symbol indicates a falling-time level.

Referring back to FIG. 5, the data reception circuit system 520 according to an embodiment includes a digital signal generation circuit 521, a clock recovery circuit 522, and a reception interface circuit 523.

The reception interface circuit 523 may be configured to receive the data pulse signal that has passed through a channel 530. The digital signal generation circuit 521 may be configured to generate the digital signal corresponding to time levels of the data pulse signal, based on a recovered clock pulse signal. The clock recovery circuit 522 may be configured to generate the recovered clock pulse signal with a base time level that is a basis of time levels.

Figure 7:
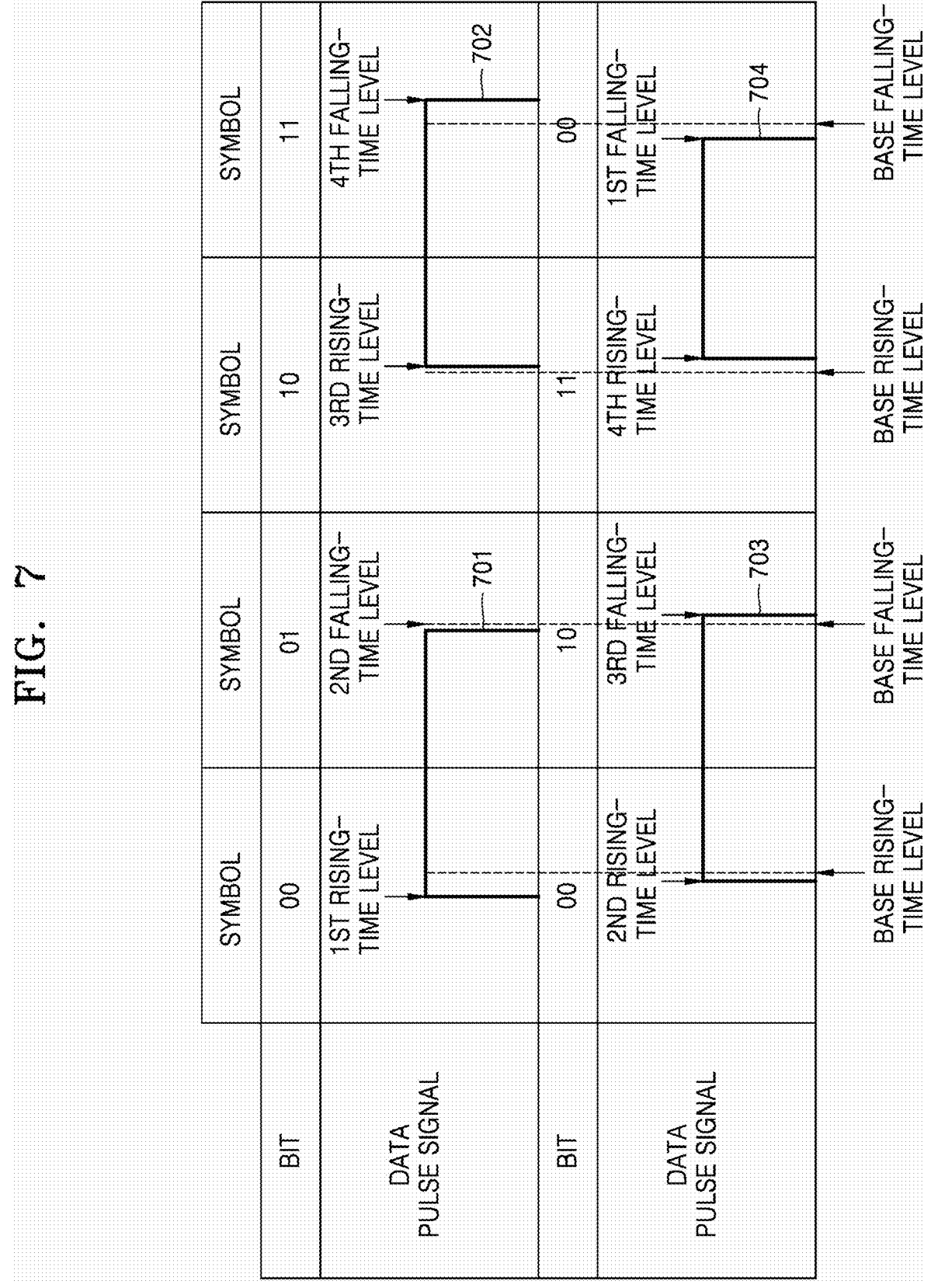
FIG. 7 is a diagram for describing a digital signal obtained by decoding a data pulse signal, according to an embodiment.

Referring to FIG. 7, an embodiment in which a digital signal is decoded from a rising edge and a falling edge of a data pulse signal will be described. According to an embodiment, a first time level corresponds to "00" of the digital signal, a second time level corresponds to "01" of the digital signal, a third time level corresponds to "10" of the digital signal, and a fourth time level corresponds to "11" of the digital signal. 2 bits of the digital signal are decoded from one edge of the data pulse signal, per symbol. In detail, "00" is decoded from a rising edge of a first rising-time level of a pulse 701, "01" is decoded from a falling edge of a second falling-time level of the pulse 701, "10" is decoded from a rising edge of a third rising-time level of a pulse 702, "11" is decoded from a falling edge of a fourth falling-time level of the pulse 702, "01" is decoded from a rising edge of a second rising-time level of a pulse 703, "10" is decoded from a falling edge of a third falling-time level of the pulse 703, "11" is decoded from a rising edge of a fourth rising-time level of a pulse 704, and "00" is decoded from a falling edge of a first falling-time level of the pulse 704. Here, a recovered clock pulse signal includes pulses of a rising edge of a base rising-time level and a falling edge of a base falling-time level, a rising-time level may be determined from a time difference between the rising edge of the recovered clock pulse signal and the rising edge of the data pulse signal in a symbol, and a falling-time level may be determined from a time difference between the falling edge of the recovered clock pulse signal and the falling edge of the data pulse signal in a symbol.

Figure 8A:
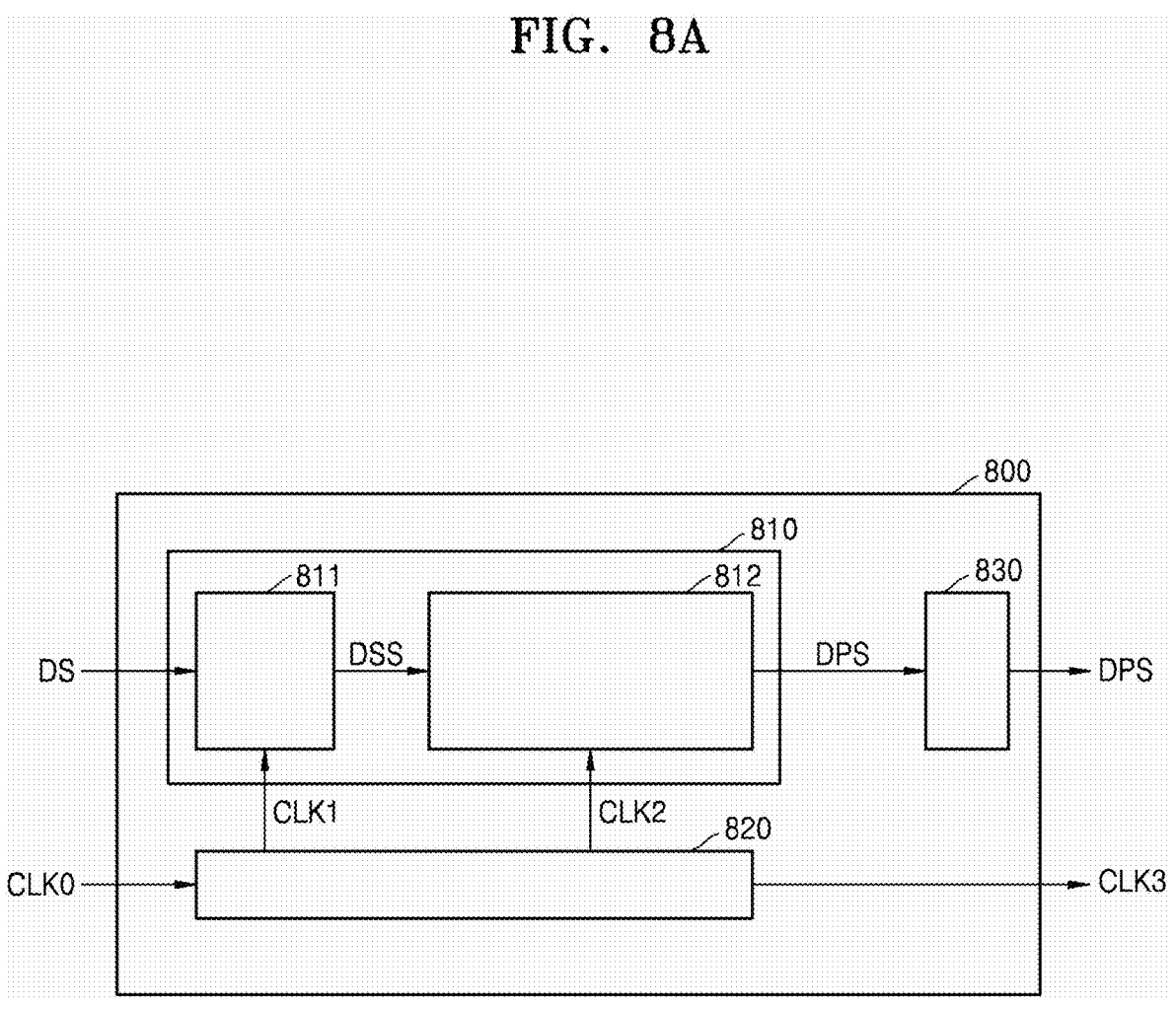
FIG. 8A is a block diagram of a data transmission circuit system according to an embodiment.

FIG. 8A is a block diagram of a data transmission circuit system 800 according to an embodiment.

The data transmission circuit system 800 according to an embodiment includes a data pulse generation circuit 810, a clock pulse generation circuit 820, and a transmission interface circuit 830. The data pulse generation circuit 810 includes a serialization circuit 811 and a digital-time conversion circuit 812.

According to an embodiment, the clock pulse generation circuit 820 may generate clock signals CLK1 and CLK2 required for an operation of the data transmission circuit system 800, based on a base clock signal CLK0. The clock signal CLK1 may be used for an operation of the serialization circuit 811 and the clock pulse signal CLK2 may be used for an operation of the digital-time conversion circuit 812.

According to an embodiment, the clock pulse generation circuit 820 may generate a forward clock signal CLK3 required for an operation of a data reception circuit system. The forward clock signal CLK3 may be forwarded to the data reception circuit system together with a data pulse signal DPS.

The clock pulse generation circuit 820 may generate the clock signals CLK1, CLK2, and CLK3 by changing a frequency and/or a phase of the base clock signal CLK0. In this regard, the clock pulse generation circuit 820 may include at least one of a frequency divider, a frequency multiplier, a frequency converter, or a delay circuit.

The serialization circuit 811 may receive a digital signal DS and generate a digital stream signal DSS by serializing the digital signal DS. The serialization circuit 811 may serialize the digital signal DS, based on the clock signal CLK1. The digital stream signal DSS may be supplied to the digital-time conversion circuit 812.

The serialization circuit 811 may distribute the digital stream signal DSS according to the number of bits per symbol and supply the same to the digital-time conversion circuit 812.

Figure 8B:
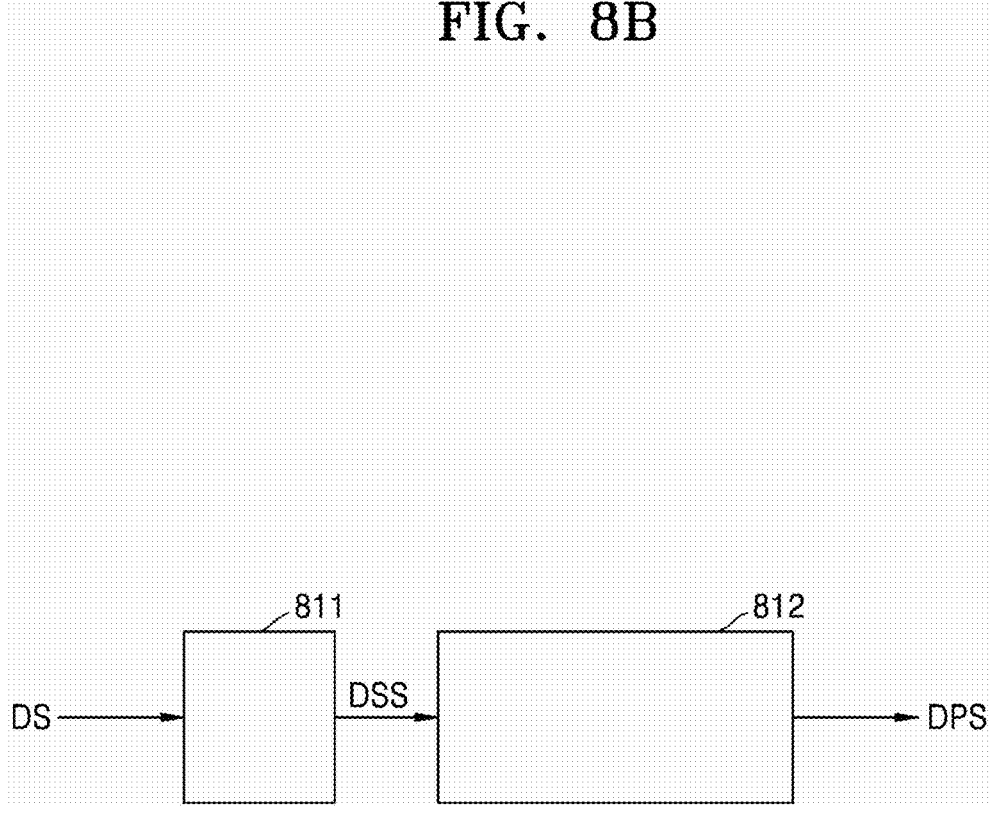

Referring to FIG. 8B, when the number of bits per symbol is 1, the serialization circuit 811 may supply the digital stream signal DSS to the digital-time conversion circuit 812. The digital-time conversion circuit 812 may generate a pulse with a time level corresponding to 1 bit of the digital stream signal DSS, per symbol.

Figure 8C:
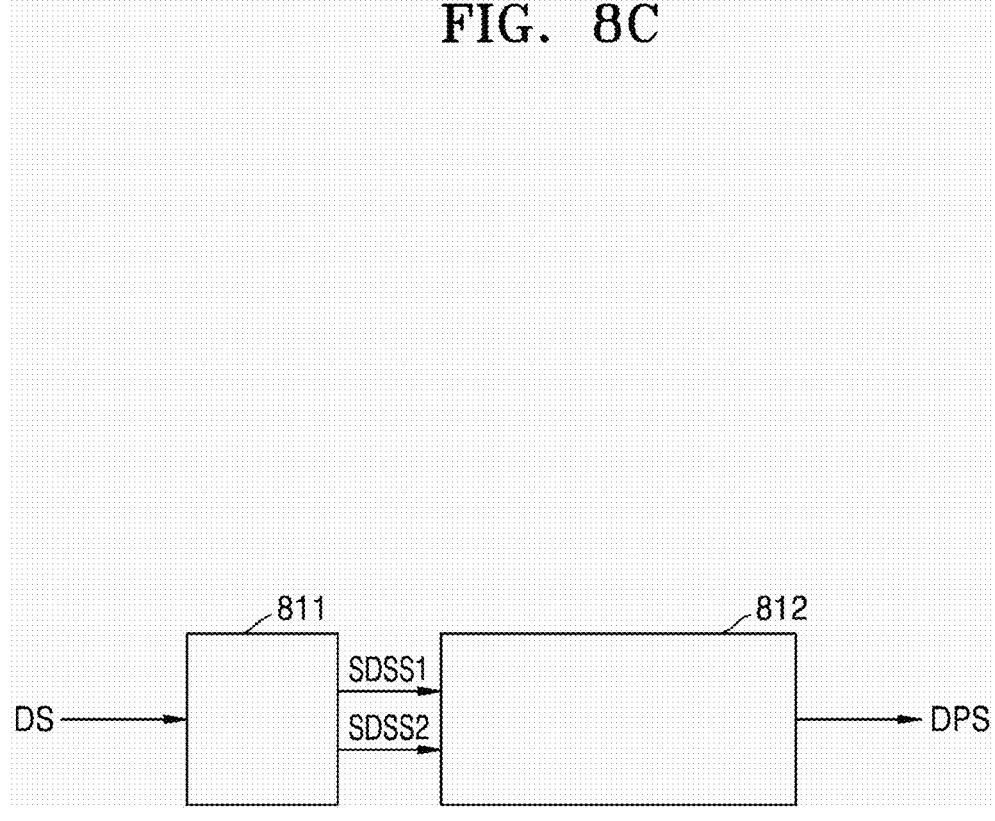

Referring to FIG. 8C, when the number of bits per symbol is 2, the serialization circuit 811 may supply, to the digital-time conversion circuit 812, the digital stream signal DSS divided into a first sub-digital stream signal SDSS1 and a second sub-digital stream signal SDSS2. The digital-time conversion circuit 812 may generate a pulse with a time level corresponding to 2 bits including 1 bit of the first sub-digital stream signal SDSS1 and 1 bit of the second sub-digital stream signal SDSS2, per symbol.

Figure 8D:
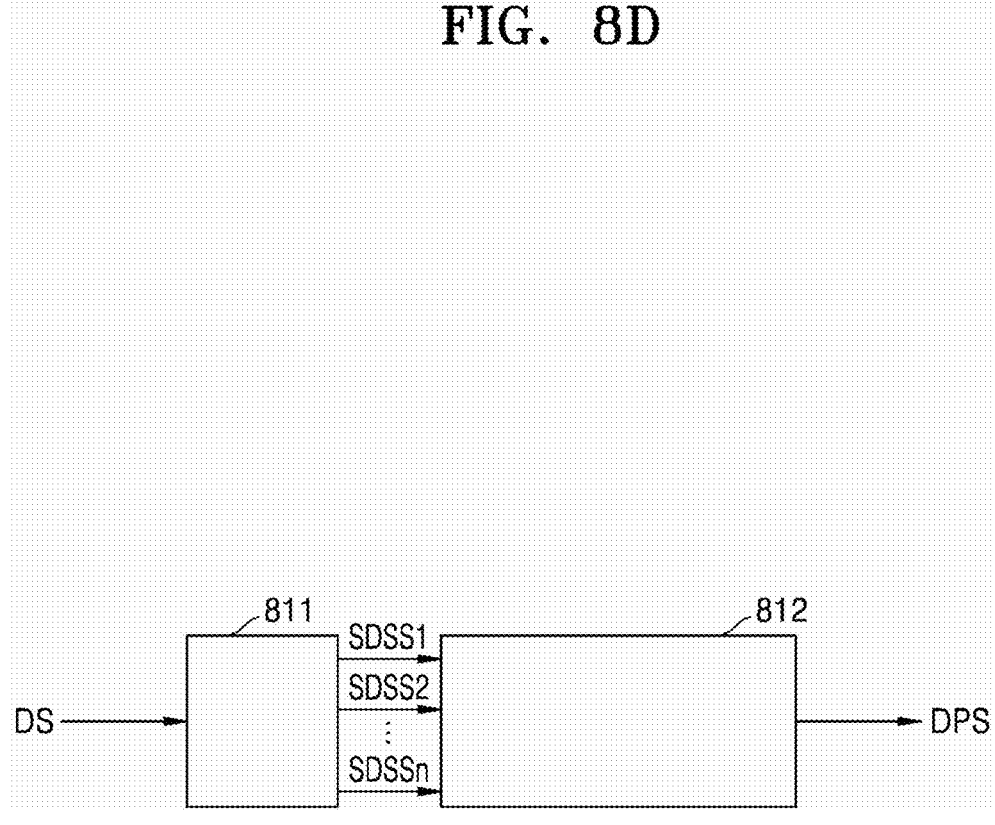

Referring to FIG. 8D, when the number of bits per symbol is n, the serialization circuit 811 may supply, to the digital-time conversion circuit 812, the digital stream signal DSS divided into n sub-digital stream signals SDSS1 to SDSSn. The digital-time conversion circuit 812 may generate a pulse with a time level corresponding to n bits including 1 bit of each of the n sub-digital stream signals SDSS1 to SDSSn, per symbol.

Referring back to FIG. 8A, the digital-time conversion circuit 812 may generate the data pulse signal DPS corresponding to the digital stream signal DSS, based on the clock pulse signal CLK2. The digital-time conversion circuit 812 may generate the data pulse signal DPS by delaying the clock pulse signal CLK2 by a time level corresponding to the digital stream signal DSS. For example, when a value of the digital stream signal DSS is "11" in one symbol and "11" corresponds to a fourth time level, the digital-time conversion circuit 812 may generate a pulse of the data pulse signal DPS by delaying a pulse of the clock pulse signal CLK2 by the fourth time level.

The transmission interface circuit 830 may transmit the data pulse signal DPS to the data reception circuit system through a channel.

Figure 9A:
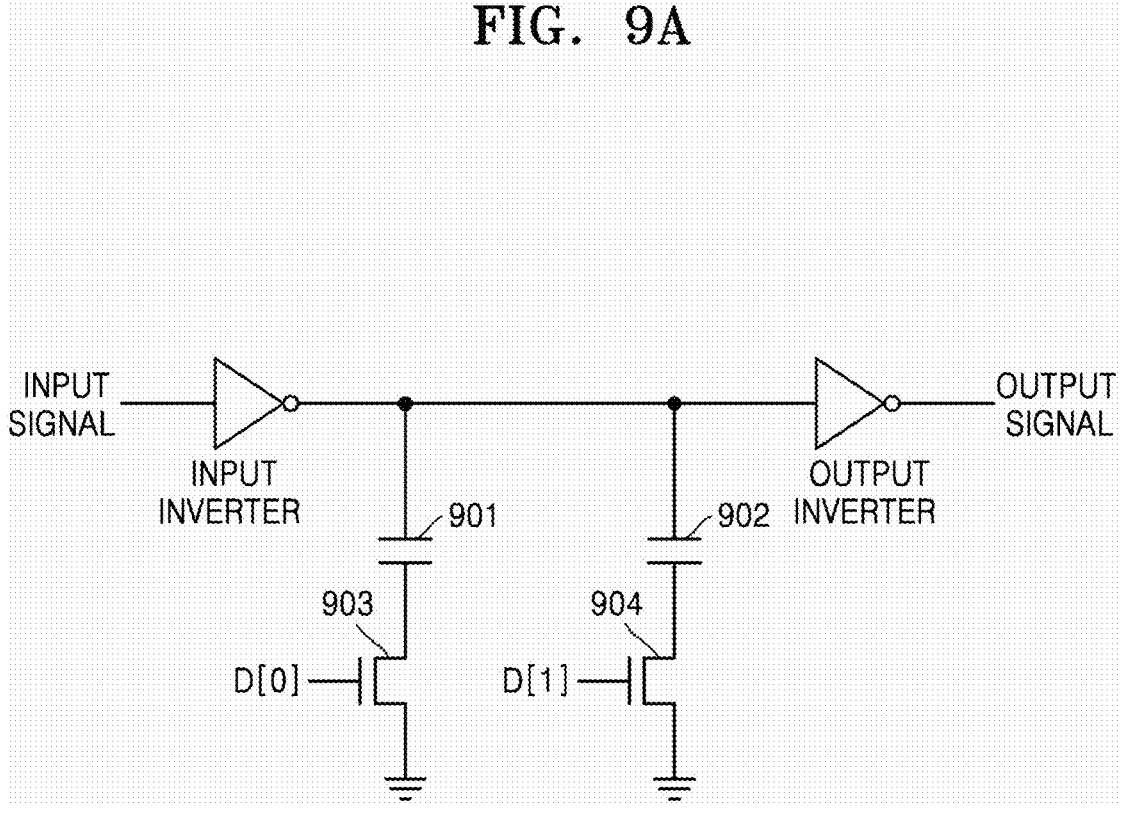
FIGS. 9A and 9B are circuit diagrams of a digital-time conversion circuit according to embodiments.
Figure 9B:
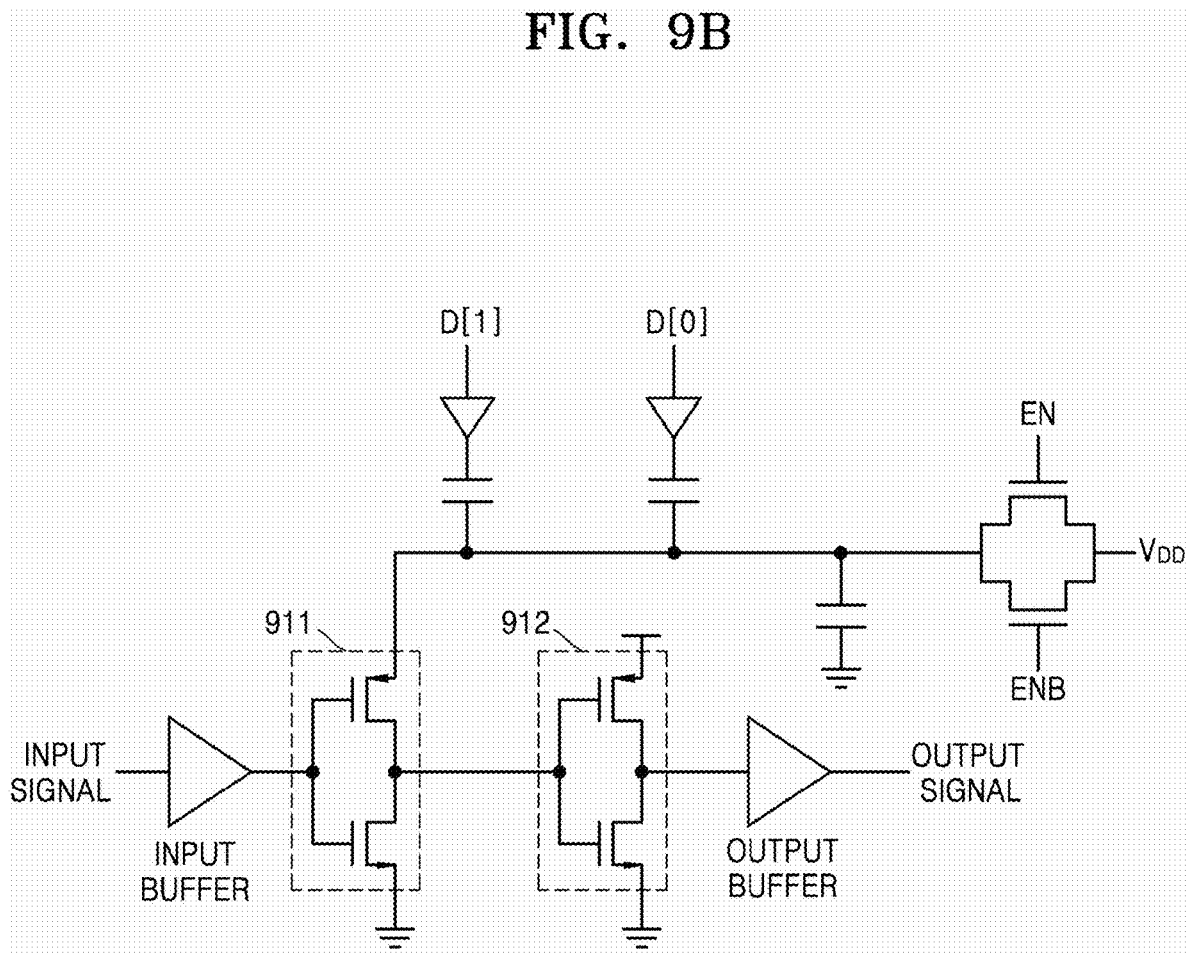

FIGS. 9A and 9B are circuit diagrams of a digital-time conversion circuit according to embodiments.

The digital-time conversion circuit may convert a digital signal into a time level. The time level may be defined by a time difference between a rising edge (or a falling edge) of a clock pulse signal and a rising edge (or a falling edge) of a data pulse signal, and the digital-time conversion circuit may generate the data pulse signal by delaying the clock pulse signal by a time level corresponding to the digital signal.

The digital-time conversion circuit may be implemented through various designs, and for example, the digital-time conversion circuit may include a digital-to-time converter (DTC). Hereinafter, embodiments of the digital-time conversion circuit for generating a data pulse signal corresponding to a digital signal of 2 bits will be described with reference to FIGS. 9A and 9B.

Referring to FIG. 9A, the digital-time conversion circuit according to an embodiment may include capacitors 901 and 902, and transistors 903 and 904. An input signal (i.e., the clock pulse signal) of the digital-time conversion circuit may be delayed by the capacitors 901 and 902 operated by the switches 903 and 904 that are turned on or off according to a digital stream signal (i.e., the digital signal).

A first bit D [0] of the digital stream signal may be connected to a gate terminal of the transistor 903, and a second bit D [1] of the digital stream signal may be connected to a gate terminal of the transistor 904. When the digital stream signal is "00", an output signal that is not delayed (i.e., a pulse with a first time level) may be generated. When the digital stream signal is "01", an output signal delayed by the capacitor 901 (i.e., a pulse with a second time level) may be generated. When the digital stream signal is "10", an output signal delayed by the capacitor 902 (i.e., a pulse with a third time level) may be generated. When the digital stream signal is "11", an output signal delayed by the capacitors 901 and 902 (i.e., a pulse with a fourth time level) may be generated. Here, the capacitors 901 and 902 may have different capacitances so that delay times when the digital stream signal is "01" and "10" are different.

Referring to FIG. 9B, the digital-time conversion circuit according to an embodiment includes a ramp generation circuit 911 and a threshold comparison circuit 912. The ramp generation circuit 911 may receive an input signal (i.e., a clock pulse signal) and generate a ramp signal with an inclination determined by capacitors operating according to a digital stream signal (i.e., a digital signal). The threshold comparison circuit 912 may generate an output signal (i.e., a pulse with a time level) with a delay according to time when the ramp signal exceeds a threshold voltage.

Figure 10:
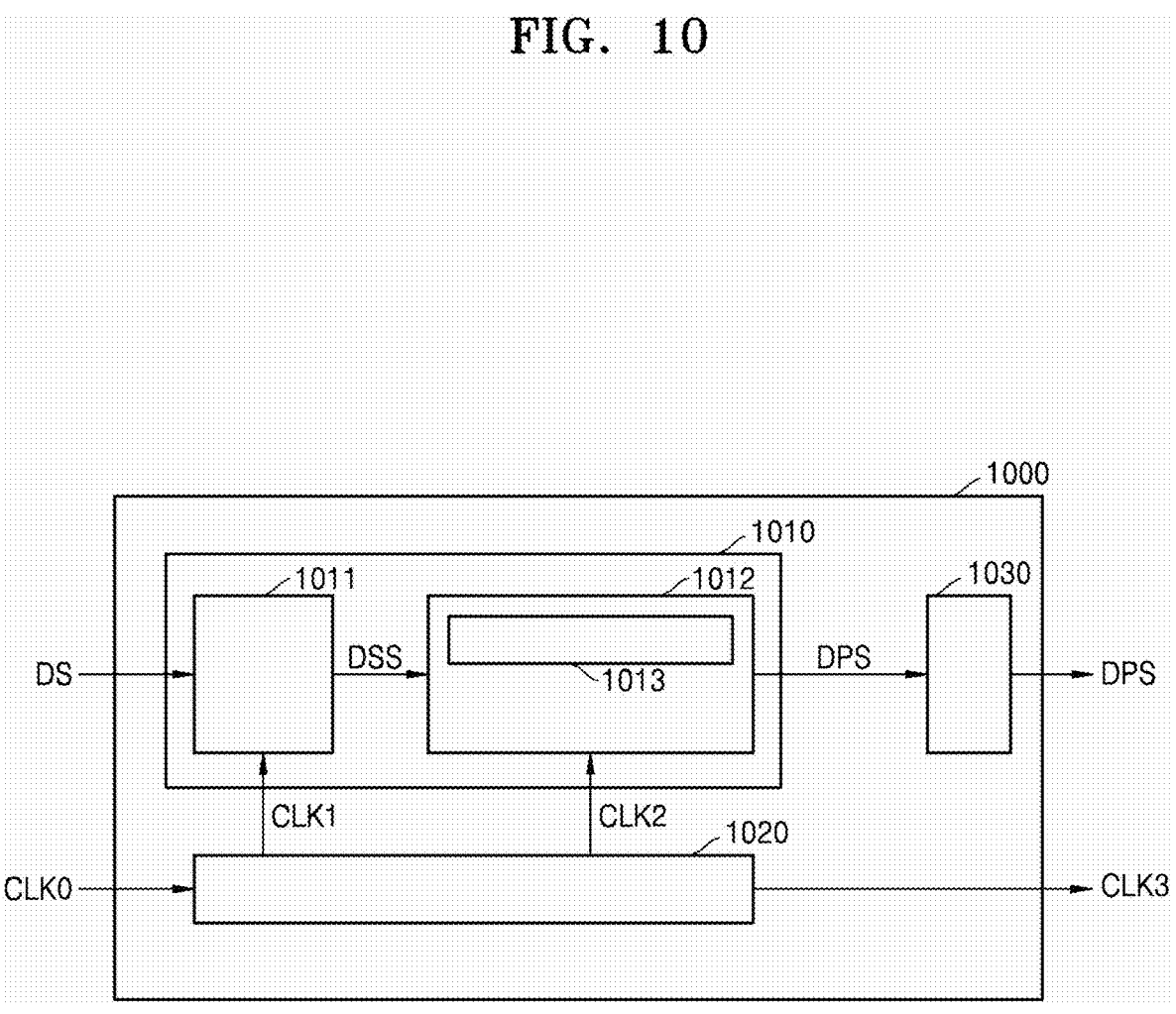
FIG. 10 is a block diagram of a data transmission circuit system according to an embodiment.

FIG. 10 is a block diagram of a data transmission circuit system 1000 according to an embodiment.

The data transmission circuit system 1000 according to an embodiment includes a data pulse generation circuit 1010, a clock pulse generation circuit 1020, and a transmission interface circuit 1030. The data pulse generation circuit 1010 includes a serialization circuit 1011, a digital-time conversion circuit 1012, and an equalization circuit 1013. Descriptions of embodiments apply to the data transmission circuit system 1000 of FIG. 10. Thus, redundant descriptions are omitted.

A time level determines timepoints of a rising edge and a falling edge of a pulse, and thus, an interval between edges may vary according to a time level of a previous symbol and a time level of a current symbol. In other words, the interval between the edges may vary according to a value of a digital signal of the previous symbol and a value of a digital signal of the current symbol. Accordingly, inter-symbol interference (ISI) may occur, wherein data of the previous symbol and data of the current symbol affect the current symbol.

To alleviate the described ISI, the data transmission circuit system 1000 according to an embodiment may include the equalization circuit 1013 configured to improve quality of a data pulse signal, based on the value of the digital signal of the previous symbol and the value of the digital signal of the current symbol. The equalization circuit 1013 may receive, from the serialization circuit 1011, the value of the digital signal (i.e., a value of a digital stream signal) of the previous symbol and the value of the digital signal (i.e., a value of a digital stream signal) of the current symbol, and improve the quality of the data pulse signal by adjusting a delay of the digital-time conversion circuit 1012, based on the value of the digital signal of the previous symbol and the value of the digital signal of the current symbol.

Figure 11A:
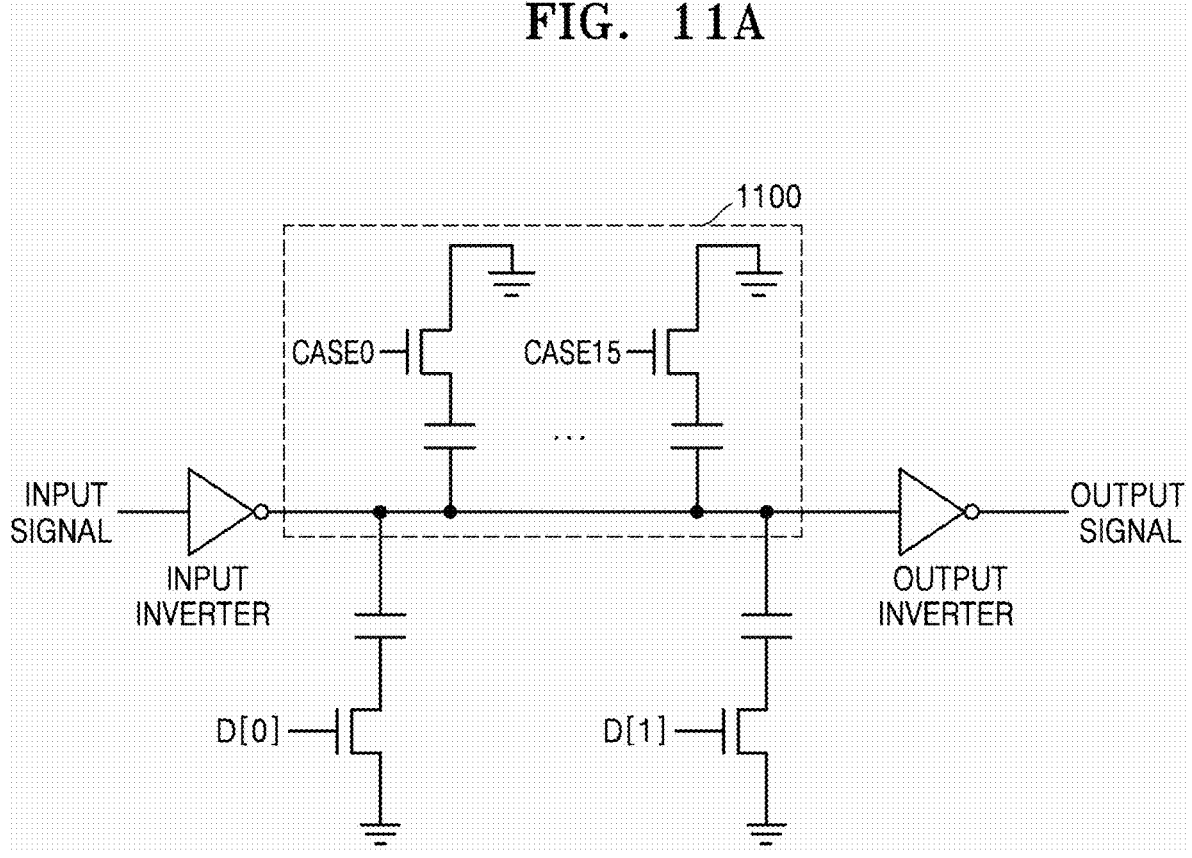
FIGS. 11A and 11B are circuit diagrams of a digital-time conversion circuit and an equalization circuit, according to embodiments.
Figure 11B:
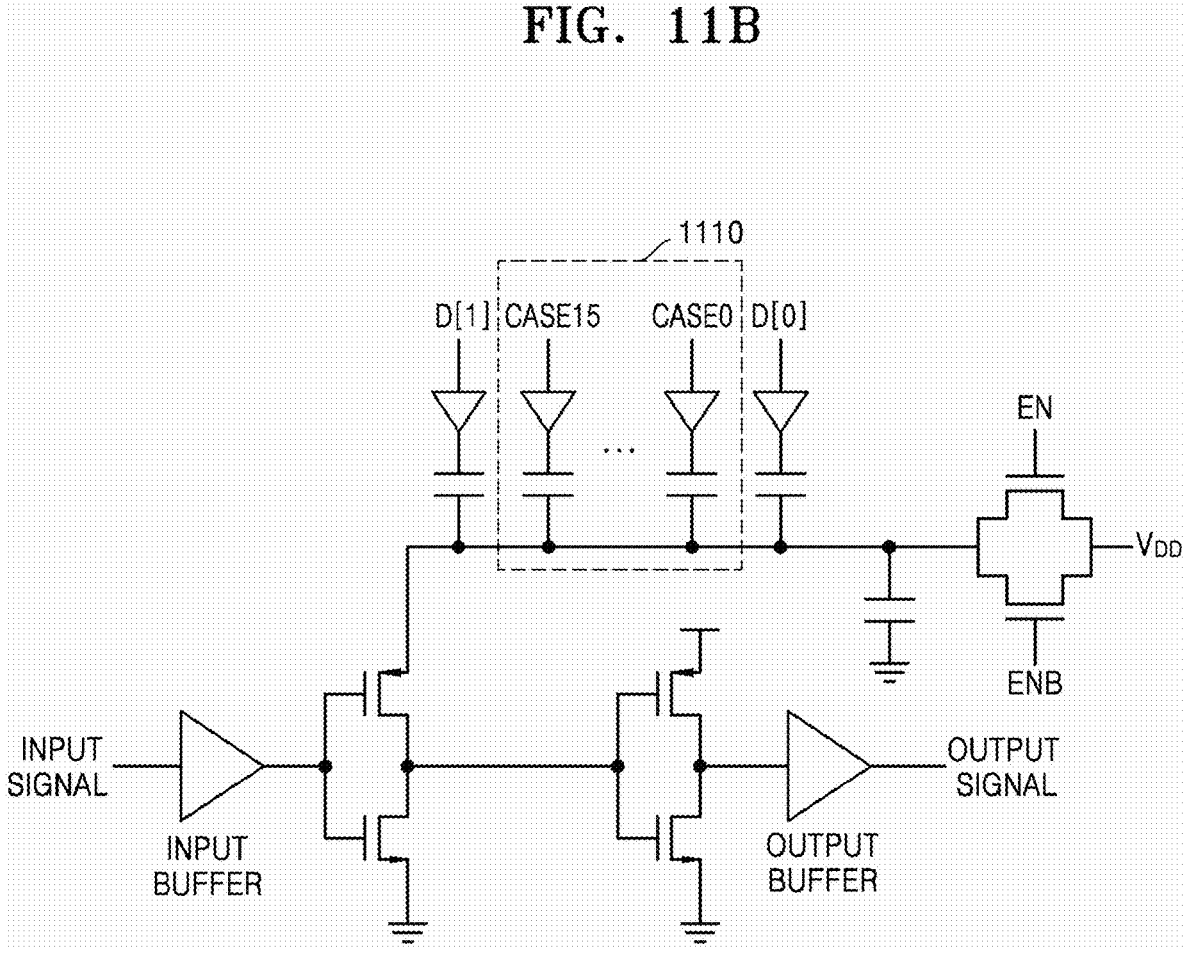

FIGS. 11A and 11B are circuit diagrams of a digital-time conversion circuit and an equalization circuit, according to embodiments.

An equalization circuit may adjust a delay of a digital-time conversion circuit, based on a value of a digital signal (i.e., a value of a digital stream signal) of a previous symbol and a value of a digital signal (i.e., a value of a digital stream signal) of a current symbol. The equalization circuit may be implemented through various designs according to the digital-time conversion circuit, and for example, the equalization circuit may include a feed-forward equalizer (FFE). Hereinafter, embodiments of an equalization circuit when the number of bits of a digital signal per symbol is 2 will be described with reference to FIGS. 11A and 11B.

Referring to FIG. 11A, an equalization circuit 1100 may be configured to adjust a delay of the digital-time conversion circuit of FIG. 9A, based on a value of a digital signal of a previous symbol and a value of a digital signal of a current symbol. The digital signal of 2 bits of the previous symbol and the digital signal of 2 bits of the current symbol may provide 16 cases CASE0 to CASE15. For example, CASE0 denotes a case where the digital signal of the previous symbol is "00" and the digital signal of the current symbol is "00", and CASE15 denotes a case where the digital signal of the previous symbol is "11" and the digital signal of the current symbol is "11". The equalization circuit 1100 may adjust a delay of the digital-time conversion circuit by using transistors and capacitors operating according to the 16 cases. Accordingly, a delay of a clock pulse signal is adjusted based on the value of the digital signal of the previous symbol and the value of the digital signal of the current symbol, and thus, a data pulse signal of the current symbol may be generated.

In a similar manner, referring to FIG. 11B, an equalization circuit 1110 may be configured to adjust a delay of the digital-time conversion circuit of FIG. 9B, based on a value of a digital signal of a previous symbol and a value of a digital signal of a current symbol.

Figure 12A:
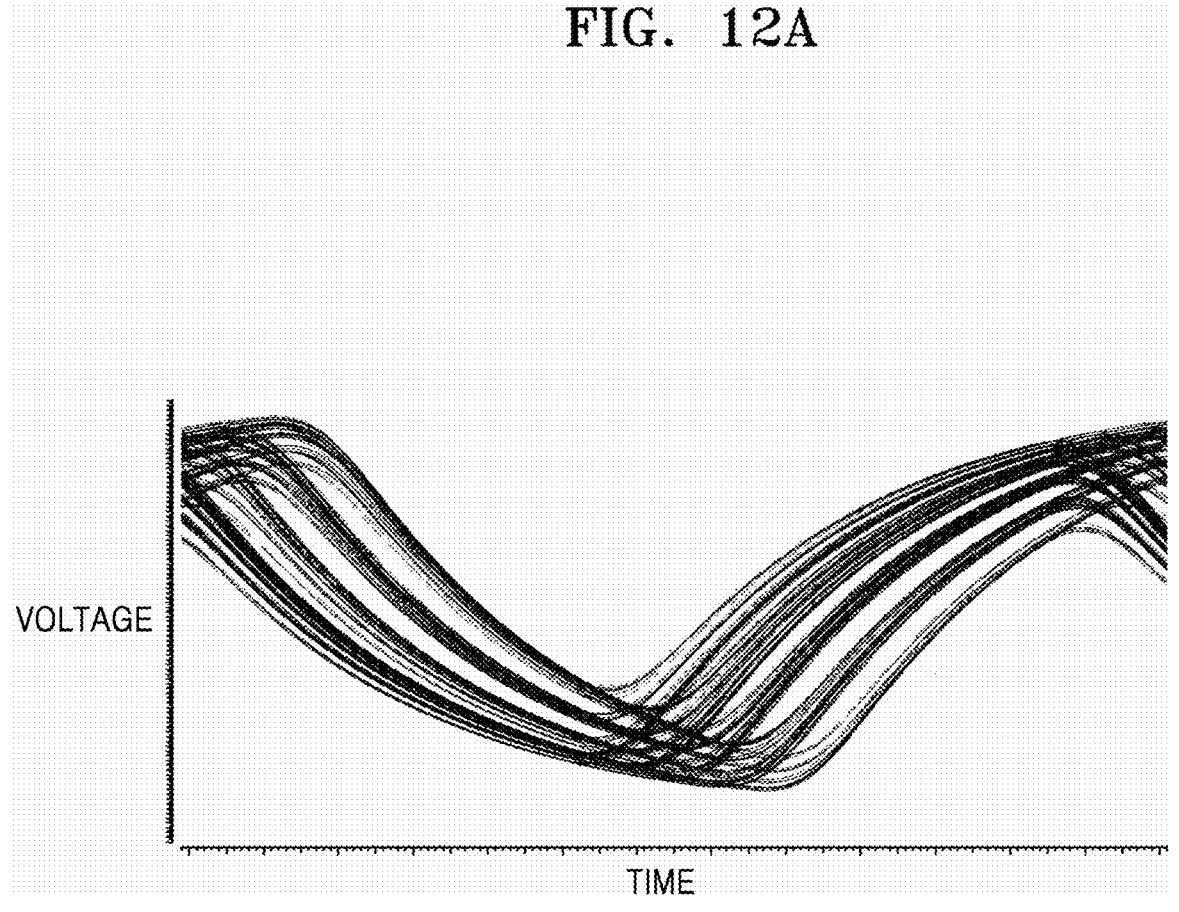
FIGS. 12A and 12B are graphs of a channel response of a pulse signal, according to embodiments.
Figure 12B:
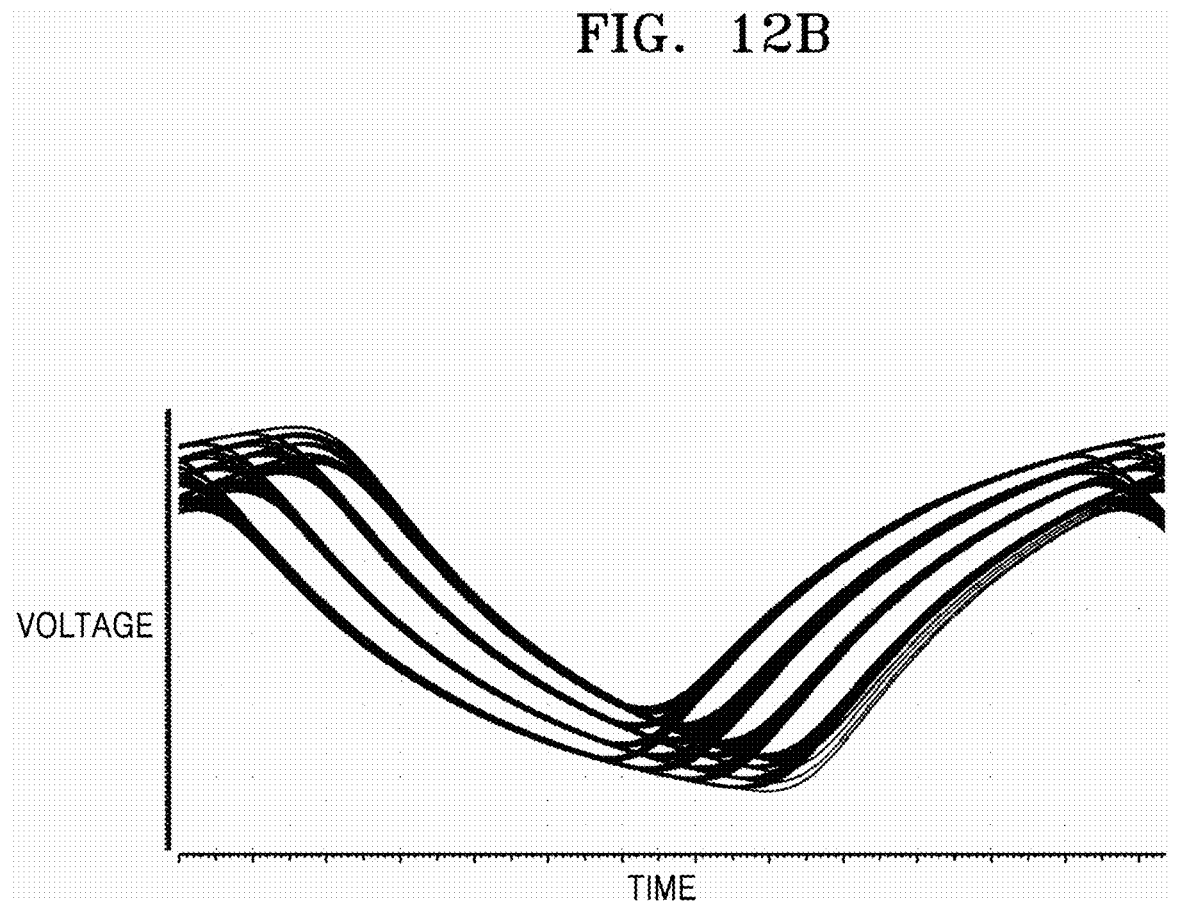

FIGS. 12A and 12B are graphs of a channel response of a pulse signal, according to embodiments.

FIG. 12A is a graph of a channel response of a data pulse signal of a data transmission circuit system that does not include an equalization circuit, and FIG. 12B is a graph of a channel response of a data pulse signal of a data transmission circuit system that includes an equalization circuit. Comparing FIGS. 12A and 12B, it is determined that ISI of a data pulse signal is alleviated when an equalization circuit is included.

Figure 13A:
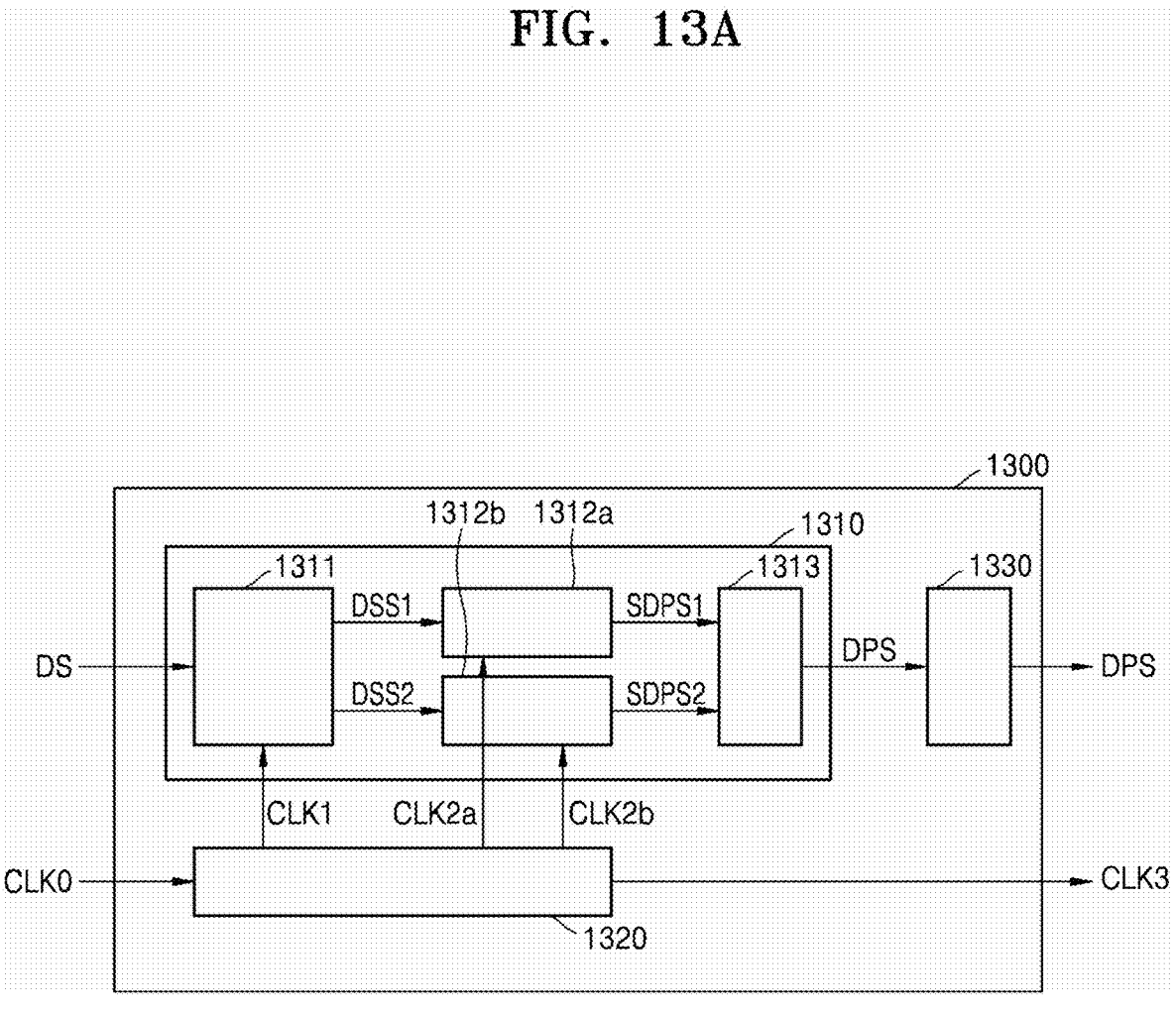
FIGS. 13A and 13B are block diagrams of a data transmission circuit system according to embodiments.
Figure 13B:
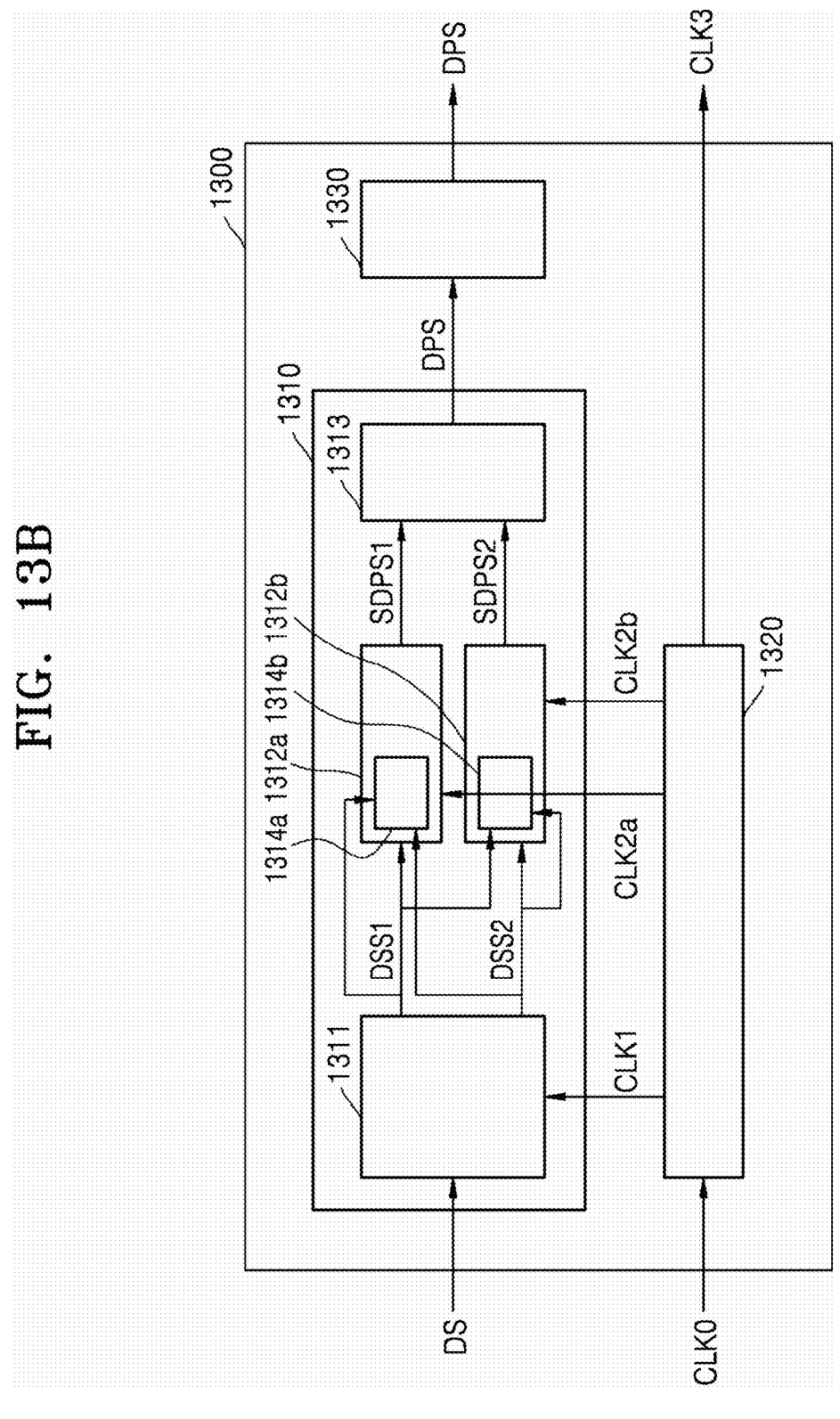

FIGS. 13A and 13B are block diagrams of a data transmission circuit system 1300 according to embodiments.

Referring to FIG. 13A, the data transmission circuit system 1300 according to an embodiment includes a data pulse generation circuit 1310, a clock pulse generation circuit 1320, and a transmission interface circuit 1330. The data pulse generation circuit 1310 includes a serialization circuit 1311, a first digital-time conversion circuit 1312*a*, a second digital-time conversion circuit 1312*b*, and a data pulse combining circuit 1313. Descriptions of embodiments apply to the data transmission circuit system 1300 of FIG. 13. Thus, redundant descriptions are omitted.

The data transmission circuit system 1300 according to an embodiment may generate the data pulse signal DPS trough a time-interleaved operation. Time interleaving may be performed by using a first clock pulse signal CLK2*a* and a second clock pulse signal CLK2*b*, which have different phases. A phase difference between the first clock pulse signal CLK2*a* and the second clock pulse signal CLK2*b* may be variously set such as not to exceed 360 degrees.

The clock pulse generation circuit 1320 may generate the first clock pulse signal CLK2*a* and the second clock pulse signal CLK2*b*, which have different phases and a same frequency, for the time interleaving. A rising edge of the first clock pulse signal CLK2*a* and a falling edge of the second clock pulse signal CLK2*b* may have different timepoints, and accordingly time-interleaved.

The serialization circuit 1311 may generate a first digital stream signal DSS1 and a second digital stream signal DSS2 by serializing and distributing the digital signal DS. The first digital stream signal DSS1 may be supplied to the first digital-time conversion circuit 1312*a*, and the second digital stream signal DSS2 may be supplied to the second digital-time conversion circuit 1312*b*.

The first digital-time conversion circuit 1312*a* may generate a first sub-data pulse signal SDPS1 by delaying the first clock pulse signal CLK2*a* by a rising-time level corresponding to the first digital stream signal DSS1. Similarly, the second digital-time conversion circuit 1312*b* may generate a second sub-data pulse signal SDPS2 by delaying the second clock pulse signal CLK2*b* by a falling-time level corresponding to the second digital stream signal DSS2.

The data pulse combining circuit 1313 may generate the data pulse signal DPS by combining the first sub-data pulse signal SDPS1 with the second sub-data pulse signal SDPS2. In detail, the data pulse combining circuit 1313 may generate the data pulse signal DPS such that the data pulse signal DPS include rising edges of the first sub-data pulse signal SDPS1 and falling edges of the second sub-data pulse signal SDPS2.

The data transmission circuit system 800 of FIG. 8A encodes one piece of data to one pulse of the data pulse signal DPS, whereas the data transmission circuit system 1300 may encode different pieces of data to two edges of a pulse of the data pulse signal DPS. Accordingly, compared to the data transmission circuit system 800, the data transmission circuit system 1300 may generate the data pulse signal DPS of a same frequency at a twice higher transmission speed. For example, the data transmission circuit system 800 encodes two-bit data per pulse of the data pulse signal DPS to have a transmission speed of 32 Gbps, whereas the data transmission circuit system 1300 encodes two-bit data to each of a rising edge and a falling edge, i.e., total four-bit data, per pulse of the data pulse signal DPS to have a transmission speed of 64 Gbps.

Referring to FIG. 13B, to alleviate the ISI, the data transmission circuit system 1300 according to an embodiment may include a first equalization circuit 1314a and a second equalization circuit 1314b configured to improve quality of a data pulse signal, based on the value of the digital signal of the previous symbol and the value of the digital signal of the current symbol.

The first equalization circuit 1314a may receive, from the serialization circuit 1311, the value of the digital signal (i.e., a value of the second digital stream signal DSS2) of the previous symbol and the value of the digital signal (i.e., a value of the first digital stream signal DSS1) of the current symbol, and adjust a delay of the first digital-time conversion circuit 1312a, based on the value of the digital signal of the previous symbol and the value of the digital signal of the current symbol. The second equalization circuit 1314b may receive, from the serialization circuit 1311, the value of the digital signal (i.e., the value of the first digital stream signal DSS1) of the previous symbol and the value of the digital signal (i.e., the value of the second digital stream signal DSS2) of the current symbol, and adjust a delay of the second digital-time conversion circuit 1312b, based on the value of the digital signal of the previous symbol and the value of the digital signal of the current symbol.

Figure 14:
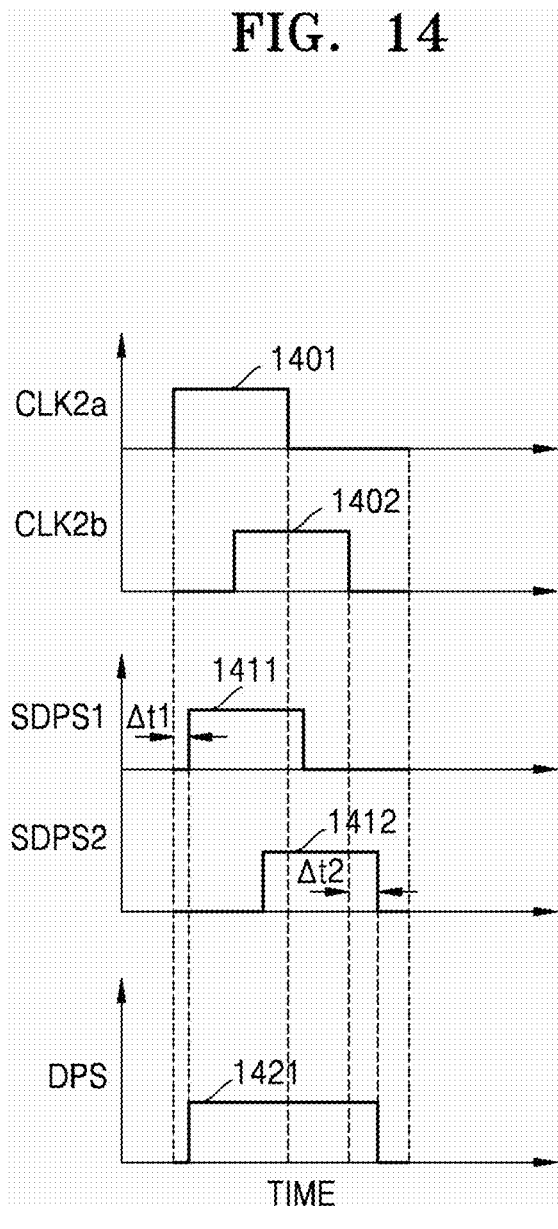
FIG. 14 is a diagram for describing an operation of a data pulse combining circuit, according to an embodiment.

FIG. 14 is a diagram for describing an operation of a data pulse combining circuit, according to an embodiment.

An operation of the data pulse combining circuit 1313 according to an embodiment will be described with reference to FIGS. 13A and 14. According to an embodiment, the first clock pulse signal CLK2a and the second clock pulse signal CLK2b have a phase difference of 90 degrees, and the digital signal DS is encoded to a rising edge and a falling edge of the data pulse signal DPS. A first time level is a base time level, a time difference between a second time level and the base time level is Δt1, and a time difference between a third time level and the base time level is Δt2.

According to an embodiment, the first digital-time conversion circuit 1312a generates a pulse 1411 of the first sub-data pulse signal SDPS1 by delaying a pulse 1401 of the first clock pulse signal CLK2a by the second time level corresponding to a value of the digital signal DS (i.e., a value of the first digital stream signal DSS1) of a symbol. Similarly, the second digital-time conversion circuit 1312b generates a pulse 1412 of the second sub-data pulse signal SDPS2 by delaying a pulse 1402 of the second clock pulse signal CLK2b by the third time level corresponding to the value of the digital signal DS (i.e., a value of the second digital stream signal DSS2) of a next symbol.

The data pulse combining circuit 1313 generates the data pulse signal DPS with a pulse 1421 by combining the first sub-data pulse signal SDPS1 with the second sub-data pulse signal SDPS2. A rising edge of the pulse 1421 has a same timepoint as a rising edge of the pulse 1411, and a falling edge of the pulse 1421 has a same timepoint as a falling edge of the pulse 1412.

According to an embodiment, the data pulse combining circuit 1313 may include a switching circuit (not shown) using rising edges of the first sub-data pulse signal SDPS1 and falling edges of the second sub-data pulse signal SDPS2 as triggers. The switching circuit may output the first sub-data pulse signal SDPS1 in response to the rising edge of the first sub-data pulse signal SDPS1 and then output the second sub-data pulse signal SDPS2 in response to the falling edge of the second sub-data pulse signal SDPS2.

Figure 15:
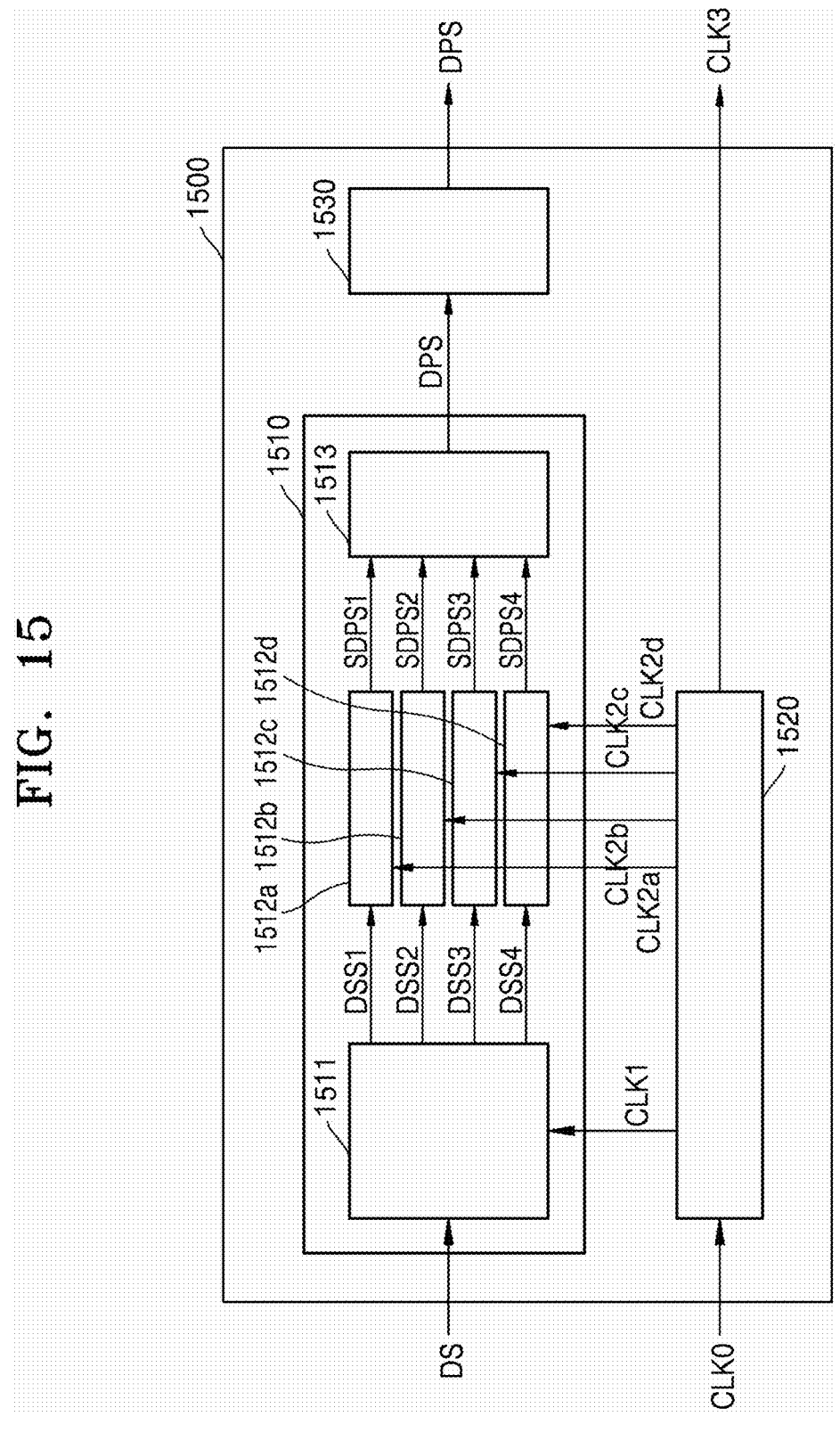
FIG. 15 is a block diagram of a data transmission circuit system according to an embodiment.

FIG. 15 is a block diagram of a data transmission circuit system 1500 according to an embodiment.

The data transmission circuit system 1500 according to an embodiment includes a data pulse generation circuit 1510, a clock pulse generation circuit 1520, and a transmission interface circuit 1530. The data pulse generation circuit 1510 includes a serialization circuit 1511, a first digital-time conversion circuit 1512a, a second digital-time conversion circuit 1512b, a third digital-time conversion circuit 1512c, a fourth digital-time conversion circuit 1512d, and a data pulse combining circuit 1513. Descriptions of embodiments apply to the data transmission circuit system 1500 of FIG. 15. Thus, redundant descriptions are omitted.

The data transmission circuit system 1500 according to an embodiment may perform a time-interleaved operation by using a first clock pulse signal CLK2a, a second clock pulse signal CLK2b, a third clock pulse signal CLK2c, and a fourth clock pulse signal CLK2d, which have different phases. Phase differences between the first clock pulse signal CLK2a, the second clock pulse signal CLK2b, the third clock pulse signal CLK2c, and the fourth clock pulse signal CLK2d may be variously set such as not to exceed 360 degrees.

The clock pulse generation circuit 1520 may generate the first clock pulse signal CLK2a, the second clock pulse signal CLK2b, the third clock pulse signal CLK2c, and the fourth clock pulse signal CLK2d, which have different phases and a same frequency, for the time interleaving. The first clock pulse signal CLK2a, the second clock pulse signal CLK2b, the third clock pulse signal CLK2c, and the fourth clock pulse signal CLK2d have rising edges (or falling edges) having different timepoints, and may be accordingly time-interleaved.

The data transmission circuit system 1500 may provide a same transmission speed by using a digital-time conversion circuit operating at ae frequency twice lower than the data transmission circuit system 1300 of FIG. 13. For example, the data transmission circuit system 1300 provides a 64 Gbps transmission speed by using two digital-time conversion circuits configured to modulate data of 2 bits per symbol to 16 GHZ, whereas the data transmission circuit system 1500 provides a 64 Gbps transmission speed by using four digital-time conversion circuits configured to modulate data of 2 bits per symbol to 8 GHz.

Figure 16:
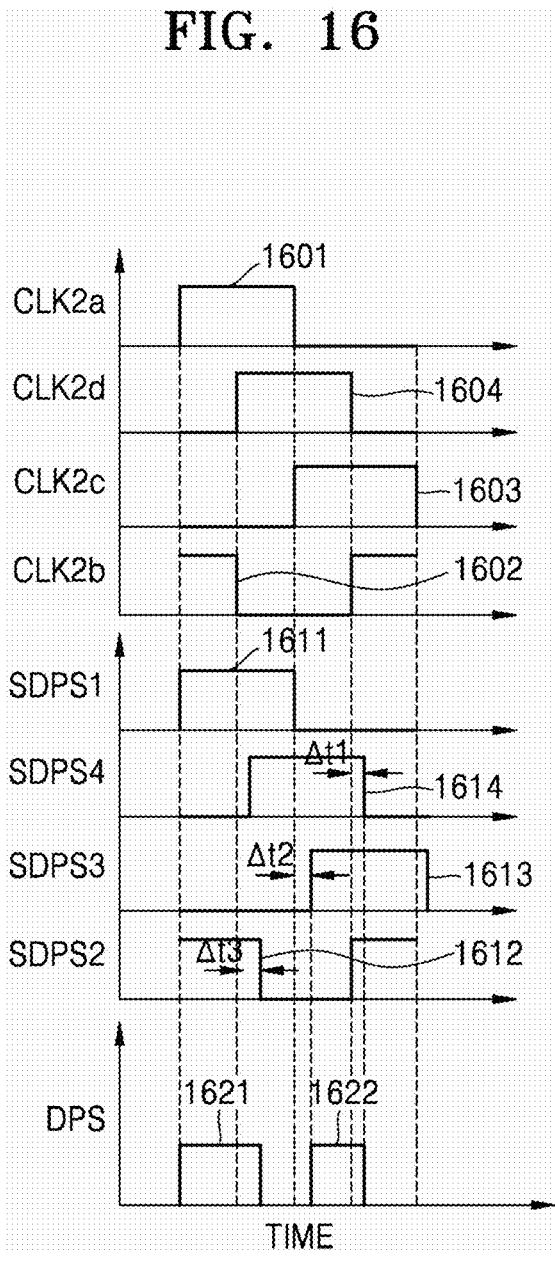
FIG. 16 is a diagram for describing an operation of a data pulse combining circuit, according to an embodiment.

FIG. 16 is a diagram for describing an operation of a data pulse combining circuit, according to an embodiment.

An operation of the data pulse combining circuit according to an embodiment will be described with reference to FIGS. 15 and 16. According to an embodiment, the first clock pulse signal CLK2a, the second clock pulse signal CLK2b, the third clock pulse signal CLK2c, and the fourth clock pulse signal CLK2*d* have phase differences of 90 degrees, and the digital signal DS is encoded to rising edges and falling edges of the data pulse signal DPS. A first time level is a base time level, a time difference between a second time level and the base time level is Δt1, a time difference between a third time level and the base time level is Δt2, and a time difference between a fourth time level and the base time level is Δt3.

According to an embodiment, the first digital-time conversion circuit 1512*a* generates a pulse 1611 of the first sub-data pulse signal SDPS1 by delaying a pulse 1601 of the first clock pulse signal CLK2*a* by the first time level corresponding to a value of the digital signal DS (i.e., a value of the first digital stream signal DSS1) of a symbol. Here, the first time level is the base time level, and thus, the pulse 1601 is not delayed.

The second digital-time conversion circuit 1512*b* generates a pulse 1612 of the second sub-data pulse signal SDPS2 by delaying a pulse 1602 of the second clock pulse signal CLK2*b* by the fourth time level corresponding to the value of the digital signal DS (i.e., a value of the second digital stream signal DSS2) of a symbol. Here, the pulse 1602 is delayed by Δt3.

The third digital-time conversion circuit 1512*c* generates a pulse 1613 of a third sub-data pulse signal SDPS3 by delaying a pulse 1603 of the third clock pulse signal CLK2*c* by the third time level corresponding to the value of the digital signal DS (i.e., a value of a third digital stream signal DSS3) of a symbol. Here, the pulse 1603 is delayed by Δt2.

The fourth digital-time conversion circuit 1512*d* generates a pulse 1614 of a fourth sub-data pulse signal SDPS4 by delaying a pulse 1604 of the fourth clock pulse signal CLK2*d* by the second time level corresponding to the value of the digital signal DS (i.e., a value of a fourth digital stream signal DSS4) of a symbol. Here, the pulse 1604 is delayed by Δt1.

The data pulse combining circuit 1513 generates the data pulse signal DPS with pulses 1621 and 1622 having same timepoints of rising edges respectively as the pulses 1611 and 1613 and same timepoints of falling edges respectively as the pulses 1612 and 1614 by combining the first sub-data pulse signal SDPS1, the second sub-data pulse signal SDPS2, the third sub-data pulse signal SDPS3, and the fourth sub-data pulse signal SDPS4 with each other.

Figure 17A:
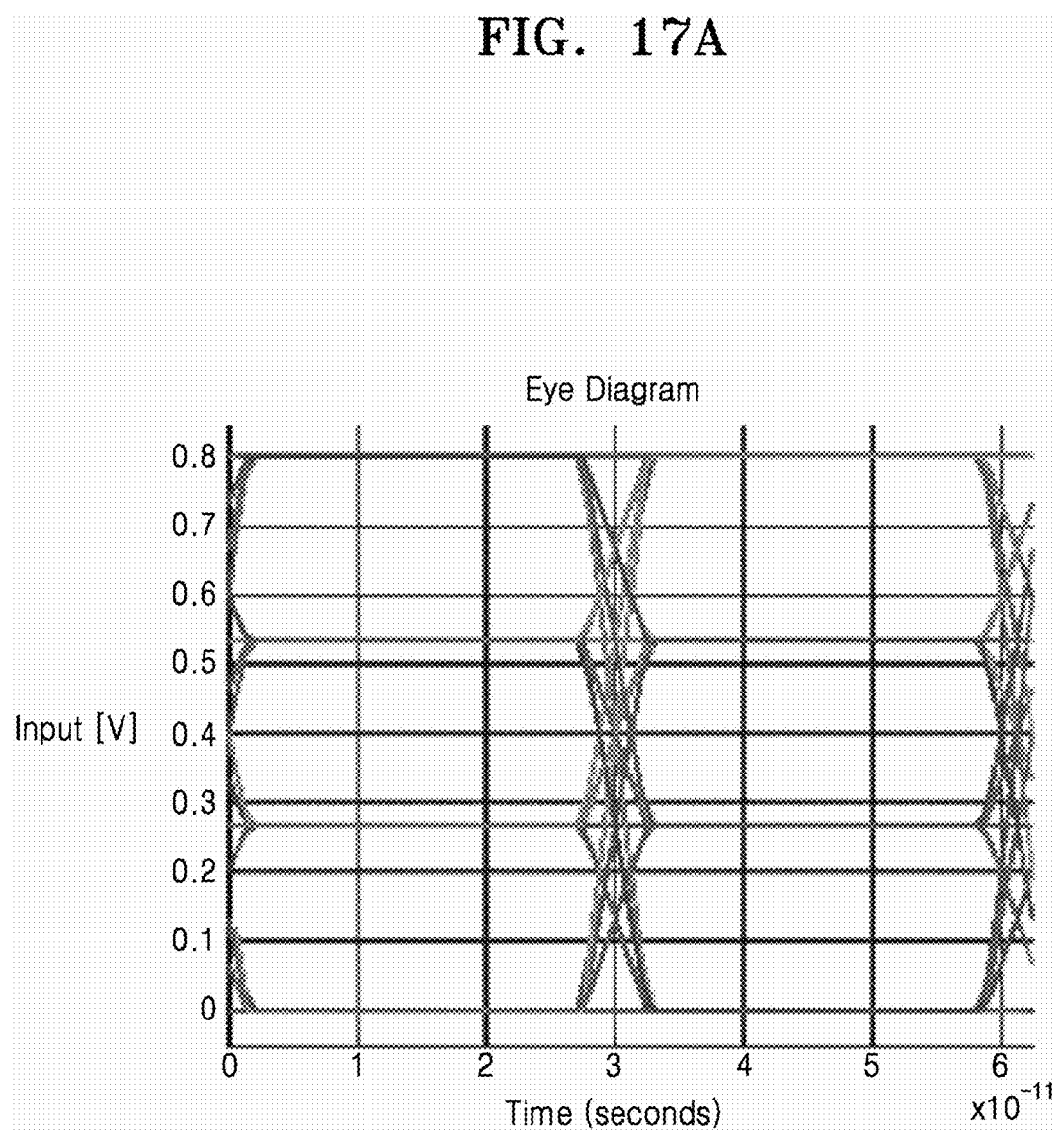
FIGS. 17A and 17B are eye diagrams of a PAM4 signal.
Figure 17B:
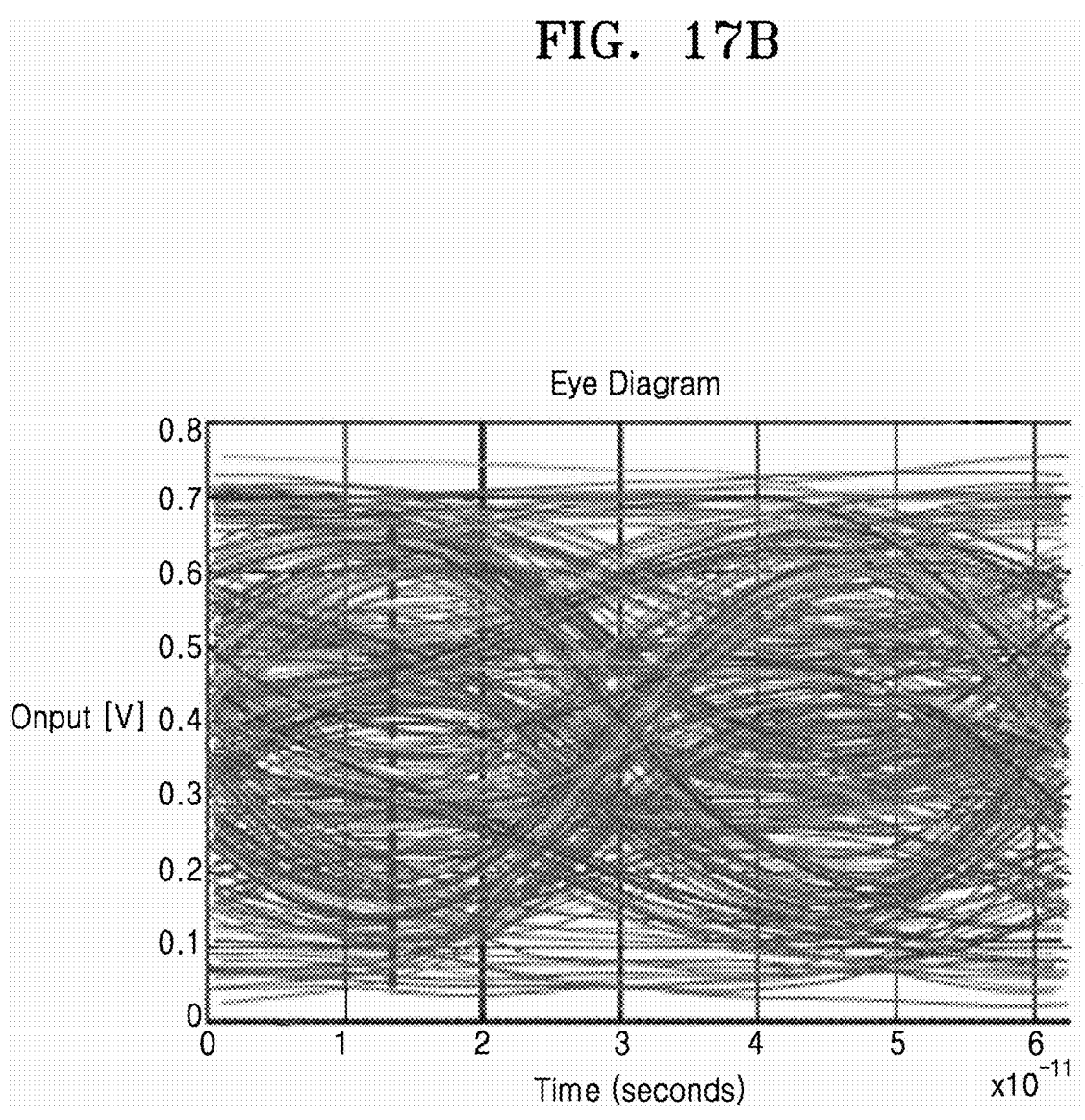
Figure 17C:
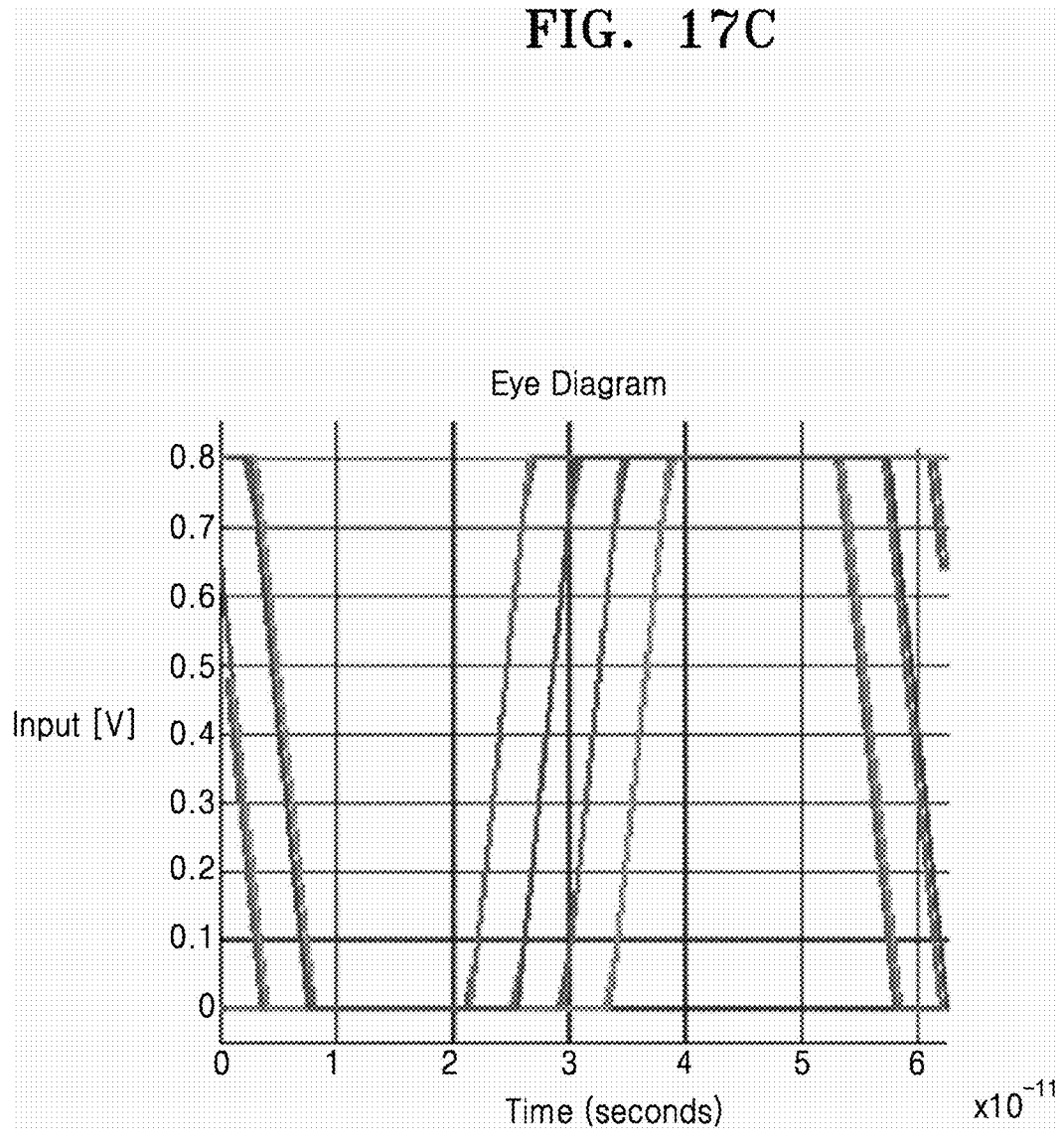
FIGS. 17C and 17D are eye diagrams of a data pulse signal according to an embodiment.
Figure 17D:
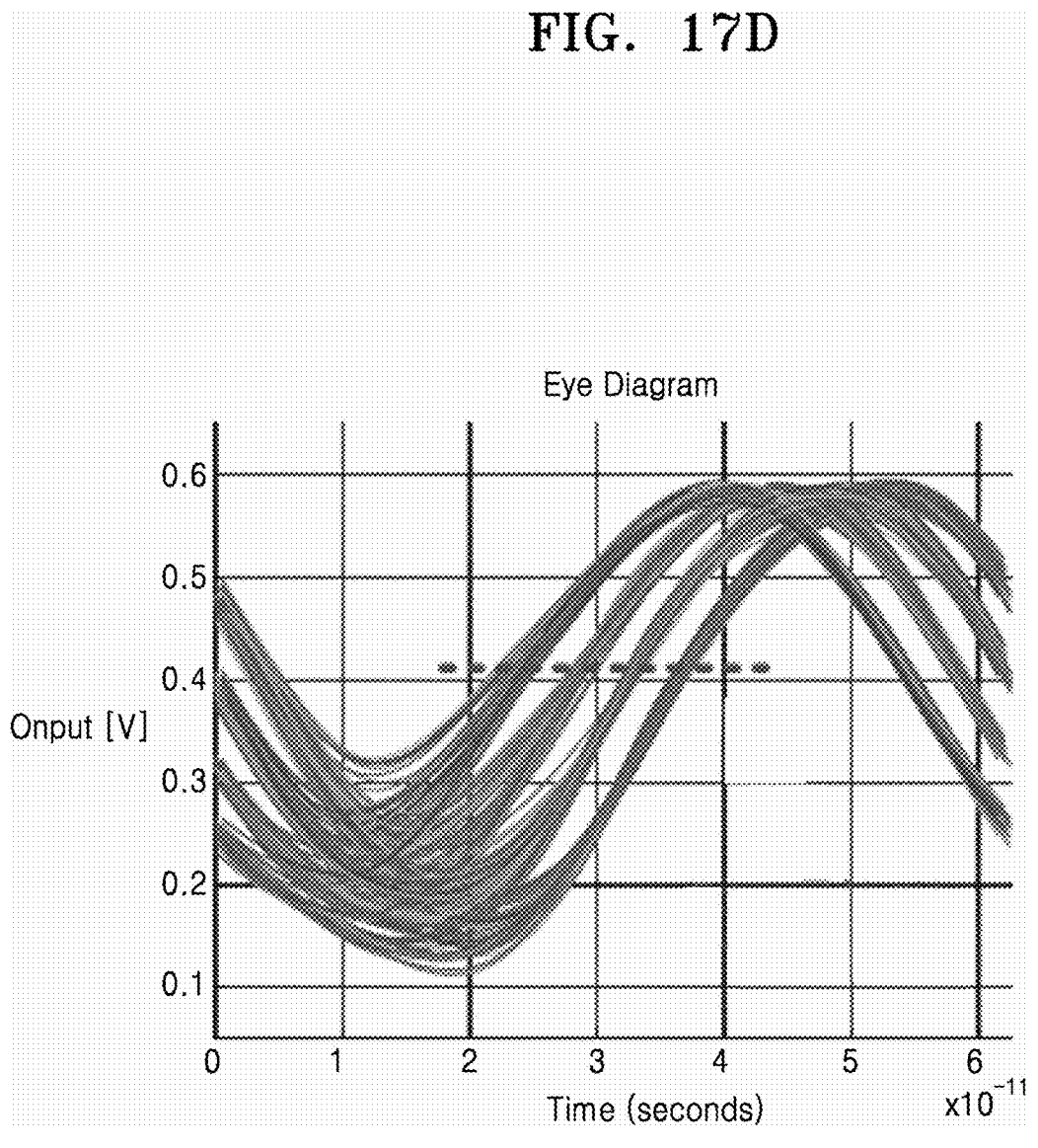

FIGS. 17A and 17B are eye diagrams of a PAM4 signal and FIGS. 17C and 17D are eye diagrams of a data pulse signal according to an embodiment.

FIG. 17A is an eye diagram of a PAM4 signal before passing through a channel having a channel characteristic of −12 dB at 16 GHZ, and FIG. 17B is an eye diagram of a PAM4 signal after passing through the same channel. FIG. 17C is an eye diagram of a data pulse signal before passing through the same channel, and FIG. 17D is an eye diagram of a data pulse signal after passing through the same channel.

Comparing FIGS. 17B and 17D, it is determined that a reduction of an eye caused by channel attenuation is low when a data pulse signal is transmitted to a data transmission circuit system of the disclosure compared to when a PAM4 signal is transmitted. Accordingly, it is determined that the data transmission circuit system of the disclosure is able to transmit data with high signal reliability and a low bit error rate.

Figure 18A:
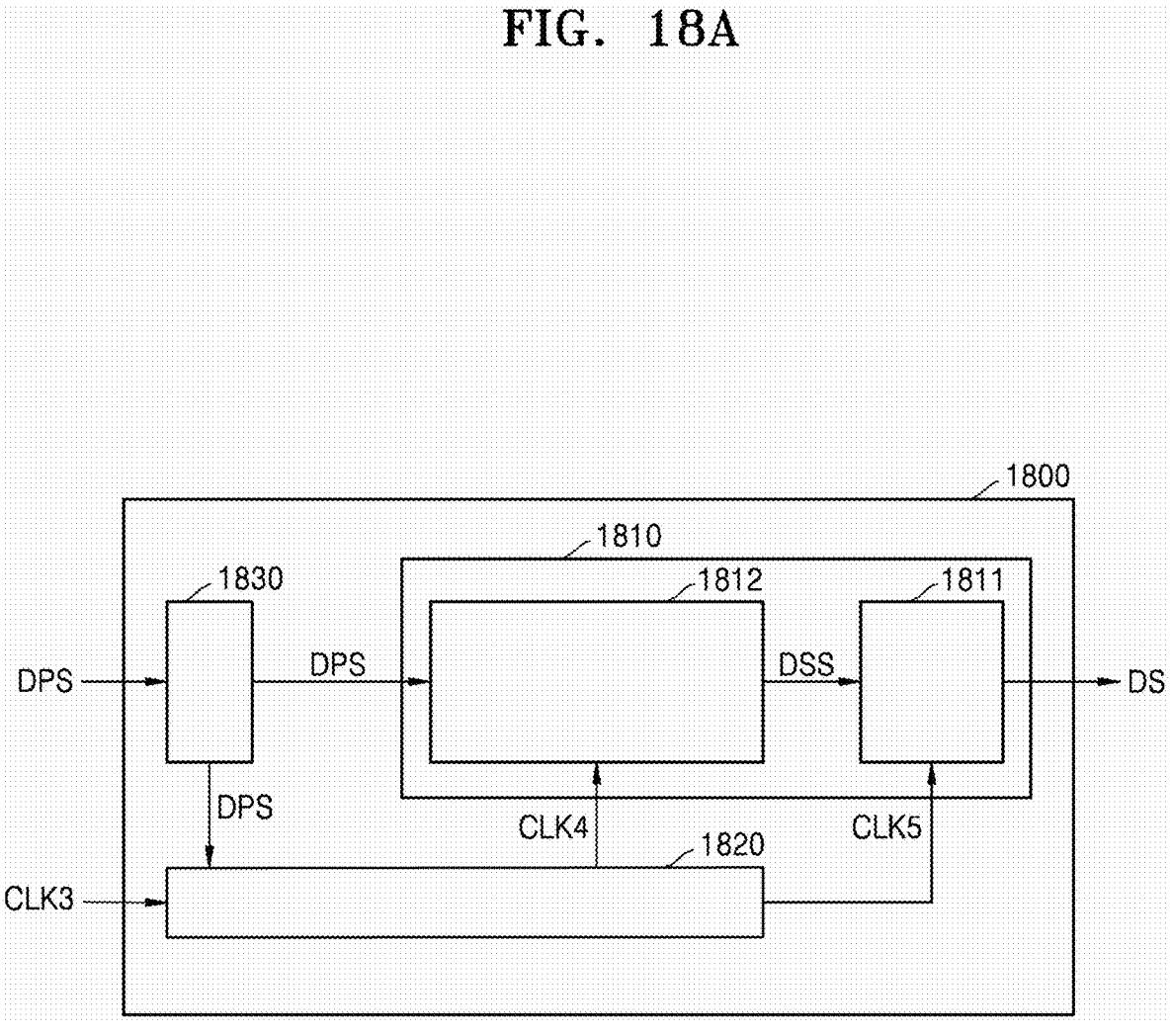
FIG. 18A is a block diagram of a data reception circuit system according to an embodiment.

FIG. 18A is a block diagram of a data reception circuit system 1800 according to an embodiment.

The data reception circuit system 1800 according to an embodiment includes a digital signal generation circuit 1810, a clock recovery circuit 1820, and a reception interface circuit 1830. The digital signal generation circuit 1810 includes a parallelization circuit 1811 and a time-digital conversion circuit 1812.

The reception interface circuit 1830 may receive the data pulse signal DPS that has passed through a channel.

The clock recovery circuit 1820 may generate clock signals CLK4 and CLK5 required for an operation of the data reception circuit system 1800, based on the forward clock signal CLK3. The forward clock signal CLK3 may be a clock signal forwarded together with the data pulse signal DPS from a data transmission circuit system.

The clock recovery circuit 1820 may generate the clock signals CLK4 and CLK5 by delaying the forward clock signal CLK3 or changing a frequency of the forward clock signal CLK3. In this regard, the clock recovery circuit 1820 may include at least one of a frequency divider, a frequency multiplier, a frequency converter, or a delay circuit.

The time-digital conversion circuit 1812 may generate the digital stream signal DSS corresponding to the data pulse signal DPS, based on the recovered clock pulse signal CLK4. The time-digital conversion circuit 1812 may generate the digital stream signal DSS by outputting a digital value corresponding to a time level determined by a time difference between a rising edge (or a falling edge) of the recovered clock pulse signal CLK4 and a rising edge (or a falling edge) of the data pulse signal DPS. For example, when the time difference between the rising edge of the recovered clock pulse signal CLK4 and the rising edge of the data pulse signal DPS indicates a fourth time level, the time-digital conversion circuit 1812 may generate the digital stream signal DSS of "11".

The time-digital conversion circuit 1812 may be implemented through various designs, and for example, the time-digital conversion circuit 1812 may include a time-to-digital converter (TDC).

The time-digital conversion circuit 1812 may supply, to the parallelization circuit 1811, the digital stream signal DSS distributed according to the number of bits per symbol.

Figure 18B:
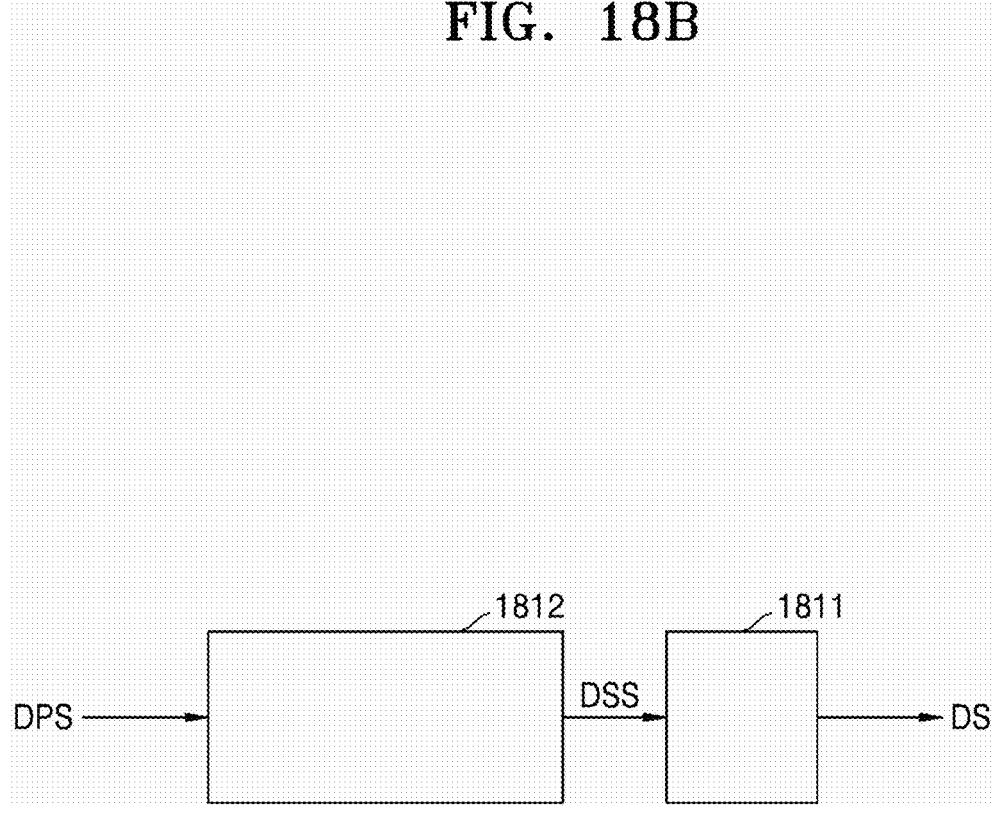
FIGS. 18B to 18D are diagrams for describing a digital stream signal supplied by a time-digital conversion circuit to a parallelization circuit, according to embodiments.

Referring to FIG. 18B, when the number of bits per symbol is 1, the time-digital conversion circuit 1812 may supply, to the parallelization circuit 1811, the digital stream signal DSS of 1 bit per symbol.

Figure 18C:
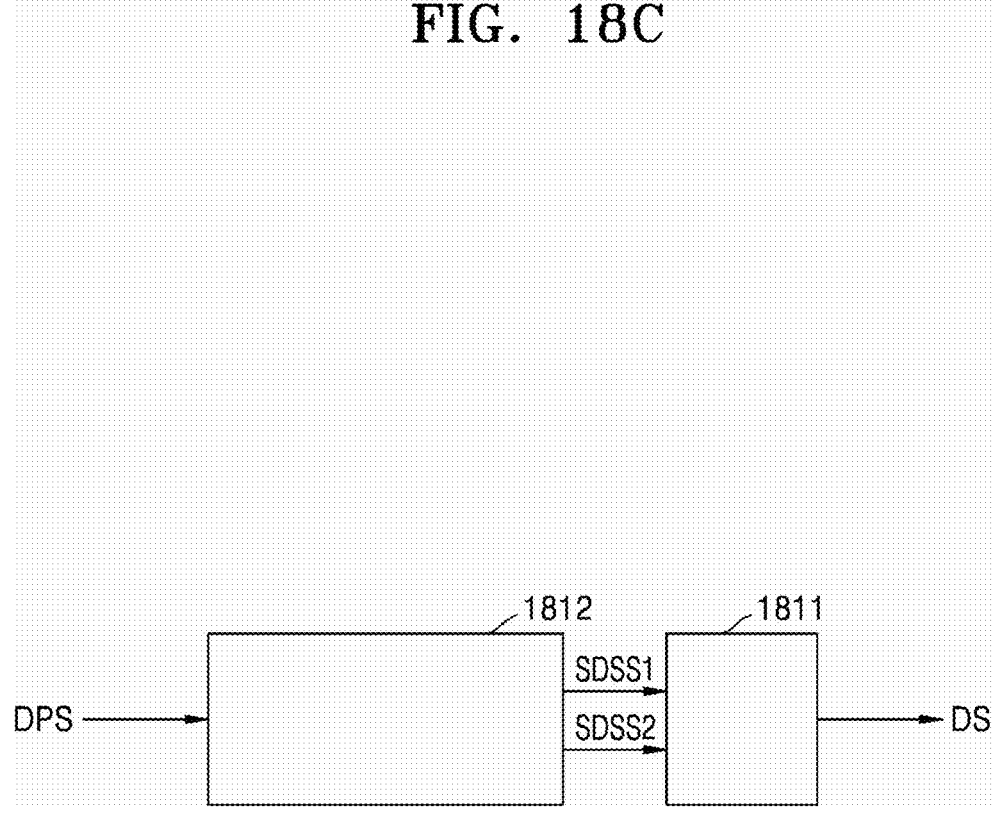

Referring to FIG. 18C, when the number of bits per symbol is 2, the time-digital conversion circuit 1812 may supply, to the parallelization circuit 1811, the digital stream signal DSS of 2 bits including 1 bit of the first sub-digital stream signal SDSS1 and 1 bit of the second sub-digital stream signal SDSS2, per symbol.

Figure 18D:
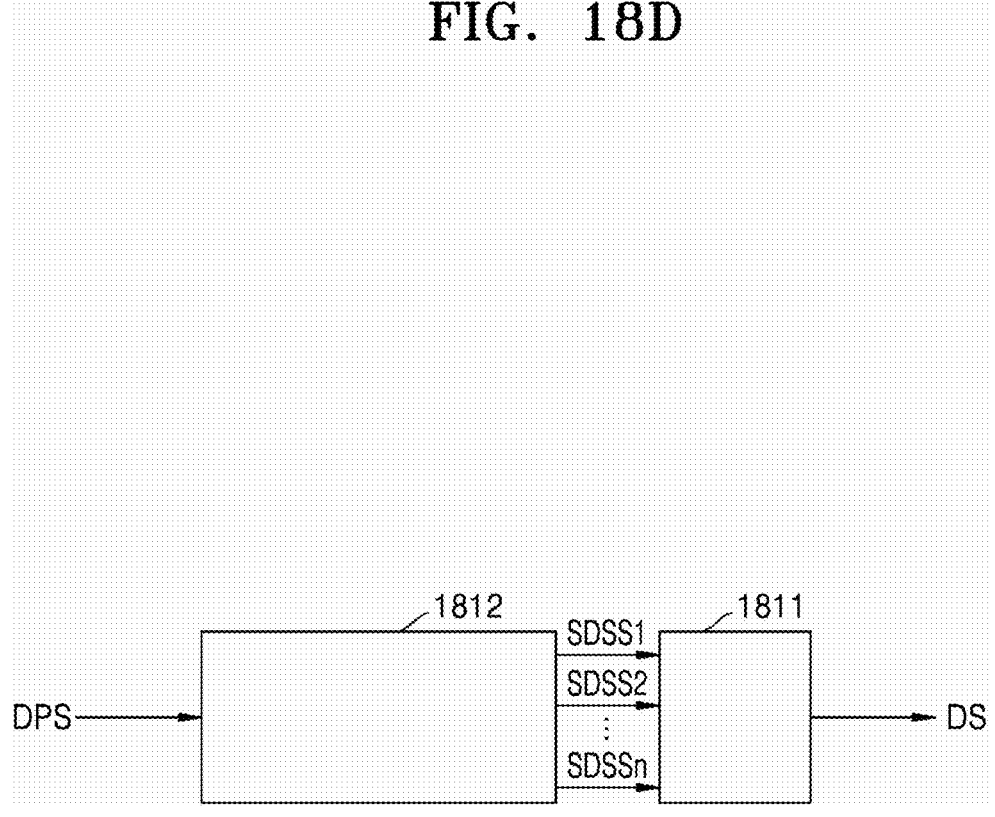

Referring to FIG. 18D, when the number of bits per symbol is n, the time-digital conversion circuit 1812 may supply, to the parallelization circuit 1811, the digital stream signal DSS of n bits including 1 bit of each of the first to (n)th sub-digital stream signals SDSS1 to SDSSn, per symbol.

Referring back to FIG. 18A, the parallelization circuit 1811 may generate the digital signal DS by receiving the digital stream signal DSS from the time-digital conversion circuit 1812 and parallelizing the digital stream signal DSS.

Figure 19A:
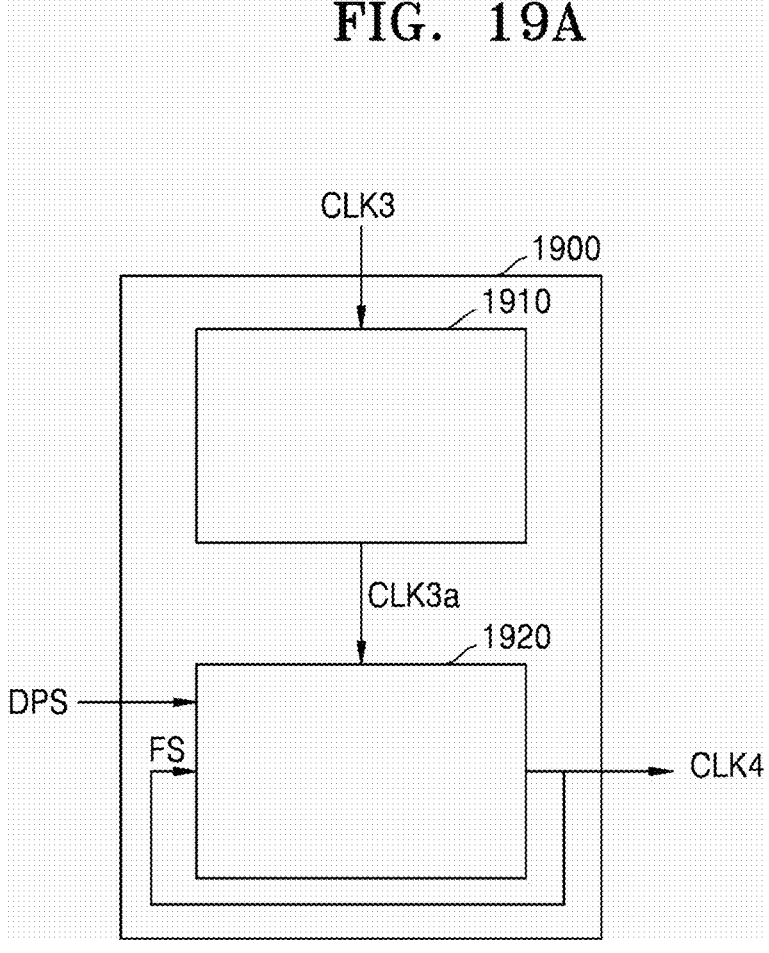
FIG. 19A is a diagram for describing a clock recovery circuit according to an embodiment.

FIG. 19A is a diagram for describing a clock recovery circuit 1900 according to an embodiment.

Pulses of the data pulse signal DPS may have time levels determined by an encoded digital signal. To decode a digital signal from the data pulse signal DPS, a base time level for determining the time levels of the pulses of the data pulse signal DPS needs to be provided. In this regard, the clock recovery circuit 1900 may generate the recovered clock pulse signal CLK4 with the base time level.

According to an embodiment, the clock recovery circuit 1900 may include a frequency converter 1910 and a delay locked loop circuit 1920.

When frequencies of the data pulse signal DPS and the forward clock signal CLK3 are not the same, the frequency converter 1910 may convert the frequency of the forward clock signal CLK3 into the frequency of the data pulse signal DPS. When the frequencies of the data pulse signal DPS and the forward clock signal CLK3 are the same, the clock recovery circuit 1900 may not include the frequency converter 1910.

The delay locked loop circuit 1920 may generate the recovered clock pulse signal CLK4 by delaying the forward clock signal CLK3 (or a frequency-converted forward clock signal CLK3a), based on the data pulse signal DPS. Embodiments of an operating mechanism of the delay locked loop circuit 1920 will be described with reference to FIG. 19B.

Figure 19B:
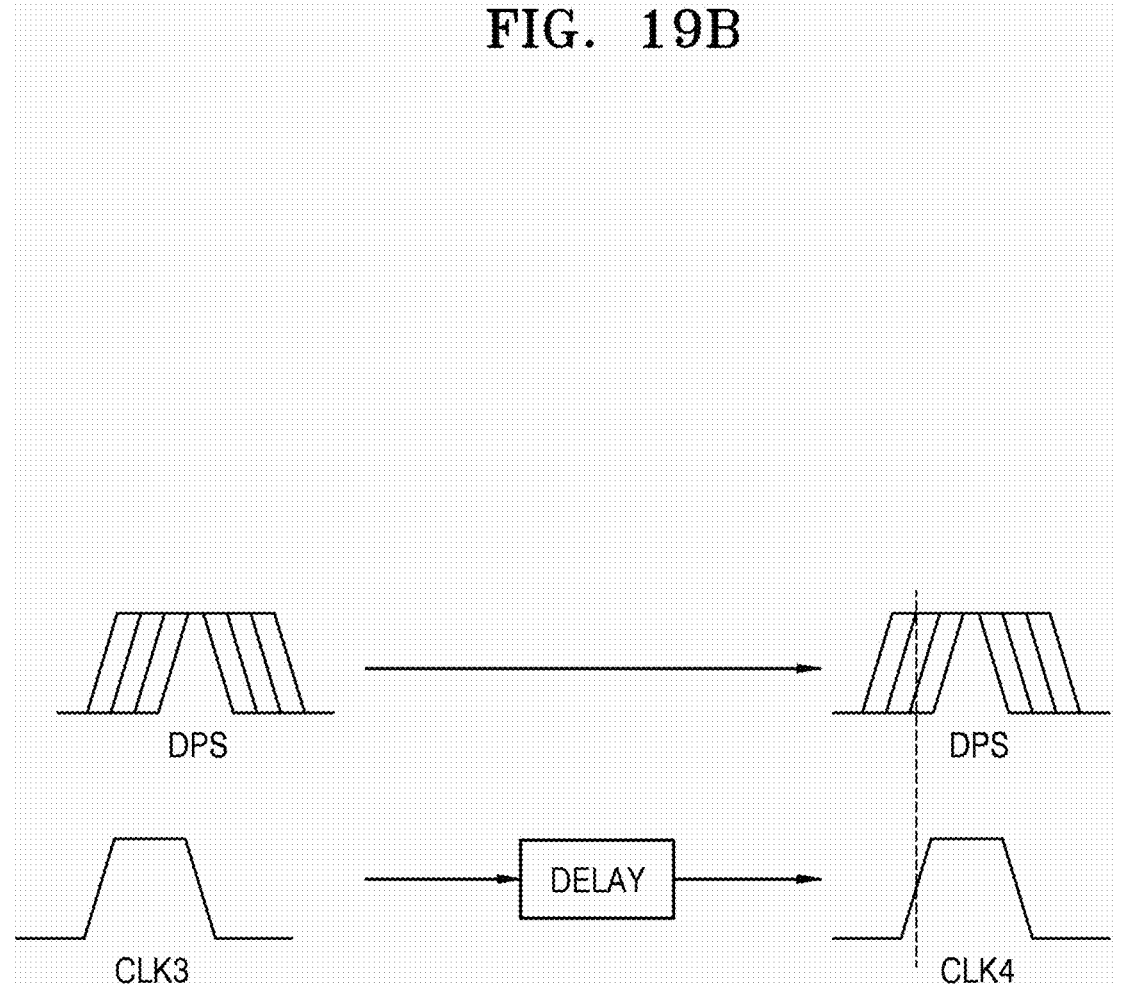
FIG. 19B is a schematic diagram of a mechanism for generating a recovered clock pulse signal, according to an embodiment.

FIG. 19B is a schematic diagram of a mechanism for generating a recovered clock pulse signal, according to an embodiment.

A mechanism for generating a recovered clock pulse signal, according to an embodiment, will be described with reference to FIGS. 19A and 19B. The clock recovery circuit 1900 may generate the recovered clock pulse signal CLK4, based on a phase difference between the forward clock signal CLK3 and the data pulse signal DPS. The delay locked loop circuit 1920 may generate the recovered clock pulse signal CLK4 by delaying the forward clock signal CLK3 such that an error signal generated based on the phase difference between the forward clock signal CLK3 and the data pulse signal DPS is stabilized.

Figure 20A:
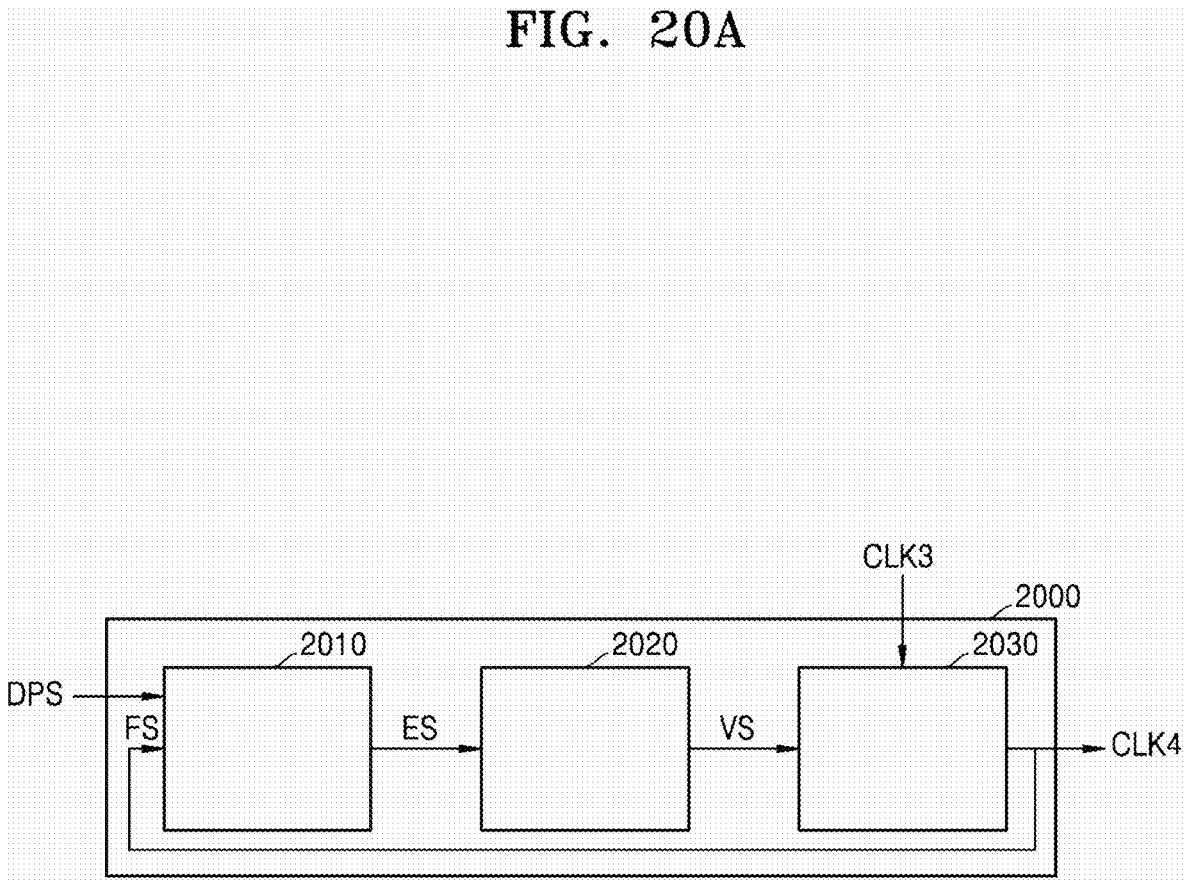
FIG. 20A is a block diagram of a delay locked loop circuit according to an embodiment.
Figure 20B:
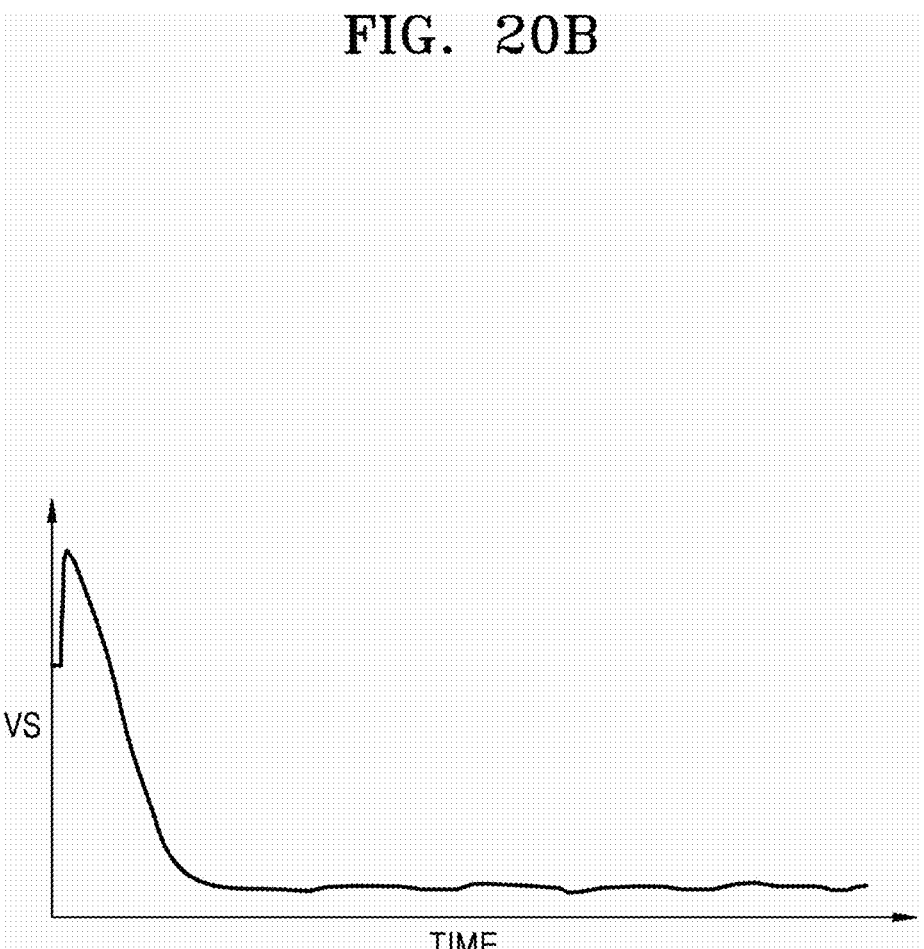
FIG. 20B is a graph of a voltage signal according to an embodiment.

FIG. 20A is a block diagram of a delay locked loop circuit 2000 according to an embodiment.

The delay locked loop circuit 2000 according to an embodiment includes a phase comparison circuit 2010, a charge pump circuit 2020, and a voltage controlled delay circuit 2030. The delay locked loop circuit 2000 may include a feedback loop in which the recovered clock pulse signal CLK4 (i.e., the forward clock signal CLK3 that has passed through the voltage controlled delay circuit 2030) is fed back.

The phase comparison circuit 2010 may generate an error signal ES, based on a phase difference between a feedback signal FS (i.e., the recovered clock pulse signal CLK4) and the data pulse signal DPS. The error signal ES may be a pulse signal and a duty cycle of the error signal ES may be determined by the phase difference between the feedback signal FS and the data pulse signal DPS. The phase comparison circuit 2010 may be implemented through various designs, and for example, the phase comparison circuit 2010 may include a phase frequency detector (PFD).

The charge pump circuit 2020 may output a voltage signal VS determined according to the duty cycle of the error signal ES. The charge pump circuit 2020 may be configured such that an output terminal is connected to a first node of a first voltage when the error signal ES is in a high state and the output terminal is connected to a second node of a second voltage when the error signal ES is in a low state. When the feedback loop is repeated in the delay locked loop circuit 2000, the voltage signal VS may converge as the duty cycle of the error signal ES converges to a pre-determined value (e.g., 50%). In other words, when the feedback loop is repeated in the delay locked loop circuit 2000, the error signal ES and the voltage signal VS may be stabilized. FIG.

20B is a graph of the voltage signal VS converged within about 50 ns, according to an embodiment.

The voltage controlled delay circuit 2030 may generate the recovered clock pulse signal CLK4 by delaying the forward clock signal CLK3 according to the voltage signal VS. When the voltage signal VS is converged, a delay may be locked and the recovered clock pulse signal CLK4 with a base time level may be generated. The voltage controlled delay circuit 2030 may be designed through various designs, and for example, the voltage controlled delay circuit 2030 may include a voltage controlled delay line (VCDL).

Figure 20C:
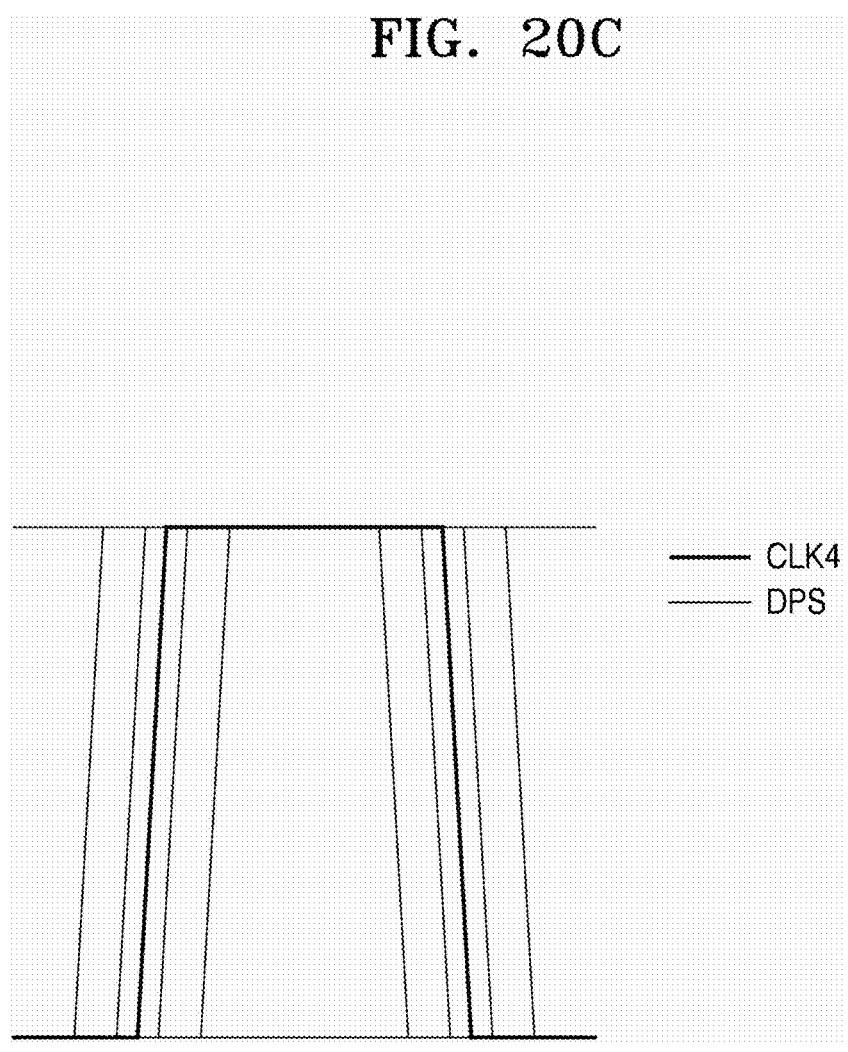
FIG. 20C is a schematic eye diagram of a recovered clock pulse signal and a data pulse signal, according to an embodiment.

FIG. 20C is a schematic eye diagram of the recovered clock pulse signal CLK4 and the data pulse signal DPS, according to an embodiment.

Referring to FIGS. 19B and 20C, according to an embodiment, when the feedback loop converges, the recovered clock pulse signal CLK4 is locked to an average timepoint of time levels of the data pulse signal DPS. In detail, a rising edge of the recovered clock pulse signal CLK4 is locked to an average timepoint of rising-time levels of the data pulse signal DPS, and a falling edge of the recovered clock pulse signal CLK4 is locked to an average timepoint of falling-time levels of the data pulse signal DPS.

Figure 21A:
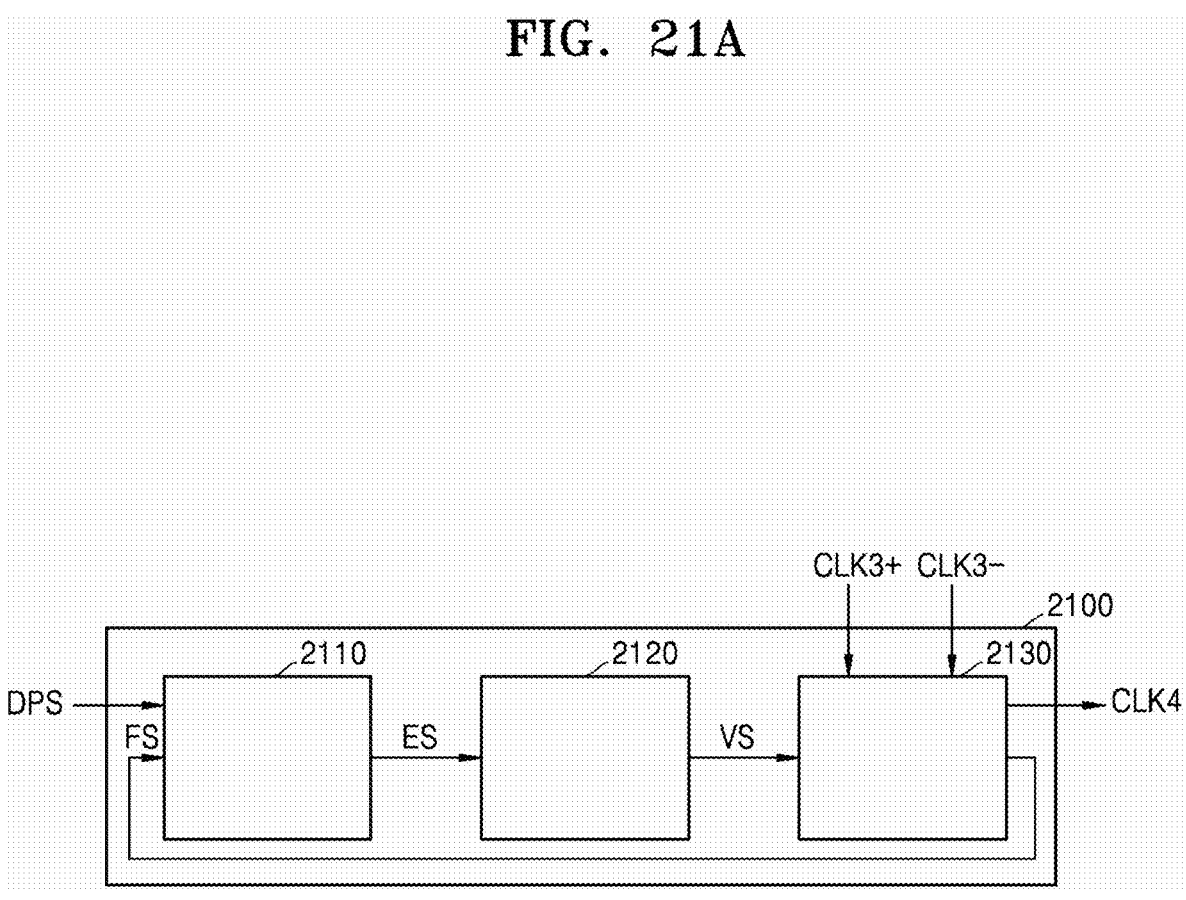
FIG. 21A is a block diagram of a delay locked loop circuit according to an embodiment.

FIG. 21A is a block diagram of a delay locked loop circuit 2100 according to an embodiment.

The delay locked loop circuit 2100 according to an embodiment includes a phase comparison circuit 2110, a charge pump circuit 2120, and a voltage controlled delay circuit 2130. The delay locked loop circuit may include a feedback loop in which a forward clock signal CLK3+ that has passed through the voltage controlled delay circuit 2130 is fed back. Descriptions of embodiments apply to the delay locked loop circuit 2100 of FIG. 21A. Thus, redundant descriptions are omitted.

The phase comparison circuit 2110 may generate the error signal ES, based on a phase difference between the feedback signal FS (i.e., the forward clock signal CLK3+ that has passed through the voltage controlled delay circuit 2130) and the data pulse signal DPS.

The charge pump circuit 2120 may generate the voltage signal VS, based on the error signal ES. The voltage signal VS may be supplied to the voltage controlled delay circuit 2130.

The voltage controlled delay circuit 2130 may receive the forward clock signal CLK3+ and a phase-inverted forward clock signal CLK3− of 180 degrees. The voltage controlled delay circuit 2130 may generate the feedback signal FS by delaying the forward clock signal CLK3+ according to the voltage signal VS. Also, the voltage controlled delay circuit 2130 may generate the recovered clock pulse signal CLK4 by delaying the phase-inverted forward clock signal CLK3—according to the voltage signal VS.

Figure 21B:
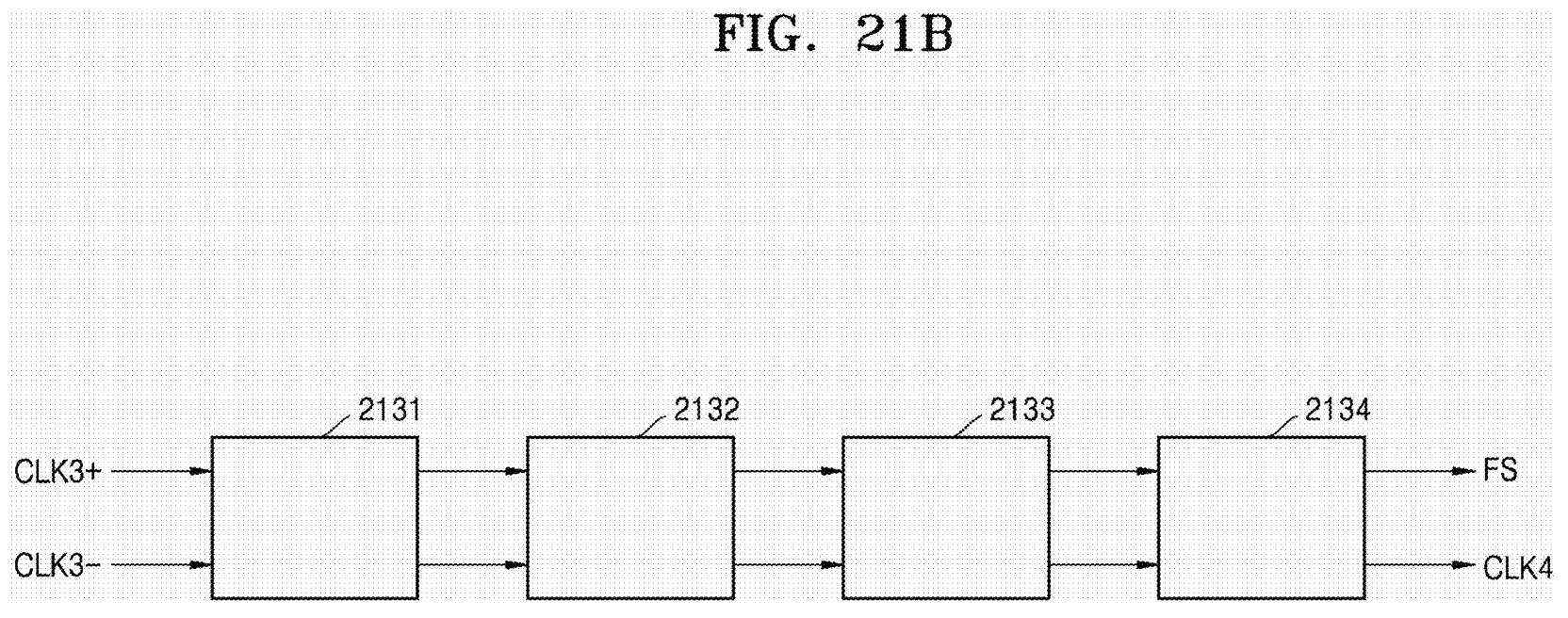

FIG. 21B is a block diagram of a VCDL according to an embodiment.

Referring to FIGS. 21A and 21B, the voltage controlled delay circuit 2130 may include a VCDL. According to an embodiment, the VCDL may include a first delay cell 2131, a second delay cell 2132, a third delay cell 2133, and a fourth delay cell 2134. Each of the first delay cell 2131, the second delay cell 2132, the third delay cell 2133, and the fourth delay cell 2134 may be configured to generate an output signal by delaying an input signal according to an input voltage.

The first delay cell 2131, the second delay cell 2132, the third delay cell 2133, and the fourth delay cell 2134 may generate the feedback signal FS by delaying the forward clock signal CLK3+. Also, the first delay cell 2131, the second delay cell 2132, the third delay cell 2133, and the fourth delay cell 2134 may generate the recovered clock pulse signal CLK4 by delaying the phase-inverted forward clock signal CLK3–.

According to an embodiment, the forward clock signal CLK3+ and the phase-inverted forward clock signal CLK3—may be delayed by the first delay cell 2131, the second delay cell 2132, the third delay cell 2133, and the fourth delay cell 2134 stepwise. A stepwise delay may allow a delay of the delay locked loop circuit 2100 to be quickly locked.

According to an embodiment, the first delay cell 2131, the second delay cell 2132, and the third delay cell 2133 may have a locked delay, and the fourth delay cell 2134 may have a delay controllable by the voltage signal VS. The locked delay reduces a range of delay to be actually controlled by the VCDL, and thus, a delay of the delay locked loop circuit 2100 may be quickly locked. On the other hand, when four delay cells all have controllable delays, a range of delay to be actually controlled by the VCDL is increased, and thus, it may be difficult to lock the delay of the delay locked loop circuit 2100 within a desired range.

According to an embodiment, the phase comparison circuit 2110 may receive, as the feedback signal FS, the phase-inverted forward clock signal CLK3—that has passed through the VCDL, and generate the error signal ES, based on the phase difference between the feedback signal FS and the data pulse signal DPS.

According to an embodiment, the voltage controlled delay circuit 2130 may have a reduced overall delay range for generating the recovered clock pulse signal CLK4 by using the forward clock signal CLK3+ and the phase-inverted forward clock signal CLK3—compared to using only the forward clock signal CLK3+. Accordingly, the delay of the delay locked loop circuit 2100 may be quickly locked.

Figure 22A:
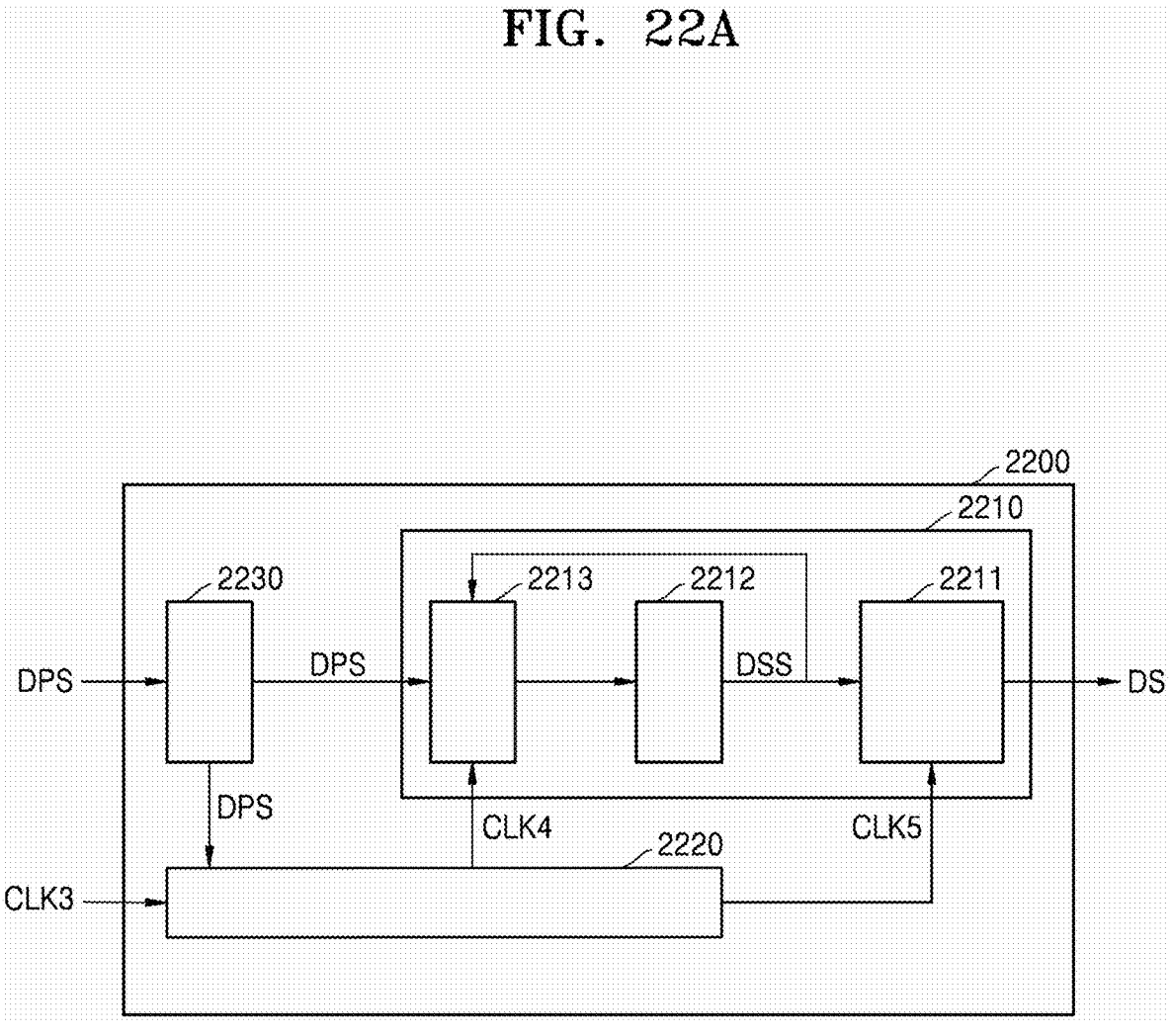
FIG. 22A is a block diagram of a data reception circuit system according to an embodiment.

FIG. 22A is a block diagram of a data reception circuit system 2200 according to an embodiment.

The data reception circuit system 2200 according to an embodiment includes a digital signal generation circuit 2210, a clock recovery circuit 2220, and a reception interface circuit 2230. The digital signal generation circuit 2210 includes a parallelization circuit 2211, a time-digital conversion circuit 2212, and an equalization circuit 2213. Descriptions of embodiments apply to the data reception circuit system 2200 of FIG. 22A. Thus, redundant descriptions are omitted.

ISI and jitter may affect edges of the recovered clock pulse signal CLK4 and data pulse signal DPS, thereby affecting reliability of a time level. To reduce an effect of ISI and jitter on a time level, the data reception circuit system 2200 according to an embodiment may include the equalization circuit 2213 configured to perform equalization on the recovered clock pulse signal CLK4 and the data pulse signal DPS, based on a value of the digital stream signal DSS.

The equalization circuit 2213 may receive a value of the digital stream signal DSS of a previous symbol and perform equalization on the recovered clock pulse signal CLK4 and data pulse signal DPS of a current symbol according to the value of the digital stream signal DSS of the previous symbol. The equalization may be performed by delaying the recovered clock pulse signal CLK4 or the data pulse signal DPS according to a weight.

When the equalization circuit 2213 delays the recovered clock pulse signal CLK4, the time-digital conversion circuit 2212 may receive, from the equalization circuit 2213, the delayed recovered clock pulse signal CLK4 and the data pulse signal DPS, and generate the digital stream signal DSS corresponding to a time level determined by the delayed recovered clock pulse signal CLK4 and the data pulse signal DPS. Alternatively, when the equalization circuit 2213 delays the data pulse signal DPS, the time-digital conversion circuit 2212 may receive, from the equalization circuit 2213, the recovered clock pulse signal CLK4 and the delayed data pulse signal DPS, and generate the digital stream signal DSS corresponding to a time level determined by the recovered clock pulse signal CLK4 and the delayed data pulse signal DPS.

The equalization circuit 2213 according to an embodiment may delay one of the recovered clock pulse signal CLK4 and data pulse signal DPS of the current symbol by using a weight corresponding to the value of the digital stream signal DSS of the previous symbol. For example, when the number of bits per symbol is 2, four weights respectively corresponding to "00", "01", "10", and "11" may be used. For example, when the digital stream signal DSS of the previous symbol is "10", the equalization circuit 2213 may delay the recovered clock pulse signal CLK4 or data pulse signal DPS of the current symbol by using the weight corresponding to "10".

Figure 22B:
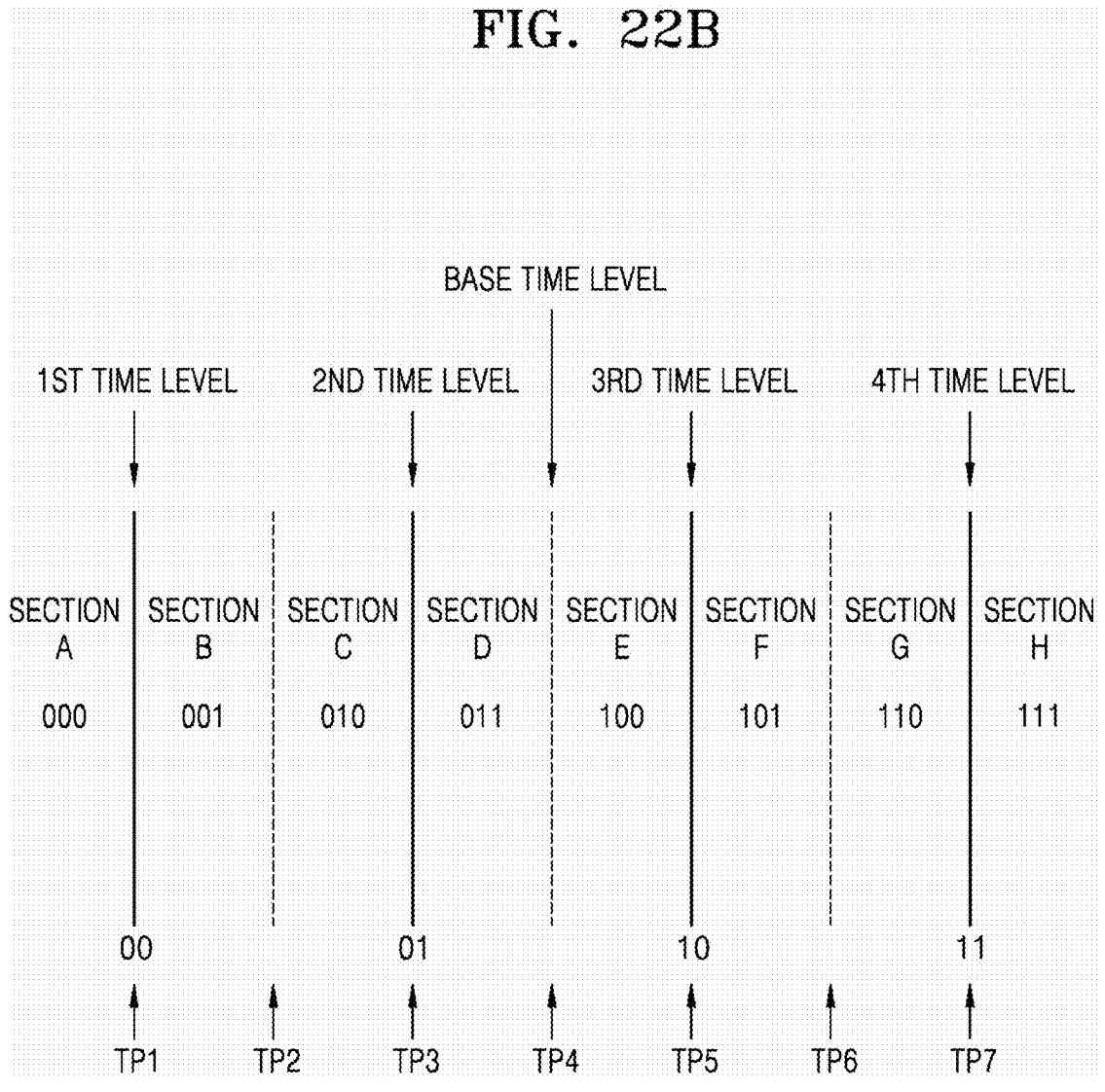
FIG. 22B is a diagram for describing operations of a time-digital conversion circuit and an equalization circuit, according to an embodiment.

FIG. 22B is a diagram for describing operations of a time-digital conversion circuit and an equalization circuit, according to an embodiment.

Referring to FIGS. 22A and 22B, according to an embodiment, the time-digital conversion circuit 2212 may determine a time level based on a time difference between a rising edge (or a falling edge) of the recovered clock pulse signal CLK4 and a rising edge (or a falling edge) of the data pulse signal DPS, and generate a digital value corresponding to the time level.

An embodiment in which the rising edge of the data pulse signal DPS is located at a first timepoint TP1 will be described. The initial location of the rising edge of the recovered clock pulse signal CLK4 may be a fourth timepoint TP4. The time-digital conversion circuit 2212 may determine that the rising edge of the recovered clock pulse signal CLK4 at the fourth timepoint TP4 is after a rising edge of the data pulse signal DPS at the first timepoint TP1, and delay the data pulse signal DPS up to a third timepoint TP3. Then, the time-digital conversion circuit 2212 may determine that the rising edge of the recovered clock pulse signal CLK4 at the fourth timepoint TP4 is after the rising edge of the data pulse signal DPS at the third timepoint TP3, and determine a time level corresponding to the rising edge of the data pulse signal DPS as a first time level.

An embodiment in which the rising edge of the data pulse signal DPS is located at a fifth timepoint TP5 will be described. The initial location of the rising edge of the recovered clock pulse signal CLK4 may be a fourth timepoint TP4. The time-digital conversion circuit 2212 may determine that the rising edge of the recovered clock pulse signal CLK4 at the fourth timepoint TP4 is before the rising edge of the data pulse signal DPS at the fifth timepoint TP5, and delay the recovered clock pulse signal CLK4 up to a sixth timepoint TP6. The time-digital conversion circuit 2212 may determine that the rising edge of the recovered clock pulse signal CLK4 at the sixth timepoint TP6 is after the rising edge of the data pulse signal DPS at the fifth timepoint TP5, and determine a time level corresponding to the rising edge of the data pulse signal DPS as a third time level.

The rising edge of the recovered clock pulse signal CLK4 may deviate from the fourth timepoint TP4 and the rising edge of the data pulse signal DPS may deviate from the first, third, fifth, and seventh timepoints TP1, TP3, TP5, and TP7, due to ISI or jitter. In this case, the equalization circuit 2213 may reduce effects of the ISI and jitter by delaying the recovered clock pulse signal CLK4 or the data pulse signal DPS.

According to an embodiment, when the rising edge of the data pulse signal DPS is located in a section A, C, E, or G, the equalization circuit 2213 may delay the data pulse signal DPS such that the rising edge of the data pulse signal DPS is located at the first, third, fifth, or seventh timepoints TP1, TP3, TP5, or TP7. According to an embodiment, when the rising edge of the data pulse signal DPS is located in a section B, D, F, or H, the equalization circuit 2213 may delay the recovered clock pulse signal CLK4 such that the rising edge of the data pulse signal DPS is located at the first, third, fifth, or seventh timepoints TP1, TP3, TP5, or TP7.

According to an embodiment, the time-digital conversion circuit 2212 may be configured to have resolution greater than the number of bits per symbol by 1 bit. The equalization circuit 2213 may determine a weight for equalization by using the last bit of the time-digital conversion circuit 2212. For example, when the number of bits per symbol is 2, the time-digital conversion circuit 2212 may have resolution of 3 bits. In this case, first and second bits of the time-digital conversion circuit 2212 may be used to decode the digital signal DS, and a third bit thereof may be used for equalization of the equalization circuit 2213.

An embodiment of the equalization circuit 2213 configured to perform equalization by using the time-digital conversion circuit 2212 having resolution of 3 bits when the number of bits per symbol is 2 will be described. Output for the sections A to H of the time-digital conversion circuit 2212 are respectively "000", "001", "010", "011", "100", "101", "110", and "111". When the rising edge of the data pulse signal DPS is located at the section A, C, E, or G, the third bit of the time-digital conversion circuit 2212 is "0", and when the rising edge of the data pulse signal DPS is located at the section B, D, F, or H, the third bit of the time-digital conversion circuit 2212 is "1".

When the rising edges of the data pulse signal DPS are biased towards the section A, C, E, or G on average due to ISI or jitter, the third bit of the time-digital conversion circuit 2212 may be mainly "0". On the other hand, when the rising edges of the data pulse signal DPS are biased towards the section B, D, F, or H on average, the third bit of the time-digital conversion circuit 2212 may be mainly "1".

According to an embodiment, the equalization circuit 2213 may delay the recovered clock pulse signal CLK4 or the data pulse signal DPS, based on values of the third bit of the time-digital conversion circuit 2212, which are observed during certain sections. When the number of "0"s is greater than the number of "1"s in the values of the third bit during the certain sections, the equalization circuit 2213 may delay the data pulse signal DPS. Alternatively, when the number of "1"s is greater than the number of "0"s in the values of the third bit during the certain sections, the equalization circuit 2213 may delay the recovered clock pulse signal CLK4.

According to an embodiment, the equalization circuit 2213 may determine the weight, based on a least mean square (LMS) algorithm that is an algorithm for reducing an error. According to an embodiment, the equalization circuit 2213 may determine the weight for delaying the recovered clock pulse signal CLK4 or the data pulse signal DPS, based on the values of the third bit of the time-digital conversion circuit 2212, which are observed during the certain sections. The equalization circuit 2213 may increase the weight as a difference between the number of "0"s and the number of "1"s increases among the values of the third bit during the certain sections. Accordingly, a delay amount for the equalization may increase. Alternatively, the equalization circuit 2213 may decrease the weight as the difference between the number of "0"s and the number of "1"s decreases among the values of the third bit during the certain sections. Accordingly, the delay amount for the equalization may decrease.

According to an embodiment, the equalization circuit 2213 may perform equalization on a current section by using a weight determined for a previous section. The previous section and the current section may include a pre-determined number of symbols. For example, the equalization circuit 2213 may perform equalization on next 100 symbols (i.e., the current section) by using a weight determined for 100 symbols (i.e., the previous section).

According to an embodiment, the equalization circuit 2213 may update the weight for each section. For example, the equalization circuit 2213 may update the weight by determining a weight, based on values of third bit of the time-digital conversion circuit 2212 of the previous section, and determining a new weight, based on values of third bit of the time-digital conversion circuit 2212 of the current section.

According to an embodiment, the equalization circuit 2213 may determine a weight for each time level, based on values of third bit of the time-digital conversion circuit 2212 for sections adjacent to each time level. For example, the equalization circuit 2213 may determine a weight for a first time level, based on values of third bit of the time-digital conversion circuit 2212 for the section A/B. Similarly, the equalization circuit 2213 may determine weights for second to fourth time levels, based on values of third bit of the time-digital conversion circuit 2212 for the section C/D, section E/F, and section G/H respectively. The equalization circuit 2213 may perform equalization on each time level by using the weight determined for each time level.

According to an embodiment, the equalization circuit 2213 may determine a weight for all time levels, based on values of third bit of the time-digital conversion circuit 2212 for sections adjacent to any one time level. For example, the equalization circuit 2213 may determine a weight, based on values of third bit of the time-digital conversion circuit 2212 for the sections A and B, and perform equalization on the first to fourth time levels by using the determined weight.

Figure 23A:
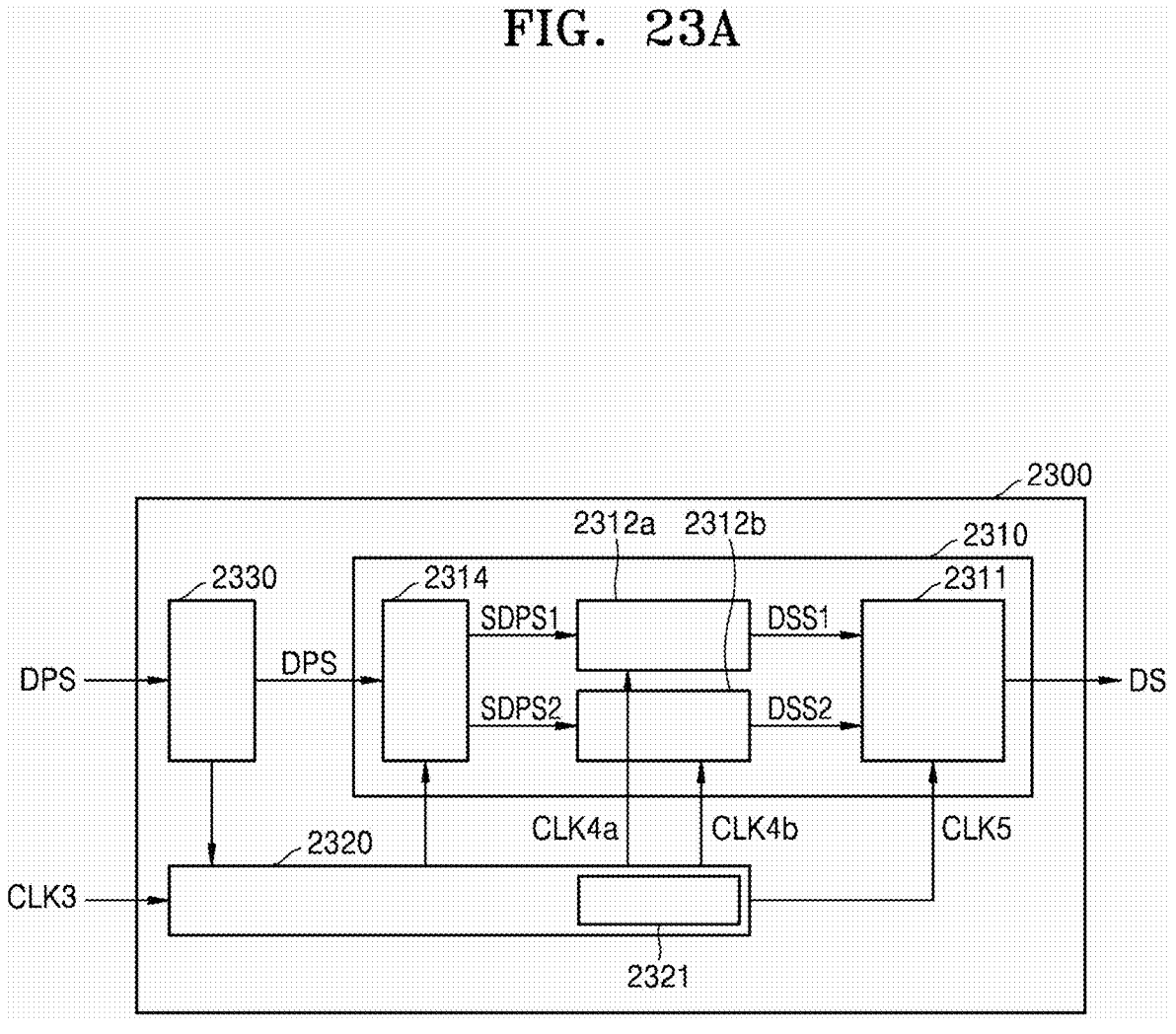
FIG. 23A is a block diagram of a data reception circuit system according to an embodiment.

FIG. 23A is a block diagram of a data reception circuit system 2300 according to an embodiment.

The data reception circuit system 2300 according to an embodiment includes a digital signal generation circuit 2310, a clock recovery circuit 2320, and a reception interface circuit 2330. The digital signal generation circuit 2310 includes a parallelization circuit 2311, a first time-digital conversion circuit 2312*a*, a second time-digital conversion circuit 2312*b*, and a data pulse separation circuit 2314. The clock recovery circuit 2320 includes a clock pulse separation circuit 2321. Descriptions of embodiments apply to the data reception circuit system 2300 of FIG. 23A. Thus, redundant descriptions are omitted.

The data reception circuit system 2300 according to an embodiment may generate the digital signal DS trough a time-interleaved operation. Time interleaving may be performed by using a first sub-clock pulse signal CLK4*a* and a second sub-clock pulse signal CLK4*b*, which are signals separated from the recovered clock pulse signal CLK4, and the first sub-data pulse signal SDPS1 and the second sub-data pulse signal SDPS2, which are signals separated from the data pulse signal DPS.

According to an embodiment, the clock pulse separation circuit 2321 may separate the recovered clock pulse signal CLK4 into the first sub-clock pulse signal CLK4*a* and the second sub-clock pulse signal CLK4*b* such that the first sub-clock pulse signal CLK4*a* and the second sub-clock pulse signal CLK4*b* alternately include pulses of the recovered clock pulse signal CLK4. The clock pulse separation circuit 2321 may supply the first sub-clock pulse signal CLK4*a* and the second sub-clock pulse signal CLK4*b* respectively to the first time-digital conversion circuit 2312*a* and the second time-digital conversion circuit 2312*b*.

According to an embodiment, the data pulse separation circuit 2314 may separate the data pulse signal DPS into the first sub-data pulse signal SDPS1 and the second sub-data pulse signal SDPS2 such that the first sub-data pulse signal SDPS1 and the second sub-data pulse signal SDPS2 alternately include pulses of the data pulse signal DPS. The data pulse separation circuit 2314 may supply the first sub-data pulse signal SDPS1 and the second sub-data pulse signal SDPS2 respectively to the first time-digital conversion circuit 2312*a* and the second time-digital conversion circuit 2312*b*.

The first sub-clock pulse signal CLK4*a* and the second sub-clock pulse signal CLK4*b* have different timings, and may be accordingly time-interleaved. Also, the first sub-data pulse signal SDPS1 and the second sub-data pulse signal SDPS2 have different timings, and may be accordingly time-interleaved.

According to an embodiment, the first time-digital conversion circuit 2312*a* may generate the first digital stream signal DSS1 corresponding to the first sub-data pulse signal SDPS1, based on the first sub-clock pulse signal CLK4*a*. In detail, the first time-digital conversion circuit 2312*a* may generate the first digital stream signal DSS1 corresponding to a rising-time level determined by a time difference between a rising edge of the first sub-clock pulse signal CLK4*a* and a rising edge of the first sub-data pulse signal SDPS1, and a falling-time level determined by a time difference between a falling edge of the first sub-clock pulse signal CLK4*a* and a falling edge of the first sub-data pulse signal SDPS1.

According to an embodiment, the second time-digital conversion circuit 2312*b* may generate the second digital stream signal DSS2 corresponding to the second sub-data pulse signal SDPS2, based on the second sub-data pulse signal SDPS2. In detail, the second time-digital conversion circuit 2312*b* may generate the second digital stream signal DSS2 corresponding to a rising-time level determined by a time difference between a rising edge of the second sub-clock pulse signal CLK4*b* and a rising edge of the second sub-data pulse signal SDPS2, and a falling-time level determined by a time difference between a falling edge of the second sub-clock pulse signal CLK4*b* and a falling edge of the second sub-data pulse signal SDPS2.

According to embodiments, a rising edge of an inverted sub-clock pulse signal and a rising edge of an inverted sub-data pulse signal may be used instead of a falling edge of a sub-clock pulse signal and a falling edge of a sub-data pulse signal.

According to an embodiment, the clock pulse separation circuit 2321 may generate an inverted first sub-clock pulse signal and an inverted second sub-clock pulse signal by inverting the first sub-clock pulse signal CLK4*a* and the second sub-clock pulse signal CLK4*b*. The clock pulse separation circuit 2321 may supply the inverted first sub-clock pulse signal and the inverted second sub-clock pulse signal respectively to the first time-digital conversion circuit 2312*a* and the second time-digital conversion circuit 2312*b*.

According to an embodiment, the data pulse separation circuit 2314 may generate an inverted first sub-data pulse signal and an inverted second sub-data pulse signal by inverting the first sub-data pulse signal SDPS1 and the second sub-data pulse signal SDPS2. The data pulse separation circuit 2314 may supply the inverted first sub-data pulse signal and the inverted second sub-data pulse signal respectively to the first time-digital conversion circuit 2312*a* and the second time-digital conversion circuit 2312*b*.

According to an embodiment, the first time-digital conversion circuit 2312*a* may generate the first digital stream signal DSS1 corresponding to the first sub-data pulse signal SDPS1 and the inverted first sub-data pulse signal, based on the first sub-clock pulse signal CLK4*a* and the inverted first sub-clock pulse signal. In detail, the first time-digital conversion circuit 2312*a* may generate the first digital stream signal DSS1 corresponding to a rising-time level determined by a time difference between a rising edge of the first sub-clock pulse signal CLK4*a* and a rising edge of the first sub-data pulse signal SDPS1, and a rising-time level determined by a time difference between a rising edge of the inverted first sub-clock pulse signal and a rising edge of the inverted first sub-data pulse signal.

According to an embodiment, the second time-digital conversion circuit 2312*b* may generate the second digital stream signal DSS2 corresponding to the second sub-data pulse signal SDPS2 and the inverted second sub-data pulse signal, based on the second sub-clock pulse signal CLK4*b* and the inverted second sub-clock pulse signal. In detail, the second time-digital conversion circuit 2312*b* may generate the second digital stream signal DSS2 corresponding to a rising-time level determined by a time difference between a rising edge of the second sub-clock pulse signal CLK4*b* and a rising edge of the second sub-data pulse signal SDPS2, and a rising-time level determined by a time difference between a rising edge of the inverted second sub-clock pulse signal and a rising edge of the inverted second sub-data pulse signal.

The parallelization circuit 2311 may generate the digital signal DS by merging and parallelizing the first digital stream signal DSS1 and the second digital stream signal DSS2.

Figure 23B:
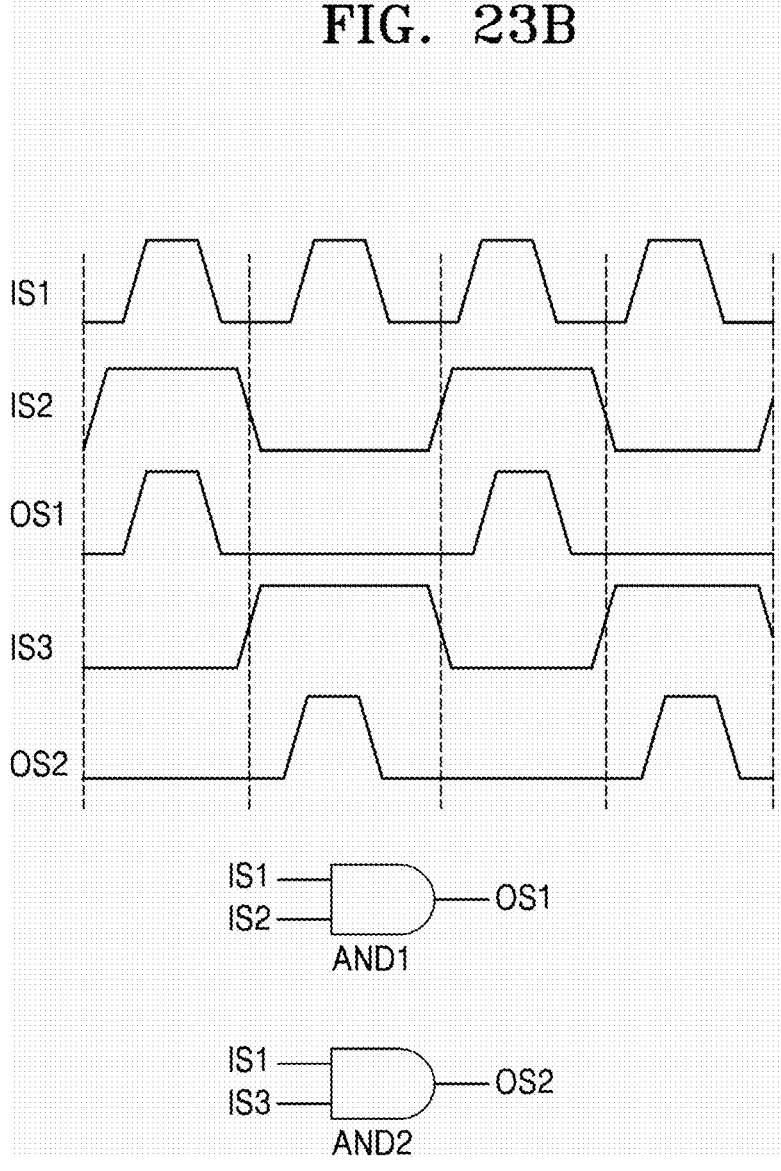
FIGS. 23B and 23C are diagrams for describing a clock pulse separation circuit and a data pulse separation circuit, according to embodiments.

FIG. 23B is a diagram for describing a clock pulse separation circuit and a data pulse separation circuit, according to an embodiment.

Referring to FIGS. 23A and 23B, the clock pulse separation circuit 2321 according to an embodiment may include a first AND gate AND1 and a second AND gate AND2. In the clock pulse separation circuit 2321, a first input signal IS1 of the first AND gate AND1 is the recovered clock pulse signal CLK4, a second input signal IS2 is a recovered clock pulse signal in which a frequency is reduced by ½, and a first output signal OS1 is the first sub-clock pulse signal CLK4*a*. In the clock pulse separation circuit 2321, a first input signal IS1 of the second AND gate AND2 is the recovered clock pulse signal CLK4, a third input signal IS3 is an inverted signal of the second input signal IS2, and a second output signal OS2 is the second sub-clock pulse signal CLK4*b*. The first sub-clock pulse signal CLK4*a* and the second sub-clock pulse signal CLK4*b* may alternately include pulses of the recovered clock pulse signal CLK4.

Similarly, the data pulse separation circuit 2314 according to an embodiment may include the first AND gate AND1 and the second AND gate AND2. In the data pulse separation circuit 2314, a first input signal IS1 of the first AND gate AND1 is the data pulse signal DPS, a second input signal IS2 is a recovered clock pulse signal in which a frequency is reduced by ½, and a first output signal OS1 is the first sub-data pulse signal SDPS1. In the data pulse separation circuit 2314, a first input signal IS1 of the second AND gate AND2 is the data pulse signal DPS, a third input signal IS3 is an inverted signal of the second input signal IS2, and a second output signal OS2 is the second sub-data pulse signal SDPS2. The first sub-data pulse signal SDPS1 and the second sub-data pulse signal SDPS2 may alternately include pulses of the data pulse signal DPS.

Figure 23C:
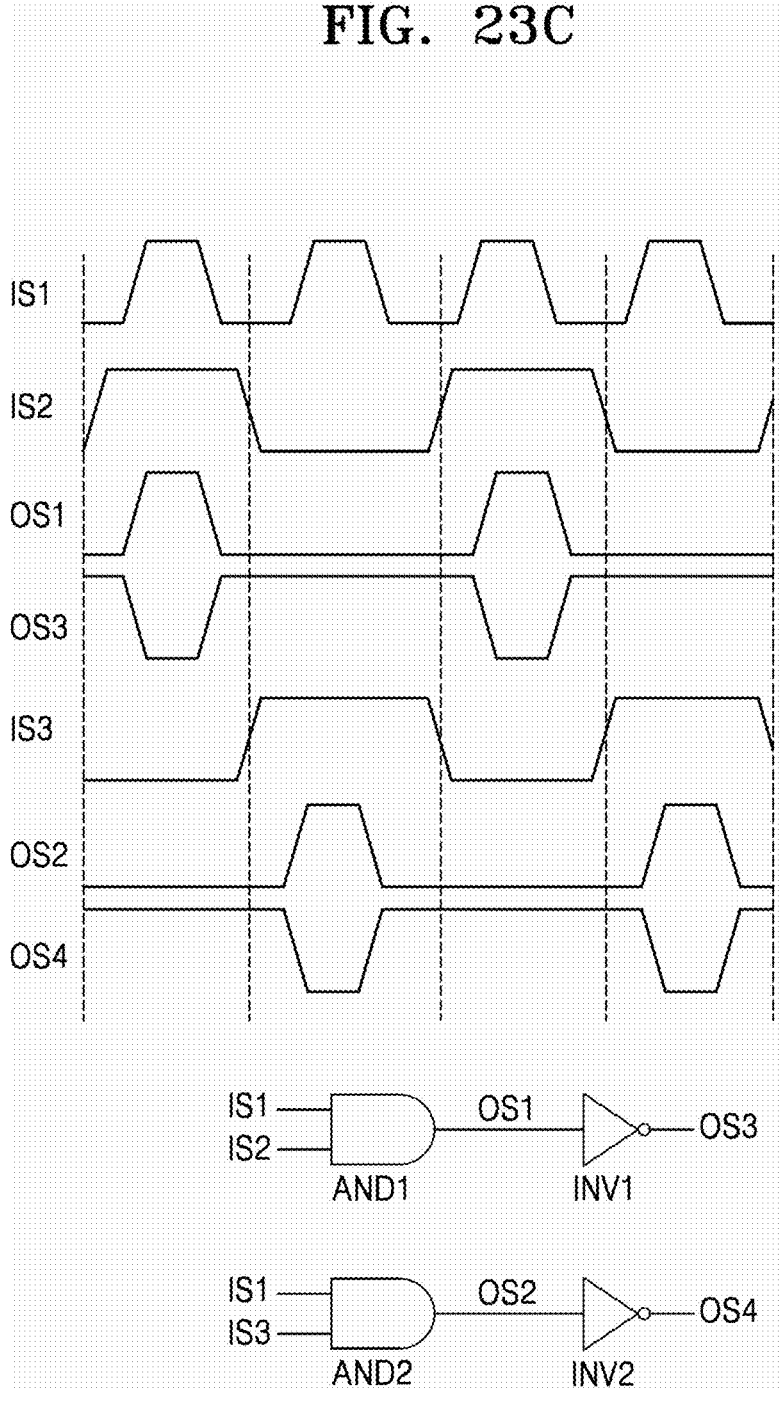

FIG. 23C is a diagram for describing a clock pulse separation circuit and a data pulse separation circuit, according to an embodiment.

Referring to FIGS. 23A and 23C, the clock pulse separation circuit 2321 according to an embodiment may include a first AND gate AND1, a second AND gate AND2, a first inverter INV1, and a second inverter INV2. In the clock pulse separation circuit 2321, a first input signal IS1 of the first AND gate AND1 is the recovered clock pulse signal CLK4, a second input signal IS2 is a recovered clock pulse signal in which a frequency is reduced by ½, a first output signal OS1 is the first sub-clock pulse signal CLK4$a$, and a third output signal OS3 is the inverted first sub-clock pulse signal. In the clock pulse separation circuit 2321, a first input signal IS1 of the second AND gate AND2 is the recovered clock pulse signal CLK4, a third input signal IS3 is an inverted signal of the second input signal IS2, a second output signal OS2 is the second sub-clock pulse signal CLK4$b$, and a fourth output signal OS4 is the inverted second sub-clock pulse signal.

Similarly, the data pulse separation circuit 2314 according to an embodiment may include the first AND gate AND1, the second AND gate AND2, the first inverter INV1, and the second inverter INV2. In the data pulse separation circuit 2314, a first input signal IS1 of the first AND gate AND1 is the data pulse signal DPS, a second input signal IS2 is a recovered clock pulse signal in which a frequency is reduced by ½, a first output signal OS1 is the first sub-data pulse signal SDPS1, and a third output signal OS3 is the inverted first sub-data pulse signal. In the data pulse separation circuit 2314, a first input signal IS1 of the second AND gate AND2 is the data pulse signal DPS, a third input signal IS3 is an inverted signal of the second input signal IS2, a second output signal OS2 is the second sub-data pulse signal SDPS2, and a fourth output signal OS4 is the inverted second sub-data pulse signal.

Figure 24A:
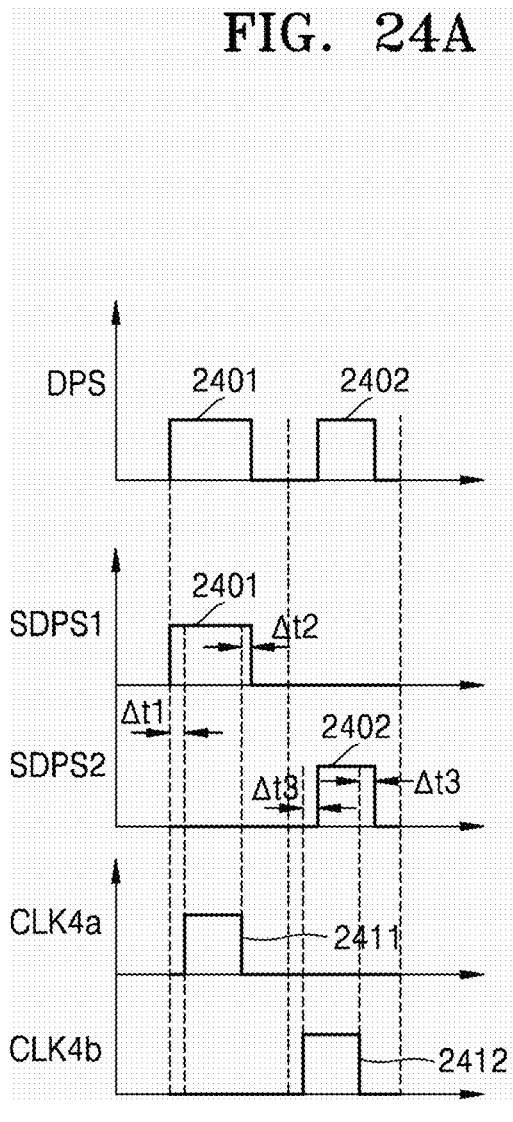
FIGS. 24A and 24B are diagrams for describing operations of a first time-digital conversion circuit and a second time-digital conversion circuit, according to embodiments.

FIG. 24A is a diagram for describing operations of a first time-digital conversion circuit and a second time-digital conversion circuit, according to an embodiment.

Operations of the first time-digital conversion circuit 2312$a$ and the second time-digital conversion circuit 2312$b$, according to an embodiment, will be described with reference to FIGS. 23A and 24A. According to an embodiment, the digital signal DS is encoded from a rising edge and a falling edge of the data pulse signal DPS. A base time level is located in an average timepoint of the first to fourth time levels (i.e., between a second time level and a third time level), a time difference between the first time level and the base time level is $\Delta t1$, a time difference between the third time level and the base time level is $\Delta t2$, and a time difference between the fourth time level and the base time level is $\Delta t3$.

According to an embodiment, the data pulse separation circuit 2314 generates the first sub-data pulse signal SDPS1 and the second sub-data pulse signal SDPS2 by separating pulses 2401 and 2402 of the data pulse signal DPS.

The first time-digital conversion circuit 2312$a$ determines a first rising-time level, based on a time difference ($\Delta t1$) between a rising edge of the pulse 2401 of the first sub-data pulse signal SDPS1 and a rising edge of a pulse 2411 of the first sub-clock pulse signal CLK4$a$, and generates a value of the first digital stream signal DSS1 corresponding to the first rising-time level. The first time-digital conversion circuit 2312$a$ determines a third falling-time level, based on a time difference ($\Delta t2$) between a falling edge of the pulse 2401 of the first sub-data pulse signal SDPS1 and a falling edge of a pulse 2411 of the first sub-clock pulse signal CLK4$a$, and generates a value of the first digital stream signal DSS1 corresponding to the third falling-time level.

Similarly, the second time-digital conversion circuit 2312$b$ determines a fourth rising-time level, based on a time difference ($\Delta t3$) between a rising edge of the pulse 2402 of the second sub-data pulse signal SDPS2 and a rising edge of a pulse 2412 of the second sub-clock pulse signal CLK4$b$, and generates a value of the second digital stream signal DSS2 corresponding to the fourth rising-time level. The second time-digital conversion circuit 2312$b$ determines a fourth falling-time level, based on a time difference ($\Delta t3$) between a falling edge of the pulse 2402 of the second sub-data pulse signal SDPS2 and a falling edge of a pulse 2412 of the second sub-clock pulse signal CLK4$b$, and generates a value of the second digital stream signal DSS2 corresponding to the fourth falling-time level.

Figure 24B:
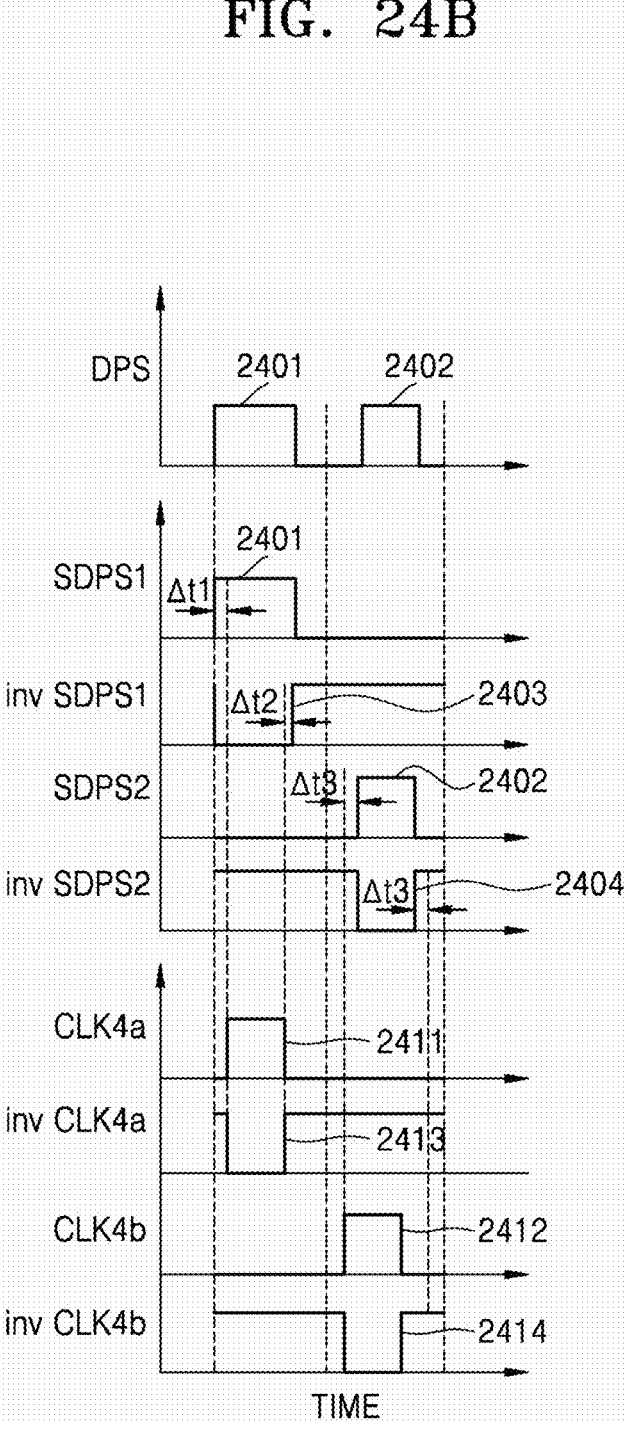

FIG. 24B is a diagram for describing operations of the first time-digital conversion circuit and the second time-digital conversion circuit, according to an embodiment.

Operations of the first time-digital conversion circuit 2312$a$ and the second time-digital conversion circuit 2312$b$, according to an embodiment, will be described with reference to FIGS. 23A and 24B.

The first time-digital conversion circuit 2312$a$ determines a first rising-time level based on a time difference ($\Delta t1$) between a rising edge of the pulse 2401 of the first sub-data pulse signal SDPS1 and a rising edge of the pulse 2411 of the first sub-clock pulse signal CLK4$a$, and determines a third rising-time level based on a time difference ($\Delta t2$) between a rising edge of a pulse 2403 of an inverted first sub-data pulse signal inv SDPS1 and a rising edge of a pulse 2413 of an inverted first sub-clock pulse signal inv CLK4$a$. The first time-digital conversion circuit 2312$a$ generates a value of the first digital stream signal DSS1 corresponding to the first rising-time level and the third rising-time level.

Similarly, the second time-digital conversion circuit 2312$b$ determines a fourth rising-time level based on a time difference ($\Delta t3$) between a rising edge of the pulse 2402 of the second sub-data pulse signal SDPS2 and a rising edge of the pulse 2412 of the second sub-clock pulse signal CLK4$b$, and determines the fourth rising-time level based on a time difference ($\Delta t3$) between a rising edge of a pulse 2404 of an inverted second sub-data pulse signal inv SDPS2 and a rising edge of a pulse 2414 of an inverted second sub-clock pulse signal inv CLK4$b$. The second time-digital conversion circuit 2312$b$ generates a value of the second digital stream signal DSS2 corresponding to the fourth rising-time levels.

Figure 25:
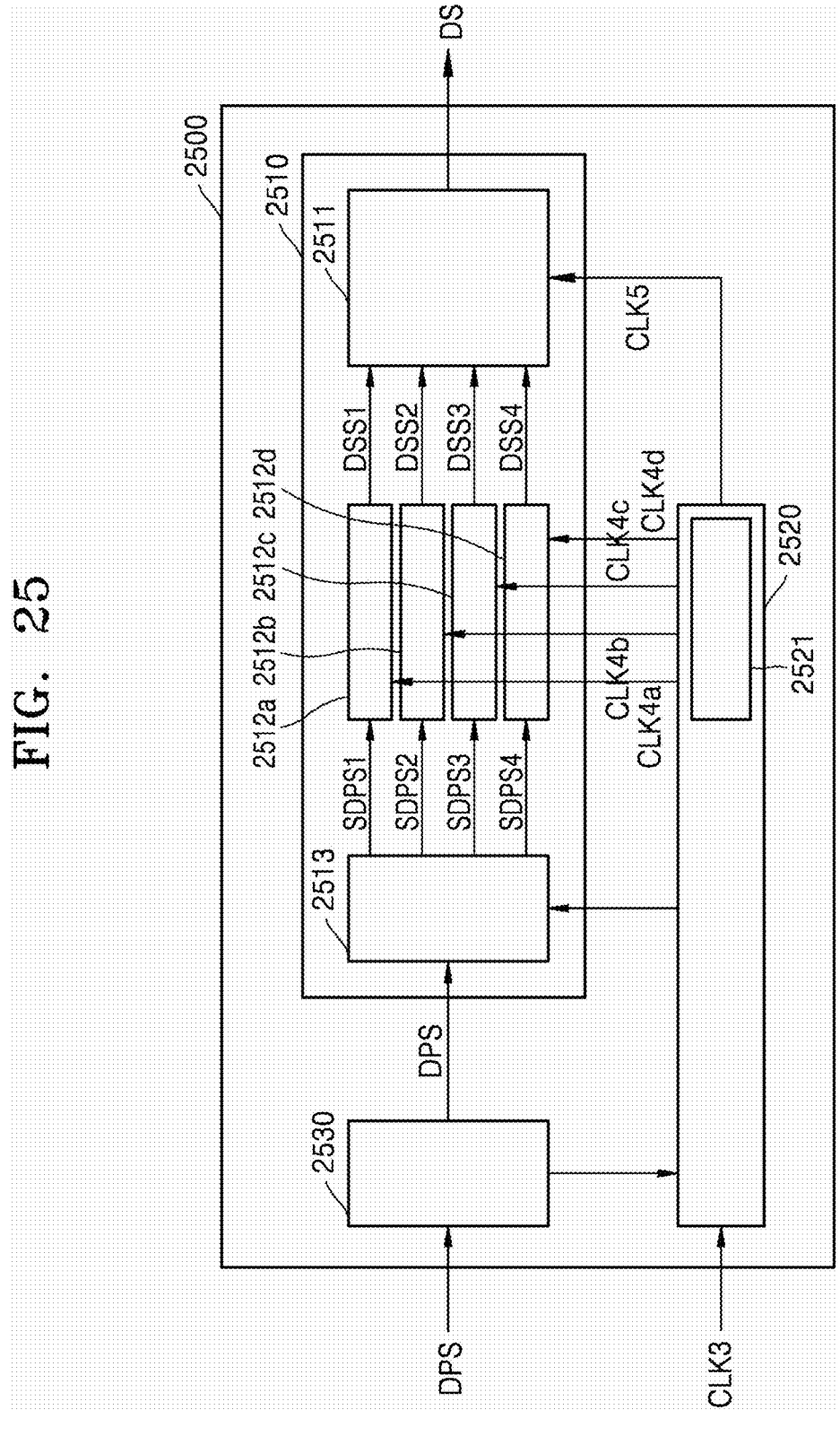
FIGS. 25 and 26 are block diagrams of a data reception circuit system according to embodiments.

FIG. 25 is a block diagram of a data reception circuit system 2500 according to an embodiment.

The data reception circuit system 2500 according to an embodiment includes a digital signal generation circuit 2510, a clock recovery circuit 2520, and a reception interface circuit 2530. The digital signal generation circuit 2510 includes a parallelization circuit 2511, a first time-digital conversion circuit 2512$a$, a second time-digital conversion circuit 2512$b$, a third time-digital conversion circuit 2512$c$, a fourth time-digital conversion circuit 2512*d*, and a data pulse separation circuit 2513. The clock recovery circuit 2520 includes a clock pulse separation circuit 2521. Descriptions of embodiments apply to the data reception circuit system 2500 of FIG. 25. Thus, redundant descriptions are omitted.

According to an embodiment, the clock pulse separation circuit 2521 may separate the recovered clock pulse signal CLK4 into the first sub-clock pulse signal CLK4*a* and the third sub-lock pulse signal CLK4*c* such that the first sub-clock pulse signal CLK4*a* and the third sub-lock pulse signal CLK4*c* alternately include pulses of the recovered clock pulse signal CLK4. Also, the data pulse separation circuit 2513 may separate the data pulse signal DPS into the first sub-data pulse signal SDPS1 and the third sub-data pulse signal SDPS3 such that the first sub-data pulse signal SDPS1 and the third sub-data pulse signal SDPS3 alternately include pulses of the data pulse signal DPS.

According to an embodiment, the second sub-clock pulse signal CLK4*b* may be the same as the first sub-clock pulse signal CLK4*a* and the fourth sub-clock pulse signal CLK4*d* may be the same as the third sub-lock pulse signal CLK4*c*. Also, the second sub-data pulse signal SDPS2 may be the same as the first sub-data pulse signal SDPS1 and the fourth sub-data pulse signal SDPS4 may be the same as the third sub-data pulse signal SDPS3.

According to an embodiment, the first time-digital conversion circuit 2512*a* may determine a rising-time level based on a time difference between a rising edge of the first sub-data pulse signal SDPS1 and a rising edge of the first sub-clock pulse signal CLK4*a*, and generate a value of the first digital stream signal DSS1 corresponding to the rising-time level. The second time-digital conversion circuit 2512*b* may determine a falling-time level based on a time difference between a falling edge of the second sub-data pulse signal SDPS2 and a falling edge of the second sub-clock pulse signal CLK4*b*, and generate a value of the second digital stream signal DSS2 corresponding to the falling-time level.

Similarly, the third time-digital conversion circuit 2512*c* may determine a rising-time level based on a time difference between a rising edge of the third sub-data pulse signal SDPS3 and a rising edge of the third sub-lock pulse signal CLK4*c*, and generate a value of the third digital stream signal DSS3 corresponding to the rising-time level. The fourth time-digital conversion circuit 2512*d* may determine a falling-time level based on a time difference between a falling edge of the fourth sub-data pulse signal SDPS4 and a falling edge of the fourth sub-clock pulse signal CLK4*d*, and generate a value of the fourth digital stream signal DSS4 corresponding to the falling-time level.

According to an embodiment, the second sub-clock pulse signal CLK4*b* may be obtained by inverting the first sub-clock pulse signal CLK4*a* and the fourth sub-clock pulse signal CLK4*d* may be obtained by inverting the third sub-lock pulse signal CLK4*c*. Also, the second sub-data pulse signal SDPS2 may be obtained by inverting the first sub-data pulse signal SDPS1 and the fourth sub-data pulse signal SDPS4 may be obtained by inverting the third sub-data pulse signal SDPS3.

According to an embodiment, the first time-digital conversion circuit 2512*a* may determine a rising-time level based on a time difference between a rising edge of the first sub-data pulse signal SDPS1 and a rising edge of the first sub-clock pulse signal CLK4*a*, and generate a value of the first digital stream signal DSS1 corresponding to the rising-time level. The second time-digital conversion circuit 2512*b* may determine a rising-time level based on a time difference between a rising edge of the second sub-data pulse signal SDPS2 and a rising edge of the second sub-clock pulse signal CLK4*b*, and generate a value of the second digital stream signal DSS2 corresponding to the rising-time level.

Similarly, the third time-digital conversion circuit 2512*c* may determine a rising-time level based on a time difference between a rising edge of the third sub-data pulse signal SDPS3 and a rising edge of the third sub-lock pulse signal CLK4*c*, and generate a value of the third digital stream signal DSS3 corresponding to the rising-time level. The fourth time-digital conversion circuit 2512*d* may determine a rising-time level based on a time difference between a rising edge of the fourth sub-data pulse signal SDPS4 and a rising edge of the fourth sub-clock pulse signal CLK4*d*, and generate a value of the fourth digital stream signal DSS4 corresponding to the rising-time level.

According to an embodiment, the parallelization circuit 2511 may generate the digital signal DS by merging and parallelizing the first digital stream signal DSS1, the second digital stream signal DSS2, the third digital stream signal DSS3, and the fourth digital stream signal DSS4.

Figure 26:
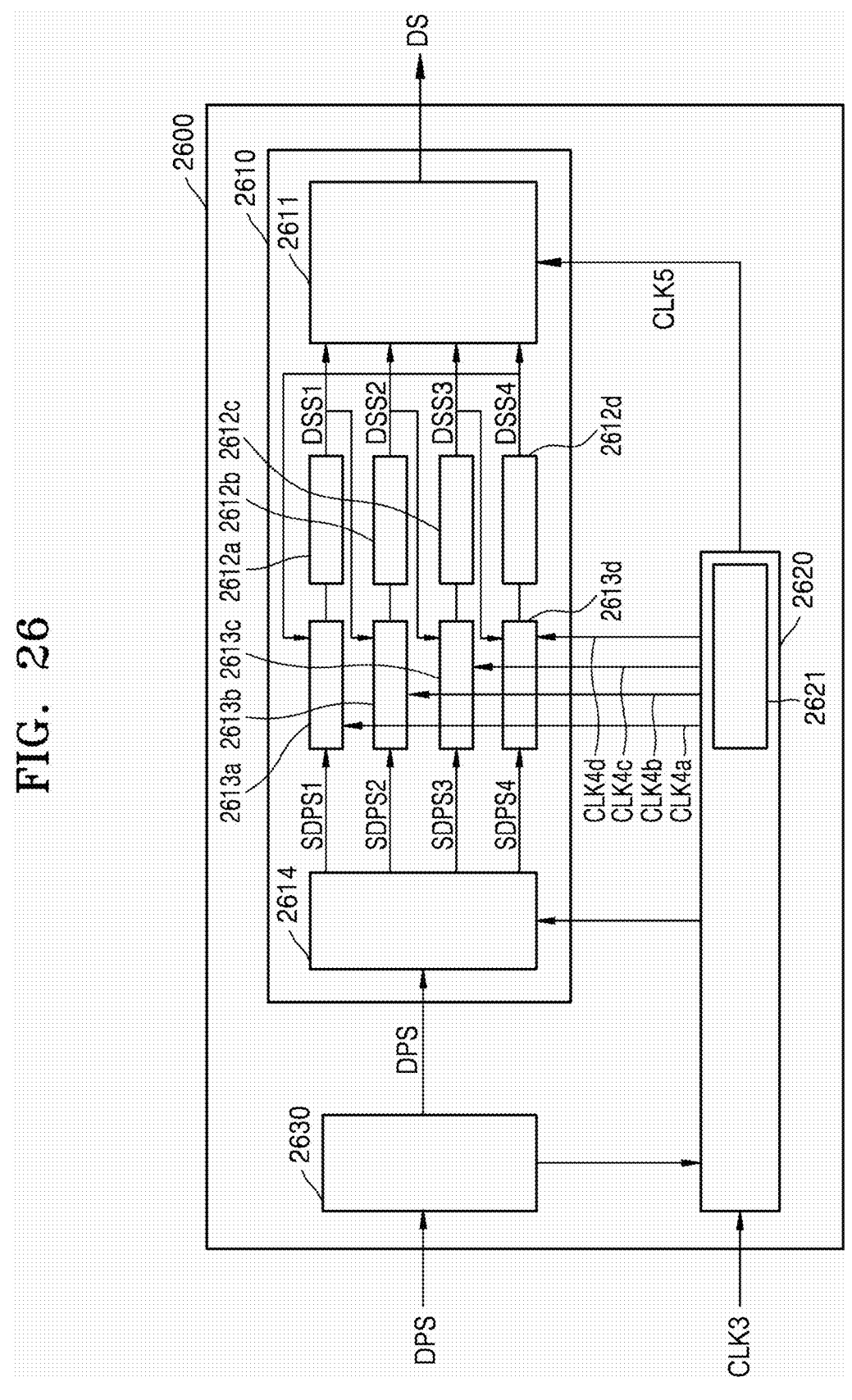

FIG. 26 is a block diagram of a data reception circuit system 2600 according to an embodiment.

The data reception circuit system 2600 according to an embodiment includes a digital signal generation circuit 2610, a clock recovery circuit 2620, and a reception interface circuit 2630. The digital signal generation circuit 2610 includes a parallelization circuit 2611, a first time-digital conversion circuit 2612*a*, a second time-digital conversion circuit 2612*b*, a third time-digital conversion circuit 2612*c*, a fourth time-digital conversion circuit 2612*d*, a first equalization circuit 2613*a*, a second equalization circuit 2613*b*, a third equalization circuit 2613*c*, a fourth equalization circuit 2613*d*, and a data pulse separation circuit 2614. The clock recovery circuit 2620 includes a clock pulse separation circuit 2621. Descriptions of embodiments apply to the data reception circuit system 2600 of FIG. 26. Thus, redundant descriptions are omitted.

The first equalization circuit 2613*a* may receive a value of the digital signal DS (i.e., a value of the fourth digital stream signal DSS4) of a previous symbol, and perform equalization on the first sub-clock pulse signal CLK4*a* and the first sub-data pulse signal SDPS1 of a current symbol according to the value of the digital signal DS of the previous symbol. The equalization may be performed by delaying the first sub-clock pulse signal CLK4*a* or the first sub-data pulse signal SDPS1 according to a weight.

The second equalization circuit 2613*b* may receive a value of the digital signal DS (i.e., a value of the first digital stream signal DSS1) of the previous symbol, and perform equalization on the second sub-clock pulse signal CLK4*b* and the second sub-data pulse signal SDPS2 of the current symbol according to the value of the digital signal DS of the previous symbol. The equalization may be performed by delaying the second sub-clock pulse signal CLK4*b* or the second sub-data pulse signal SDPS2 according to a weight.

The third equalization circuit 2613*c* may receive a value of the digital signal DS (i.e., a value of the second digital stream signal DSS2) of the previous symbol, and perform equalization on the third sub-lock pulse signal CLK4*c* and the third sub-data pulse signal SDPS3 of the current symbol according to the value of the digital signal DS of the previous symbol. The equalization may be performed by delaying the third sub-lock pulse signal CLK4*c* or the third sub-data pulse signal SDPS3 according to a weight.

The fourth equalization circuit 2613*d* may receive a value of the digital signal DS (i.e., a value of the third digital stream signal DSS3) of the previous symbol, and perform equalization on the fourth sub-clock pulse signal CLK4*d* and the fourth sub-data pulse signal SDPS4 of the current symbol according to the value of the digital signal DS of the previous symbol. The equalization may be performed by delaying the fourth sub-clock pulse signal CLK4*d* or the fourth sub-data pulse signal SDPS4 according to a weight.

FIG. 27 is a flowchart of a data transmission method according to an embodiment.

In operation S2701, a data transmission circuit system may receive a digital signal.

According to an embodiment, the data transmission circuit system may be a sub-circuit system of a higher circuit system, and the digital signal may be data to be transmitted by the higher circuit system. For example, the digital signal may be 32-bit data or 64-bit data, but is not limited thereto.

In operation S2702, the data transmission circuit system may generate a clock pulse signal with a rising edge of a base rising-time level that is a basis of a rising-time level and a falling edge of a base falling-time level that is a basis of a falling-time level.

According to an embodiment, the data transmission circuit system may generate the clock pulse signal, based on a base clock signal of the higher circuit system. For example, a frequency unit of the clock pulse signal may be GHz or greater, but is not limited thereto.

In operation S2703, the data transmission circuit system may generate, based on the clock pulse signal, a data pulse signal with a rising edge of a rising-time level and a falling edge of a falling-time level, which correspond to the digital signal.

According to an embodiment, the data transmission circuit system may generate the data pulse signal by delaying the clock pulse signal by the rising-time level or by the falling-time level.

According to an embodiment, with respect to time-interleaved first sub-clock pulse signal and second sub-clock pulse signal, the data transmission circuit system may generate a first sub-data pulse signal by delaying the first sub-clock pulse signal by the rising-time level, generate a second sub-data pulse signal by delaying the second sub-clock pulse signal by the falling-time level, and generate the data pulse signal by combining the first sub-data pulse signal with the second sub-data pulse signal.

According to an embodiment, based on the frequency unit of the clock pulse signal being GHz or greater, a unit of a transmission speed of the data pulse signal may be Gbps or greater.

In operation S2704, the data transmission circuit system may transmit the data pulse signal.

According to an embodiment, the data transmission circuit system may transmit a forward clock signal together with the data pulse signal.

Figure 28:
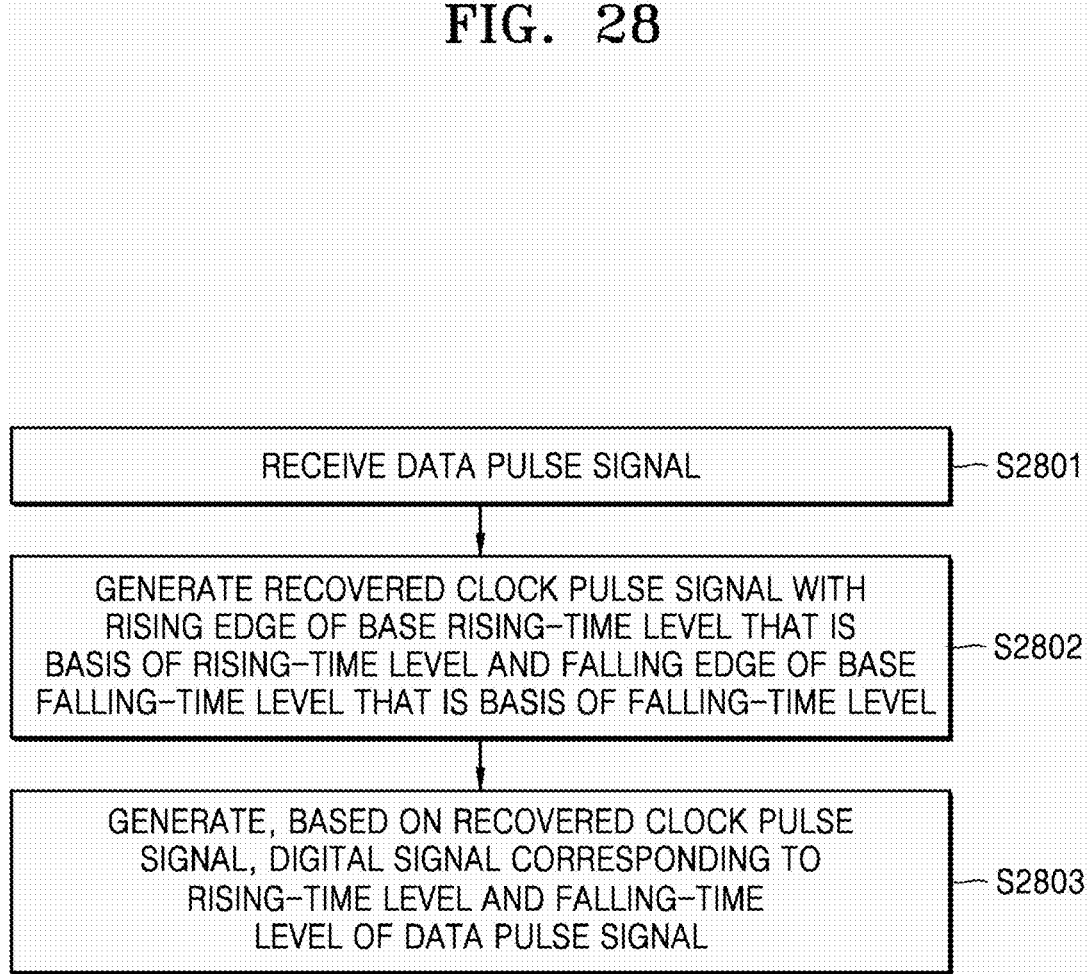
FIG. 28 is a flowchart of a data reception method according to an embodiment.

FIG. 28 is a flowchart of a data reception method according to an embodiment.

In operation S2801, a data reception circuit system may receive a data pulse signal.

According to an embodiment, the data reception circuit system may receive the data pulse signal that is transmitted by a data transmission circuit system and has passed through a channel.

According to an embodiment, the data reception circuit system may receive a forward clock signal together with the data pulse signal.

In operation S2802, the data reception circuit system may generate a recovered clock pulse signal with a rising edge of a base rising-time level that is a basis of a rising-time level and a falling edge of a base falling-time level that is a basis of a falling-time level.

According to an embodiment, the data reception circuit system may generate the recovered clock pulse signal by delaying the forward clock signal, based on a phase difference between the recovered clock pulse signal and the data pulse signal.

In operation S2803, the data reception circuit system may generate, based on the recovered clock pulse signal, a digital signal corresponding to the rising-time level and the falling-time level of the data pulse signal.

According to an embodiment, a data reception circuit system may determine a rising-time level based on a rising edge of a recovered clock pulse signal and a rising edge of a data pulse signal, determine a falling-time level based on a falling edge of the recovered clock pulse signal and a falling edge of the data pulse signal, and generate a digital signal corresponding to the rising-time level and the falling-time level.

According to an embodiment, the data reception circuit system may determine a rising-time level based on a rising edge of a recovered clock pulse signal and a rising edge of a data pulse signal, determine a rising-time level based on a rising edge of an inverted recovered clock pulse signal and a rising edge of an inverted data pulse signal, and generate a digital signal corresponding to the rising-time levels.

In the description of the disclosure described above, embodiments related to a falling edge of a data pulse signal, a clock pulse signal, or a recovered clock pulse signal may be described based on embodiments related to a rising edge of the data pulse signal, the clock pulse signal, or the recovered clock pulse signal.

A data transmission circuit system and a data reception circuit system, according to embodiments, use a time level instead of a voltage level, and thus do not require ADC and DAC. Accordingly, the data transmission circuit system and the data reception circuit system may operate at low power consumption and resolution thereof may not decrease due to a change in an operating voltage. Such characteristics of the data transmission circuit system and data reception circuit system allow energy-efficient and reliable data transmission and reception even for a semiconductor circuit according to device scaling.

Effects achieved from the embodiments are not limited to those described above, and other effects that are not described may be clearly derived and understood by one of ordinary skill in the art from the description of the embodiments. In other words, unintended effects according to the embodiments may be derived by one of ordinary skill in the art.

The above description of the disclosure is provided for illustration, and it will be understood by one of ordinary skill in the art that various changes in form and details may be readily made therein without departing from essential features and the scope of the disclosure as defined by the following claims. Accordingly, embodiments described above are examples in all aspects and are not limited. For example, each element described as a single type may be implemented in a distributed manner, and similarly, elements described as distributed may be implemented in a combined form.

The scope of the disclosure is defined by the appended claims rather than the detailed description, and all changes or modifications within the scope of the appended claims and their equivalents will be construed as being included in the scope of the disclosure.

What is claimed is:

1. A data transmission circuit system using a rising edge and a falling edge of a pulse signal, the data transmission circuit system comprising:

a data pulse generation circuit configured to receive a digital signal and generate, based on a clock pulse signal, a data pulse signal with a rising edge of a rising-time level and a falling edge of a falling-time level, which correspond to the digital signal;

a clock pulse generation circuit configured to generate the clock pulse signal with a rising edge of a base rising-time level that is a basis of the rising-time level and a falling edge of a base falling-time level that is a basis of the falling-time level; and a transmission interface circuit configured to transmit the data pulse signal, wherein a time difference between the rising edge of the clock pulse signal and the rising edge of the data pulse signal indicates the rising-time level, and a time difference between the falling edge of the clock pulse signal and the falling edge of the data pulse signal indicates the falling-time level.

2. The data transmission circuit system of claim 1, wherein the data pulse generation circuit is further configured to generate the data pulse signal by delaying the clock pulse signal according to the rising-time level and the falling-time level, which correspond to the digital signal.

3. The data transmission circuit system of claim 1, wherein the clock pulse generation circuit is further configured to generate a plurality of clock pulse signals with different phases, and the data pulse generation circuit is further configured to generate sub-data pulse signals by respectively delaying the plurality of clock pulse signals according to the rising-time level and the falling-time level, which correspond to the digital signal, and generate the data pulse signal by combining the sub-data pulse signals with each other.

4. The data transmission circuit system of claim 1, wherein the data pulse generation circuit comprises:

a serialization circuit configured to generate a digital stream signal by serializing the digital signal; and a digital-time conversion circuit configured to generate the data pulse signal by delaying the clock pulse signal according to the rising-time level and the falling-time level, which correspond to the digital stream signal.

5. The data transmission circuit system of claim 4, wherein the data pulse generation circuit comprises an equalization circuit configured to adjust a delay of a pulse of the clock pulse signal of a current symbol, based on a value of the digital stream signal of a previous symbol and a value of the digital stream signal of the current symbol.

6. The data transmission circuit system of claim 1, wherein the clock pulse generation circuit is further configured to generate a first clock pulse signal with a first phase and a second clock pulse signal with a second phase, and the data pulse generation circuit comprises:

a serialization circuit configured to generate a first digital stream signal and a second digital stream signal by serializing and distributing the digital signal;

a first digital-time conversion circuit configured to generate a first sub-data pulse signal by delaying the first clock pulse signal according to a rising-time level corresponding to the first digital stream signal;

a second digital-time conversion circuit configured to generate a second sub-data pulse signal by delaying the second clock pulse signal according to a falling-time level corresponding to the second digital stream signal; and a data pulse combining circuit configured to generate the data pulse signal by combining the first sub-data pulse signal with the second sub-data pulse signal such that the data pulse signal includes a rising edge of the first sub-data pulse signal and a falling edge of the second sub-data pulse signal.

7. The data transmission circuit system of claim 1, wherein the clock pulse generation circuit is further configured to generate a first clock pulse signal with a first phase, a second clock pulse signal with a second phase, a third clock pulse signal with a third phase, and a fourth clock pulse signal with a fourth phase, and the data pulse generation circuit comprises:

a serialization circuit configured to generate a first digital stream signal, a second digital stream signal, a third digital stream signal, and a fourth digital stream signal by serializing and distributing the digital signal;

a first digital-time conversion circuit configured to generate a first sub-data pulse signal by delaying the first clock pulse signal according to a rising-time level corresponding to the first digital stream signal;

a second digital-time conversion circuit configured to generate a second sub-data pulse signal by delaying the second clock pulse signal according to a falling-time level corresponding to the second digital stream signal;

a third digital-time conversion circuit configured to generate a third sub-data pulse signal by delaying the third clock pulse signal according to a rising-time level corresponding to the third digital stream signal;

a fourth digital-time conversion circuit configured to generate a fourth sub-data pulse signal by delaying the fourth clock pulse signal according to a falling-time level corresponding to the fourth digital stream signal; and a data pulse combining circuit configured to generate the data pulse signal by combining the first sub-data pulse signal, the second sub-data pulse signal, the third sub-data pulse signal, and the fourth sub-data pulse signal with each other such that the data pulse signal includes a rising edge of the first sub-data pulse signal, a falling edge of the second sub-data pulse signal, a rising edge of the third sub-data pulse signal, and a falling edge of the fourth sub-data pulse signal.

8. The data transmission circuit system of claim 1, wherein, with respect to a plurality of rising-time levels and a plurality of falling-time levels, which are indicated by pulses of the data pulse signal, an interval between the plurality of rising-time levels is less than 1 ns and an interval between the plurality of falling-time levels is less than 1 ns.

9. The data transmission circuit system of claim 1, wherein a unit of a transmission speed of the data pulse signal is Gbps or greater.

10. A data transmission method using a rising edge and a falling edge of a pulse signal, the data transmission method comprising:

receiving a digital signal;

generating a clock pulse signal with a rising edge of a base rising-time level that is a basis of a rising-time level and a falling edge of a base falling-time level that is a basis of a falling-time level;

generating, based on the clock pulse signal, a data pulse signal with a rising edge of the rising-time level and a falling edge of the falling-time level, which correspond to the digital signal; and transmitting the data pulse signal, wherein a time difference between the rising edge of the clock pulse signal and the rising edge of the data pulse signal indicates the rising-time level, and a time difference between the falling edge of the clock pulse signal and the falling edge of the data pulse signal indicates the falling-time level.

11. A data reception circuit system using a rising edge and a falling edge of a pulse signal, the data reception circuit system comprising:

a reception interface circuit configured to receive a data pulse signal;

a digital signal generation circuit configured to generate a digital signal corresponding to a rising-time level of a rising edge of the data pulse signal and a falling-time level of a falling edge of the data pulse signal, based on a recovered clock pulse signal; and a clock recovery circuit configured to generate the recovered clock pulse signal with a rising edge of a base rising-time level that is a basis of the rising-time level and a falling edge of a base falling-time level that is a basis of the falling-time level, wherein a time difference between the rising edge of the recovered clock pulse signal and the rising edge of the data pulse signal determines the rising-time level, and a time difference between the falling edge of the recovered clock pulse signal and the falling edge of the data pulse signal determines the falling-time level.

12. The data reception circuit system of claim 11, wherein the digital signal generation circuit comprises:

a time-digital conversion circuit configured to generate a digital stream signal corresponding to the rising-time level and the falling-time level of the data pulse signal; and a parallelization circuit configured to generate the digital signal by parallelizing the digital stream signal.

13. The data reception circuit system of claim 12, wherein the time-digital conversion circuit comprises an equalization circuit configured to adjust a delay of a pulse of the recovered clock pulse signal of a current symbol or a delay of a pulse of the data pulse signal of the current symbol, based on a value of the digital stream signal of a previous symbol.

14. The data reception circuit system of claim 11, wherein the clock recovery circuit comprises a clock pulse separation circuit configured to separate the recovered clock pulse signal into a first sub-clock pulse signal and a second sub-clock pulse signal such that the first sub-clock pulse signal and the second sub-clock pulse signal alternately include pulses of the recovered clock pulse signal, and the digital signal generation circuit comprises:

a data pulse separation circuit configured to separate the data pulse signal into a first sub-data pulse signal and a second sub-data pulse signal such that the first sub-data pulse signal and the second sub-data pulse signal alternately include pulses of the data pulse signal;

a first time-digital conversion circuit configured to generate a first digital stream signal corresponding to a rising-time level determined by a time difference between a rising edge of the first sub-clock pulse signal and a rising edge of the first sub-data pulse signal, and a falling-time level determined by a time difference between a falling edge of the first sub-clock pulse signal and a falling edge of the first sub-data pulse signal;

a second time-digital conversion circuit configured to generate a second digital stream signal corresponding to a rising-time level determined by a time difference between a rising edge of the second sub-clock pulse signal and a rising edge of the second sub-data pulse signal, and a falling-time level determined by a time difference between a falling edge of the second sub-clock pulse signal and a falling edge of the second sub-data pulse signal; and a parallelization circuit configured to generate the digital signal by merging and parallelizing the first digital stream signal and the second digital stream signal.

15. The data reception circuit system of claim 11, wherein the clock recovery circuit comprises a clock pulse separation circuit configured to separate the recovered clock pulse signal into a first sub-clock pulse signal and a second sub-clock pulse signal such that the first sub-clock pulse signal and the second sub-clock pulse signal alternately include pulses of the recovered clock pulse signal, and the digital signal generation circuit comprises:

a data pulse separation circuit configured to separate the data pulse signal into a first sub-data pulse signal and a second sub-data pulse signal such that the first sub-data pulse signal and the second sub-data pulse signal alternately include pulses of the data pulse signal;

a first time-digital conversion circuit configured to generate a first digital stream signal corresponding to a rising-time level determined by a time difference between a rising edge of the first sub-clock pulse signal and a rising edge of the first sub-data pulse signal;

a second time-digital conversion circuit configured to generate a second digital stream signal corresponding to a falling-time level determined by a time difference between a falling edge of the first sub-clock pulse signal and a falling edge of the first sub-data pulse signal;

a third time-digital conversion circuit configured to generate a third digital stream signal corresponding to a rising-time level determined by a time difference between a rising edge of the second sub-clock pulse signal and a rising edge of the second sub-data pulse signal;

a fourth time-digital conversion circuit configured to generate a fourth digital stream signal corresponding to a falling-time level determined by a time difference between a falling edge of the second sub-clock pulse signal and a falling edge of the second sub-data pulse signal; and a parallelization circuit configured to generate the digital signal by merging and parallelizing the first digital stream signal, the second digital stream signal, the third digital stream signal, and the fourth digital stream signal.

16. The data reception circuit system of claim 11, wherein the clock recovery circuit is further configured to generate the recovered clock pulse signal by receiving a forward clock signal and delaying the forward clock signal such that a rising edge of the forward clock signal is located at the base rising-time level.

17. The data reception circuit system of claim 11, wherein the clock recovery circuit comprises a delay locked loop circuit configured to receive a forward clock signal and output the recovered clock pulse signal by delaying the forward clock signal, wherein the delay locked loop circuit comprises a feedback loop, and the delay locked loop circuit is configured to delay the forward clock signal, based on a phase difference between a feedback signal of the feedback loop and the data pulse signal.

18. The data reception circuit system of claim 11, wherein the base rising-time level is located between two middle rising-time levels of a plurality of rising-time levels determined by pulses of the recovered clock pulse signal and pulses of the data pulse signal.

19. The data reception circuit system of claim 11, wherein the clock recovery circuit comprises a clock pulse separation circuit configured to separate the recovered clock pulse signal into a first sub-clock pulse signal and a second sub-clock pulse signal such that the first sub-clock pulse signal and the second sub-clock pulse signal alternately include pulses of the recovered clock pulse signal, and generate a third sub-clock pulse signal and a fourth sub-clock pulse signal by inverting the first sub-clock pulse signal and the second sub-clock pulse signal, respectively, and the digital signal generation circuit comprises:

a data pulse separation circuit configured to separate the data pulse signal into a first sub-data pulse signal and a second sub-data pulse signal such that the first sub-data pulse signal and the second sub-data pulse signal alternately include pulses of the data pulse signal, and generate a third sub-data pulse signal and a fourth sub-data pulse signal by inverting the first sub-data pulse signal and the second sub-data pulse signal, respectively;

a first time-digital conversion circuit configured to generate a first digital stream signal corresponding to a rising-time level determined by a time difference between a rising edge of the first sub-clock pulse signal and a rising edge of the first sub-data pulse signal;

a second time-digital conversion circuit configured to generate a second digital stream signal corresponding to a rising-time level determined by a time difference between a rising edge of the second sub-clock pulse signal and a rising edge of the second sub-data pulse signal;

a third time-digital conversion circuit configured to generate a third digital stream signal corresponding to a rising-time level determined by a time difference between a rising edge of the third sub-clock pulse signal and a rising edge of the third sub-data pulse signal;

a fourth time-digital conversion circuit configured to generate a fourth digital stream signal corresponding to a rising-time level determined by a time difference between a rising edge of the fourth sub-clock pulse signal and a rising edge of the fourth sub-data pulse signal; and a parallelization circuit configured to generate the digital signal by merging and parallelizing the first digital stream signal, the second digital stream signal, the third digital stream signal, and the fourth digital stream signal.

* * * * *